US012796280B2

(12) United States Patent
Yamazaki et al.

(10) Patent No.: US 12,796,280 B2
(45) Date of Patent: Nov. 10, 2026

(54) DISPLAY APPARATUS AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Hajime Kimura, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 332 days.

(21) Appl. No.: 18/561,392

(22) PCT Filed: Jun. 2, 2022

(86) PCT No.: PCT/IB2022/055152

§ 371 (c)(1),
(2) Date: Nov. 16, 2023

(87) PCT Pub. No.: WO2022/263963

PCT Pub. Date: Dec. 22, 2022

(65) Prior Publication Data

US 2024/0260340 A1 Aug. 1, 2024

(30) Foreign Application Priority Data

Jun. 15, 2021 (JP) ................................. 2021-099694

(51) Int. Cl.
*H10K 59/40* (2023.01)
*H10K 50/00* (2023.01)
(Continued)

(52) U.S. Cl.
CPC ............. *H10K 59/40* (2023.02); *H10K 50/00* (2023.02); *H10K 50/19* (2023.02); *H10K 59/00* (2023.02);
(Continued)

(58) Field of Classification Search
CPC ...................................................... H10K 59/40
See application file for complete search history.

(56) References Cited

U.S. PATENT DOCUMENTS

| | | | |
|---|---|---|---|
| 9,507,979 | B2 | 11/2016 | Paulsen et al. |
| 10,003,023 | B2 | 6/2018 | Yamazaki et al. |

(Continued)

FOREIGN PATENT DOCUMENTS

| | | | |
|---|---|---|---|
| CN | 109658831 | A | 4/2019 |
| CN | 112631455 | A | 4/2021 |

(Continued)

OTHER PUBLICATIONS

International Search Report (Application No. PCT/IB2022/055152) Dated Aug. 23, 2022.

(Continued)

*Primary Examiner* — Brent A. Fairbanks
*Assistant Examiner* — Krishna J Palaniswamy
(74) *Attorney, Agent, or Firm* — NIXON PEABODY LLP; Jeffrey L. Costellia

(57) ABSTRACT

A display apparatus including a plurality of antennas overlapping with a display portion is provided. The display apparatus includes a first substrate and a second substrate each having flexibility. A conductive layer and a plurality of display elements are provided between the first substrate and the second substrate. A region where the first substrate and the second substrate overlap with each other includes a curved portion. The conductive layer including a region overlapping with the region includes a region with a curvature. The plurality of display elements are provided between the first substrate and the conductive layer. The conductive layer includes a plurality of openings. The display element includes a region overlapping with the opening. The conductive layer has a function of an antenna.

10 Claims, 41 Drawing Sheets

(51) Int. Cl.

| | |
|---|---|
| ***H10K 50/19*** | (2023.01) |
| ***H10K 59/00*** | (2023.01) |
| ***H10K 59/12*** | (2023.01) |
| ***H10K 59/127*** | (2023.01) |
| ***H10K 77/10*** | (2023.01) |

(52) U.S. Cl.
CPC ......... *H10K 59/12* (2023.02); *H10K 59/1275* (2023.02); *H10K 77/111* (2023.02)

(56) References Cited

U.S. PATENT DOCUMENTS

| | | | | |
|---|---|---|---|---|
| 10,204,535 | B2 | 2/2019 | Yamazaki | |
| 10,529,926 | B2 | 1/2020 | Yamazaki et al. | |
| 11,216,108 | B2 | 1/2022 | Kim et al. | |
| 11,747,935 | B2 | 9/2023 | Kim et al. | |
| 2001/0035713 | A1 | 11/2001 | Kimura | |
| 2003/0230763 | A1 | 12/2003 | Kimura et al. | |
| 2005/0142896 | A1 | 6/2005 | Imai et al. | |
| 2005/0192129 | A1 | 9/2005 | Kuwabara | |
| 2006/0244741 | A1 | 11/2006 | Kimura et al. | |
| 2007/0065957 | A1 | 3/2007 | Fujii et al. | |
| 2009/0001469 | A1 | 1/2009 | Yoshida et al. | |
| 2010/0201661 | A1 | 8/2010 | Kimura et al. | |
| 2011/0102696 | A1 | 5/2011 | Yamazaki et al. | |
| 2011/0128461 | A1 | 6/2011 | Koyama et al. | |
| 2014/0184968 | A1 | 7/2014 | Niikura et al. | |
| 2015/0255518 | A1 | 9/2015 | Watanabe et al. | |
| 2016/0118616 | A1 | 4/2016 | Hiroki et al. | |
| 2016/0268315 | A1* | 9/2016 | Kawata | H10D 86/423 |
| 2016/0274421 | A1 | 9/2016 | Hirakata | |
| 2016/0300853 | A1 | 10/2016 | Yamazaki | |
| 2016/0328051 | A1 | 11/2016 | Shishido et al. | |
| 2016/0328057 | A1 | 11/2016 | Chai et al. | |
| 2016/0351634 | A1 | 12/2016 | Lim et al. | |
| 2017/0250383 | A1 | 8/2017 | Goto et al. | |
| 2017/0301860 | A1 | 10/2017 | Yamazaki et al. | |
| 2017/0308196 | A1 | 10/2017 | Jeong et al. | |
| 2018/0188432 | A1 | 7/2018 | Choi et al. | |
| 2018/0196322 | A1 | 7/2018 | Yamazaki et al. | |
| 2018/0203319 | A1 | 7/2018 | Yamazaki et al. | |
| 2020/0033968 | A1 | 1/2020 | Yamagishi et al. | |
| 2020/0053879 | A1 | 2/2020 | Suto | |
| 2020/0067176 | A1* | 2/2020 | Kim | H01Q 1/38 |
| 2020/0201392 | A1 | 6/2020 | Yu et al. | |
| 2020/0343314 | A1 | 10/2020 | Nakamura et al. | |
| 2021/0103354 | A1* | 4/2021 | Kim | G06F 3/0416 |
| 2022/0278139 | A1 | 9/2022 | Ikeda et al. | |

FOREIGN PATENT DOCUMENTS

| | | | |
|---|---|---|---|
| EP | 3805895 | A | 4/2021 |
| JP | 2013-239164 | A | 11/2013 |
| JP | 2016-085972 | A | 5/2016 |
| JP | 2017-194682 | A | 10/2017 |
| JP | 2021-060968 | A | 4/2021 |
| KR | 2017-0075006 | A | 6/2017 |
| KR | 2017-0121674 | A | 11/2017 |
| KR | 2021-0042202 | A | 4/2021 |
| TW | 201624680 | | 7/2016 |
| WO | WO-2016/067141 | | 5/2016 |
| WO | WO-2017/026590 | | 2/2017 |

OTHER PUBLICATIONS

Written Opinion (Application No. PCT/IB2022/055152) Dated Aug. 23, 2022.

Park.J et al., "Optically Invisible Antenna-on-Display (AoD) Technologies: Review, Demonstration and Opportunities for Microwave, Millimeter-Wave and Sub-THz Wireless Applications", SID Digest '21 : SID International Symposium Digest of Technical Papers, May 17, 2021, pp. 293-296.

* cited by examiner

DISPLAY APPARATUS AND ELECTRONIC DEVICE

TECHNICAL FIELD

One embodiment of the present invention relates to a display apparatus.

Note that one embodiment of the present invention is not limited to the above technical field. Examples of the technical field of one embodiment of the present invention include a semiconductor device, a display apparatus, a light-emitting apparatus, a power storage device, a memory device, a lighting device, an input apparatus (e.g., a touch sensor), an input/output device (e.g., an antenna and a touch panel), a driving method thereof, an usage thereof, or a manufacturing method thereof.

Note that in this specification and the like, a semiconductor device generally means a device that can function by utilizing semiconductor characteristics. A transistor and a semiconductor circuit are embodiments of semiconductor devices. In addition, in some cases, a memory device, a display apparatus, an image capturing device, or an electronic device includes a semiconductor device.

BACKGROUND ART

With the progress of information technology such as IoT (Internet of Things), the amount of transmitted and received data has been increasing. To deal with the increasing amount of data, a new communication standard called fifth generation mobile communication system (5G), which achieves higher communication speed, more simultaneous connections, and shorter delay time than the fourth generation mobile communication system (4G), has been considered (refer to Patent Document 1, for example). While 4G uses a communication frequency lower than or equal to 3.6 GHz, 5G uses a communication frequency selected from a Sub6 band which is lower than 6 GHz and a millimeter wave band of 28 GHz to 300 GHz.

As the communication frequency increases, the amount of information that can be transmitted and received increases, whereas the communication distance decreases. It is effective to use a beamforming technology using antennas arranged in an array to efficiently receive a radio wave. For example, in the case where the radio wave is transmitted and received with a communication frequency of 28 GHz (wavelength: approximately 10 mm), a structure in which antennas are arranged at an interval of approximately 5 mm, which corresponds to ½ wavelength of the communication frequency, is effective.

REFERENCE

Patent Document

[Patent Document 1] PCT International Publication No. 2017/026590

SUMMARY OF THE INVENTION

Problems to be Solved by the Invention

For a display apparatus such as a smartphone which performs mobile communication and the like, downsizing of an integrated circuit (IC) including antennas is required. Providing a plurality of antennas in an integrated circuit in accordance with the communication standard of 5G and demand for downsizing an integrated circuit have a trade-off relationship. It has been difficult to achieve both of a structure where antennas are arranged at regular intervals and a structure with a downsized integrated circuit.

In view of the above, an object of one embodiment of the present invention is to provide a display apparatus including an antenna. Another object is to provide a display apparatus in which a plurality of antennas are provided in a display portion. Another object is to provide a display apparatus or the like with a novel structure. Another object is to provide a novel semiconductor device or the like.

Note that the description of these objects does not preclude the existence of other objects. Note that one embodiment of the present invention does not necessarily achieve all the objects. Other objects will be apparent from the description of the specification, the drawings, the claims, and the like, and other objects can be derived from the description of the specification, the drawings, the claims, and the like.

Means for Solving the Problems

One embodiment of the present invention relates to a display apparatus including a plurality of antennas overlapping with a display portion.

One embodiment of the present invention is a display apparatus including a first substrate and a second substrate including a region where the first substrate and the second substrate overlap with each other. The first substrate and the second substrate each have flexibility. A conductive layer and a plurality of display elements are provided between the first substrate and the second substrate. A region where the first substrate and the second substrate overlap with each other includes a curved portion. The conductive layer including a region overlapping with the region includes a region with a curvature. The plurality of display elements are provided between the first substrate and the conductive layer. The conductive layer includes a plurality of openings. One of the plurality of display elements includes a region overlapping with one of the plurality of openings. The conductive layer has a function of an antenna.

Another embodiment of the present invention is a display apparatus including a first substrate and a second substrate including a region where the first substrate and the second substrate overlap with each other. The first substrate and the second substrate each have flexibility. A conductive layer and a plurality of display elements are provided between the first substrate and the second substrate. A region where the first substrate and the second substrate overlap with each other includes a first region in which a concave curved portion can be formed. The conductive layer including a region overlapping with the first region can have a curvature. The plurality of display elements are provided between the first substrate and the conductive layer. The conductive layer includes a plurality of openings. One of the plurality of display elements includes a region overlapping with one of the plurality of openings. The conductive layer has a function of an antenna.

In the above structure, a second region in which a convex curved portion is provided in a position where the first substrate and the second substrate overlap with each other and that is apart from the first region, and the conductive layer including a region overlapping with the second region can have a curvature.

Another embodiment of the present invention is a display apparatus including a first substrate and a second substrate including a region where the first substrate and the second substrate overlap with each other. A plurality of conductive layers and a plurality of display elements are provided between the first substrate and the second substrate. The plurality of display elements are provided between the first substrate and the plurality of conductive layers. The conductive layer includes a plurality of openings. One of the plurality of display elements includes a region overlapping with one of the plurality of openings. The conductive layer has a function of an antenna and a function of an electrode of a touch sensor. The functions can be switched.

The conductive layer preferably includes a metal selected from silver, copper, or aluminum.

Another embodiment of the present invention is a display apparatus including a first substrate and a second substrate including a region where the first substrate and the second substrate overlap with each other. A first conductive layer, a second conductive layer, and a plurality of display elements are provided between the first substrate and the second substrate. The first conductive layer is provided in a position closer to the first substrate than the second conductive layer so as to be apart from the first substrate. The plurality of display elements are provided between the first substrate and the first conductive layer and between the first substrate and the second conductive layer. The first conductive layer and the second conductive layer each include a plurality of openings. One of the plurality of display elements includes a region overlapping with one of the plurality of openings included in the first conductive layer and the second conductive layer. The first conductive layer has a function of an antenna. The second conductive layer has a function of an electrode of a touch sensor.

The first conductive layer and the second conductive layer can be configured not to include a region where the first conductive layer and the second conductive layer overlap with each other. Alternatively, the first conductive layer and the second conductive layer can be configured to include a region where the first conductive layer and the second conductive layer overlap with each other.

The first conductive layer and the second conductive layer each preferably include a metal selected from silver, copper, or aluminum.

An organic EL element can be used as the display element.

Effect of the Invention

With one embodiment of the present invention, a display apparatus including an antenna can be provided. A display apparatus including a plurality of antennas in a display portion can be provided. A display apparatus or the like with a novel structure can be provided. A novel semiconductor device or the like can be provided.

The description of a plurality of effects does not preclude the existence of other effects. In addition, one embodiment of the present invention does not necessarily achieve all the effects described as examples. In one embodiment of the present invention, other objects, effects, and novel features are apparent from the description of this specification and the drawings.

BRIEF DESCRIPTION OF THE DRAWINGS

FIG. 37 is a diagram illustrating a structure example of a touch panel or the like.

MODE FOR CARRYING OUT THE INVENTION

Figure 1:
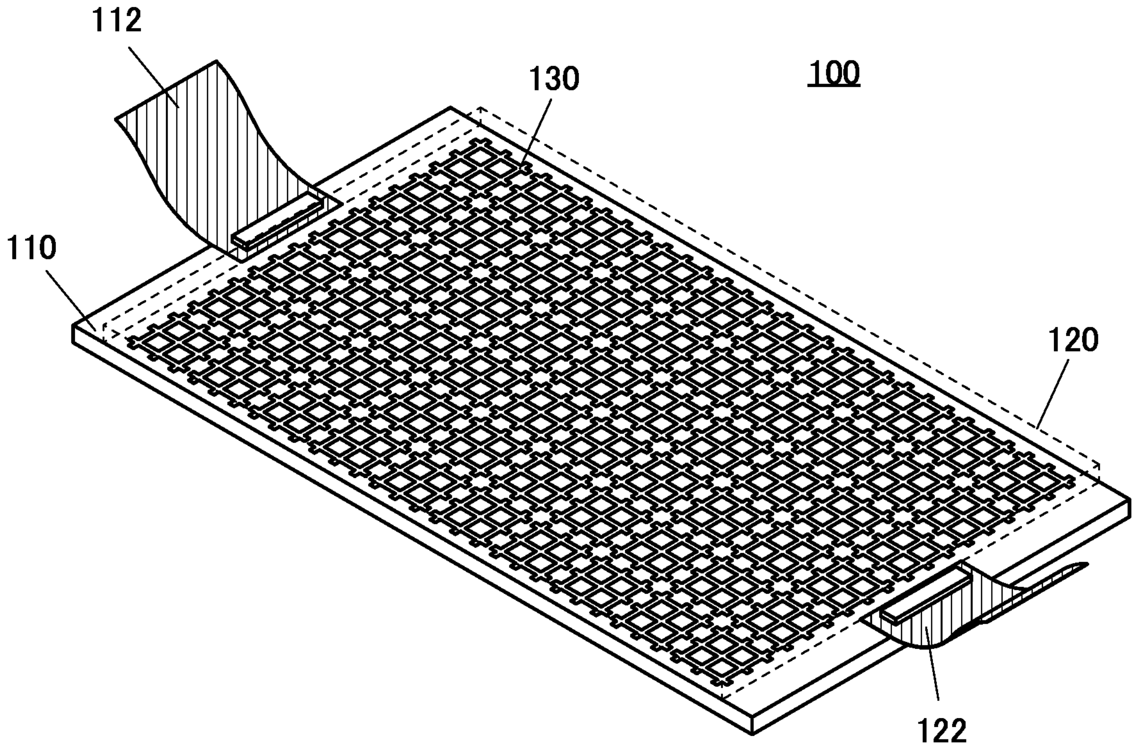
FIG. 1 is a diagram illustrating a structure example of a display apparatus.

Hereinafter, embodiments will be described with reference to the drawings. Note that the embodiments can be implemented in many different modes, and it is readily understood by those skilled in the art that modes and details thereof can be changed in various ways without departing from the spirit and scope thereof. Thus, the present invention should not be interpreted as being limited to the following description of the embodiments.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch is controlled to be in an on state or an off state. That is, a switch has a function of controlling whether or not current flows by being in a conduction state (on state) or a non-conduction state (off state).

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; a control circuit; or the like) can be connected between X and Y. For instance, even if another circuit is interposed between X and Y, X and Y are regarded as being functionally connected when a signal output from X is transmitted to Y.

Note that an explicit description that X and Y are electrically connected includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; conversely, the term "capacitance" can be replaced with the terms "capacitor", "parasitic capacitance", "gate capacitance", and the like. The term "pair of electrodes" of "capacitor" can be replaced with "pair of conductors", "pair of conductive regions", "pair of regions", and the like. Note that the electrostatic capacitance value can be higher than or equal to 0.05 fF and lower than or equal to 10 pF, for example. As another example, the electrostatic capacitance value may be higher than or equal to 1 pF and lower than or equal to 10 pF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain depending on the conductivity type (n-channel type or p-channel type) of the transistor and the levels of potentials applied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relationship of a transistor. Depending on the transistor structure, a transistor may include a back gate in addition to the above three terminals. In this case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a "node" can be referred to as a terminal, a wiring, an electrode, a conductive layer, a conductor, an impurity region, or the like depending on the circuit structure, the device structure, or the like. Furthermore, a terminal, a wiring, or the like can be referred to as a "node".

Ordinal numbers such as "first", "second", and "third" in this specification and the like are used to avoid confusion among components. Thus, the ordinal numbers do not limit the number of components. In addition, the ordinal numbers do not limit the order of components. For example, a "first" component in one embodiment in this specification and the like can be referred to as a "second" component in other embodiments, the scope of claims, or the like. For another example, a "first" component in one embodiment in this specification and the like can be omitted in other embodiments, the scope of claims, or the like.

In this specification and the like, terms for describing arrangement, such as "over", "under", "above", and "below" are sometimes used for convenience to describe the positional relationship between components with reference to drawings. The positional relationship between components is changed as appropriate in accordance with a direction in which each component is described. Thus, the positional relationship is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing illustrating these components is rotated by 180°.

The term "over" or "under" does not necessarily mean that a component is placed directly over or directly under and directly in contact with another component. For example, the expression "electrode B over insulating layer A" does not necessarily mean that the electrode B is formed over and in direct contact with the insulating layer A, and does not exclude the case where another component is provided between the insulating layer A and the electrode B.

Furthermore, the term "overlap", for example, in this specification and the like does not limit a state such as the stacking order of components. For example, the expression "electrode B overlapping with insulating layer A" does not necessarily mean the state where "electrode B is formed over insulating layer A", and does not exclude the state where "electrode B is formed under insulating layer A" and the state where "electrode B is formed on the right side (or the left side) of insulating layer A".

Each of the terms "adjacent" and "proximity" in this specification and the like does not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. Also, for example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. Alternatively, the term "conductor" can be changed into the term "conductive layer" or "conductive film" in some cases. Furthermore, for example, the term "insulating layer" or "insulating film" can be changed into the term "insulator" in some cases. Also, the term "insulator" can be changed into the term "insulating layer" or "insulating film" in some cases.

In this specification and the like, the term such as "electrode", "wiring", or "terminal" does not limit the function of a component. For example, an "electrode" is used as part of a "wiring" in some cases, and vice versa. Furthermore, for example, the term "electrode" or "wiring" also includes the case where a plurality of "electrodes" or "wirings" are formed in an integrated manner. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region" depending on the case.

In this specification and the like, the term such as "wiring", "signal line", or "power supply line" can be interchanged with each other depending on the case or the situation. For example, the term "wiring" can be changed into the term "signal line" in some cases. As another example, the term "wiring" can be changed into the term "power supply line" or the like in some cases. Conversely, the term such as "signal line" or "power supply line" can be changed into the term "wiring" in some cases. The term "power supply line" or the like can be changed into the term "signal line" or the like in some cases. Conversely, the term "signal line" or the like can be changed into the term "power supply line" or the like in some cases. Moreover, the term "potential" that is applied to a wiring can sometimes be changed into the term such as "signal" depending on the case or the situation. Conversely, the term "signal" or the like can be changed into the term "potential" in some cases.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 850 and less than or equal to 950 is also included. Furthermore, "approximately perpendicular" or "substantially perpendicular" indicates a state where two straight lines are placed at an angle greater than or equal to 600 and less than or equal to 120°.

Note that in this specification and the like, the terms "identical", "the same", "equal", "uniform", or the like (including synonyms thereof) used in describing calculation values and measurement values contain an error of ±20% unless otherwise specified.

Embodiments described in this specification are described with reference to the drawings. Note that the embodiments can be implemented in many different modes, and it will be readily understood by those skilled in the art that the modes and details can be changed in various ways without departing from the spirit and scope thereof. Therefore, the present invention should not be interpreted as being limited to the description in the embodiments. Note that in the structures of the invention in the embodiments, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases. Moreover, some components are omitted in a perspective view, a top view, and the like for easy understanding of the drawings in some cases.

In the drawings and the like related to this specification, the size, the layer thickness, or the region is exaggerated for clarity in some cases. Therefore, embodiments of the present invention are not limited to the size, aspect ratio, and the like shown in the drawings. Note that drawings are schematic views of ideal examples, and the embodiments of the present invention are not limited to the shape or the value illustrated in the drawings. For example, variation in signal, voltage, or current due to noise or variation in signal, voltage, or current due to difference in timing can be included.

In the drawings and the like related to this specification, arrows indicating the X direction, the Y direction, and the Z direction are illustrated in some cases. In this specification and the like, the "X direction" is a direction along the X-axis, and the forward direction and the reverse direction are not distinguished in some cases, unless otherwise specified. The same applies to "Y direction" and "Z direction". The X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a "first direction" in some cases. Another one of the directions is referred to as a "second direction" in some cases. The remaining one of the directions is referred to as a "third direction" in some cases.

In this specification and the like, when a plurality of components are denoted by the same reference numerals, and in particular need to be distinguished from each other, an identification sign such as "A", "b", "_1", "[n]", or "[m,n]" is sometimes added to the reference numerals.

In this specification and the like, a structure in which a connector such as an FPC (Flexible Printed Circuit) or a TCP (Tape Carrier Package) is attached to a substrate included in a display apparatus, or a structure in which an IC (integrated circuit) is directly mounted on a substrate included in a display apparatus by a COG (Chip On Glass) method is referred to as a display apparatus or a display module, in some cases.

Embodiment 1

In this embodiment, a display apparatus of one embodiment of the present invention will be described. The display apparatus of one embodiment of the present invention includes a plurality of antennas in a region overlapping with a display portion and has a function of transmitting and receiving data to/from the outside with the use of the plurality of antennas. In addition, an electrode of a touch sensor can be provided between the plurality of antennas, whereby an in-cell type display apparatus including an antenna and a touch sensor can be obtained.

FIG. 1 is a schematic view for illustrating a display apparatus 100 of one embodiment of the present invention. The display apparatus of one embodiment of the present invention includes a display element and a conductive layer forming an antenna are provided between a pair of substrates. The display apparatus of one embodiment of the present invention includes a plurality of antennas overlapping with a display portion.

The display apparatus 100 includes a substrate 110, a substrate 120, an antenna 130, an FPC 112, and an FPC 122. In FIG. 1 and the like, the substrate 120 is denoted by a dashed line for clarity in some cases. A display element and the antenna 130 formed using a conductive layer are provided between the substrate 110 and the substrate 120. An image signal or the like is input to a pixel including the display element through the FPC 112. The antenna 130 is connected to a signal transmission/reception circuit or the like through the FPC 122. Note that the FPC 112 and the FPC 122 may be integrated into one.

A plurality of the conductive layers functioning as the antennas 130 are preferably arranged in a matrix and each preferably have a mesh shape including openings. The opening and the display element are arranged so as to include a region where the opening and the display element overlap with each other. With this structure, light emitted from the display element can be emitted to the outside through the opening. Therefore, the conductive layer functioning as the antenna does not necessarily have a light-transmitting property. That is, a metal, alloy, or the like that has lower resistance than a light-transmitting conductive material can be used as a material for the conductive layer functioning as the antenna. Thus, the conductive layer can function as the antenna with reduced influence of wiring resistance and the like.

In addition, since a low-resistance material can be used for the conductive layer, the conductive layer can have an extremely small line width. That is, the surface area of the conductive layer seen from the display surface side (in a plan view) can be reduced. Thus, the surface reflection or the like can be reduced, leading to an increase in display quality. In addition, noise can be less likely to be transmitted and received. Moreover, since a low-resistance material can be used in the conductive layer, the conductive layer can be formed to be thin, leading to an improvement in the resistance to bonding. When a flexible material is used for the pair of substrates between which the display element and the antenna are provided, a thin, lightweight, and flexible display apparatus can be obtained.

As a material for the conductive layer used for the antenna 130, a metal such as silver, copper, or aluminum can be used, for example. Alternatively, a metal nanowire including a plurality of conductors with an extremely small width (e.g., a diameter of several nanometers) may be used. As an example, an Ag nanowire, a Cu nanowire, an Al nanowire, or the like can be used. With an Ag nanowire, for example, a light transmittance of higher than or equal to 89% and a sheet resistance value of greater than or equal to 40 Ω/square and less than or equal to 100 Ω/square can be achieved. Note that because such a metal nanowire provides high transmittance, the metal nanowire may be used for an electrode of the display element, e.g., a pixel electrode and a common electrode. Alternatively, a carbon material containing graphene, a carbon nanotube or the like may be used as the material of the conductive layer used as the antenna 130.

Figure 2:
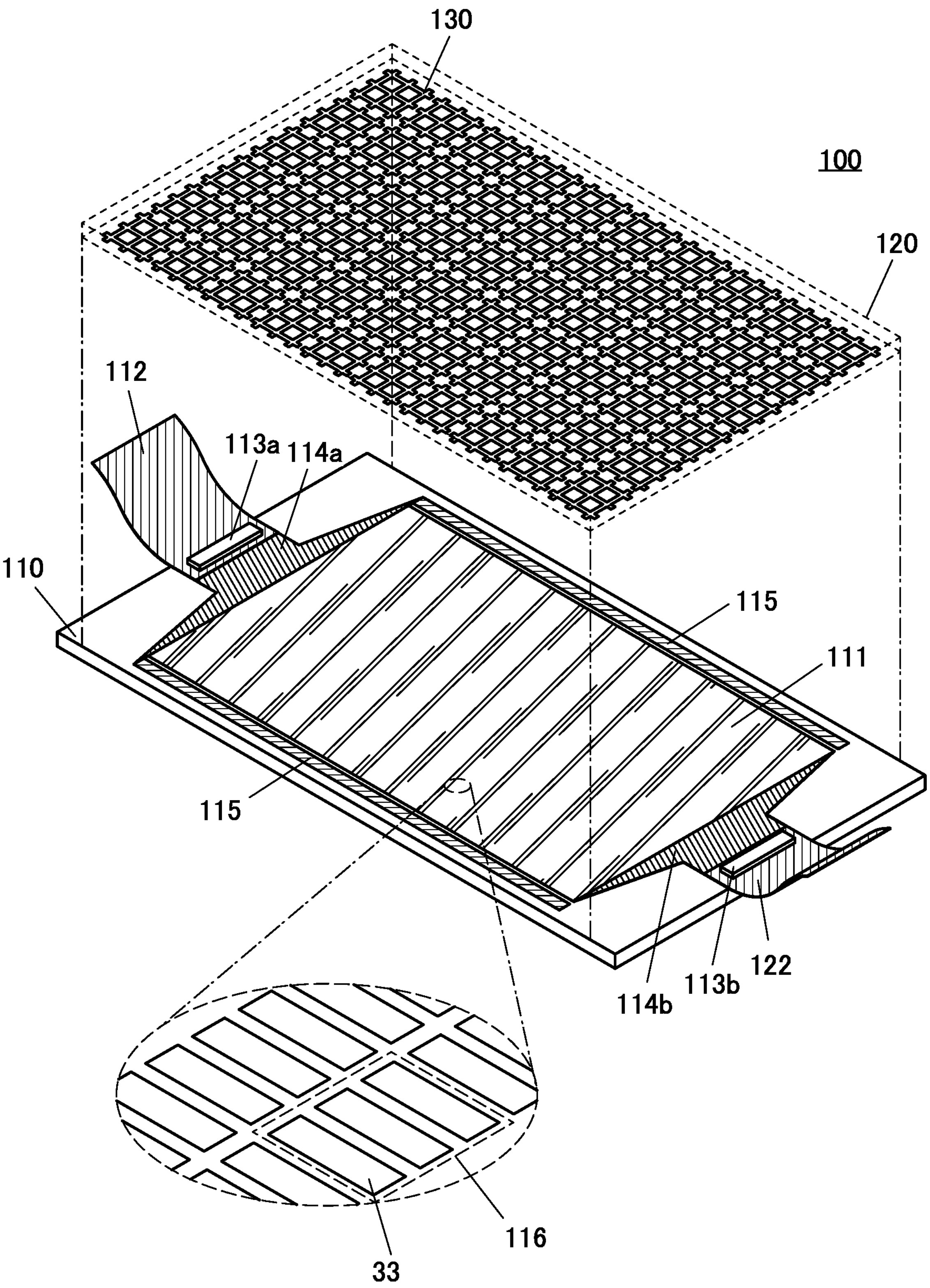
FIG. 2 is a diagram illustrating a structure example of a display apparatus.

FIG. 2 is a schematic view for illustrating a structure of the display portion and its periphery in the display apparatus 100 of one embodiment of the present invention. A display portion 111 includes a plurality of pixels 116 arranged in a matrix as illustrated in an enlarged view. The pixel 116 preferably includes a plurality of subpixels 33. Subpixels 33 each include a display element. The pixel 116 in the display portion 111 is electrically connected to a circuit 115. As the circuit 115, a circuit functioning as a gate driver circuit can be used, for example. One or both of the display portion 111 and the circuit 115 can be supplied with a signal from the outside through the FPC 112 and a wiring 114*a*. Note that an IC 113*a* functioning as a source driver circuit is preferably mounted on the substrate 110. The IC 113*a* can be mounted on the substrate 110 by a COG method or a COF method (mounted on the FPC 112).

Examples of the display element that can be used for the display apparatus include a liquid crystal element, an organic EL element, an inorganic EL element, an LED element, a microcapsule, an electrophoretic element, an electrowetting element, an electrofluidic element, an electrochromic element, and a MEMS element.

In addition, a touch panel having a touch sensor function can be used as the display apparatus. In that case, the IC 113*a* includes a touch sensor controller, a sensor driver, and the like. Alternatively, an IC 113*b* mounted on the substrate 110 by a COG method or a COF method (mounted on the FPC 122) may include a touch sensor controller, a sensor driver, and the like. The IC 113*b* can be connected to a touch sensor or the like through the FPC 122 and a wiring 114*b*.

As an example of the touch panel, an in-cell type in which a touch sensor is incorporated in the display apparatus can be given. In an in-cell type touch panel, transmittance of light emitted from the display element can be increased. Furthermore, the number of components of an in-cell touch panel can be reduced, so that cost can be reduced. An optical touch sensor or a capacitive touch sensor can be used for the touch panel. Note that the antenna, the touch sensor, and the like of one embodiment of the present invention can be applied to touch panels of on-cell type and out-cell type.

Figure 3A:
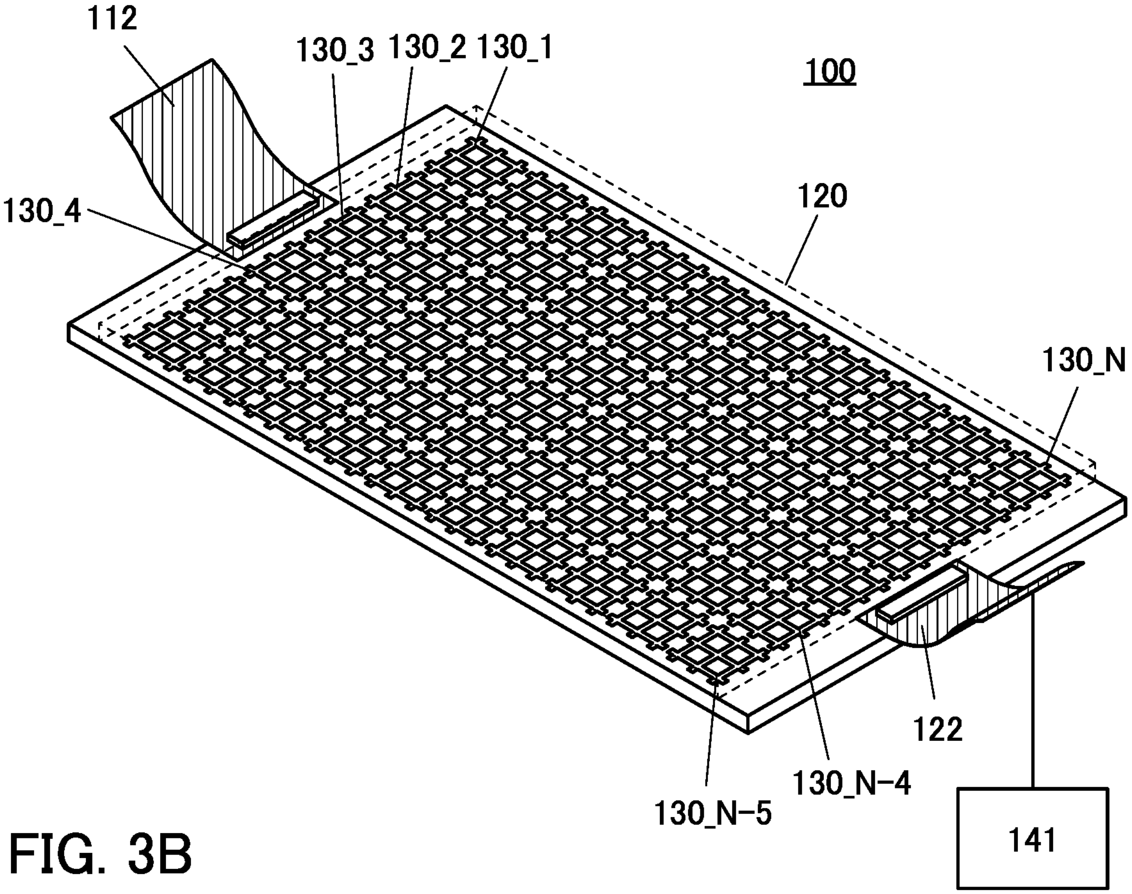
FIG. 3A is a diagram illustrating a structure example of a display apparatus.

FIG. 3A is a schematic view for illustrating the antenna 130 and the like in the display apparatus 100 of one embodiment of the present invention. By processing the conductive layer provided between the pair of substrates into a desired shape, a plurality of antennas 130_1 to 130_N (Nis an integer greater than or equal to one) can be provided. The FPC 122 has a function of a wiring which electrically connects the plurality of antennas 130_1 to 130_N and an integrated circuit 141. The integrated circuit 141 can be provided in a region overlapping with the substrate 110 and on the side opposite to the display portion 111 provided on the substrate 110, for example. Note that although FIG. 3A illustrates an example in which six antennas 130 are provided in one row (the row is in the short-axis direction of the rectangular display apparatus), four or less or six or more antennas may be arranged in one row.

The antennas 130_1 to 130_N can be provided between the substrate 110 and the substrate 120. Alternatively, the antennas 130_1 to 130_N may be provided over the substrate 120 (on the surface opposite to the surface facing the substrate 110). The plurality of antennas 130_1 to 130_N can be arranged in a matrix over a region which is equivalent to or larger than the display portion 111 including the pixel 116. The antennas 130_1 to 130_N may have the same shape, different shapes, or different sizes. Moreover, the antennas can be provided in a region overlapping with the display portion 111 having a large area, so that the plurality of antennas can be arranged next to each other. Since no antenna needs to be provided in the integrated circuit 141, the integrated circuit 141 can be downsized. In addition, an antenna component connected to the integrated circuit 141 and a region for providing the antenna component can be eliminated.

As the antenna 130, antennas with different shapes or antennas with different sizes can be placed, which enables transmission and reception of radio signals with different communication frequencies. In addition, a plurality of antennas with the same shape and the same size can be placed, which enables beamforming technology with antennas arranged in an array to be used. Since the beamforming technology enables antenna directionality, the beamforming technology can compensate for radio wave propagation loss caused when communication frequency increases.

For arrangement of the antennas 130_1 to 130_N, for example, in the case where a radio wave of a millimeter-wave band is used, a structure in which the antennas are arranged at intervals of several mm which correspond to ½ wavelength of the radio wave is effective for beamforming. It is preferable to arrange conductive layers not functioning as antennas between the antennas 130_1 to 130_N. When the conductive layers are provided between the adjacent antennas 130, the transmittance or the like of a layer where the antenna 130 and the conductive layer are formed is macroscopically uniform, so that the display quality can be increased. Note that the conductive layer not functioning as the antenna may be used as an electrode of the touch sensor. The frequency of a signal used in the touch sensor is different from the frequency of a signal used in wireless communication, which enables separation of signals.

Figure 3B:
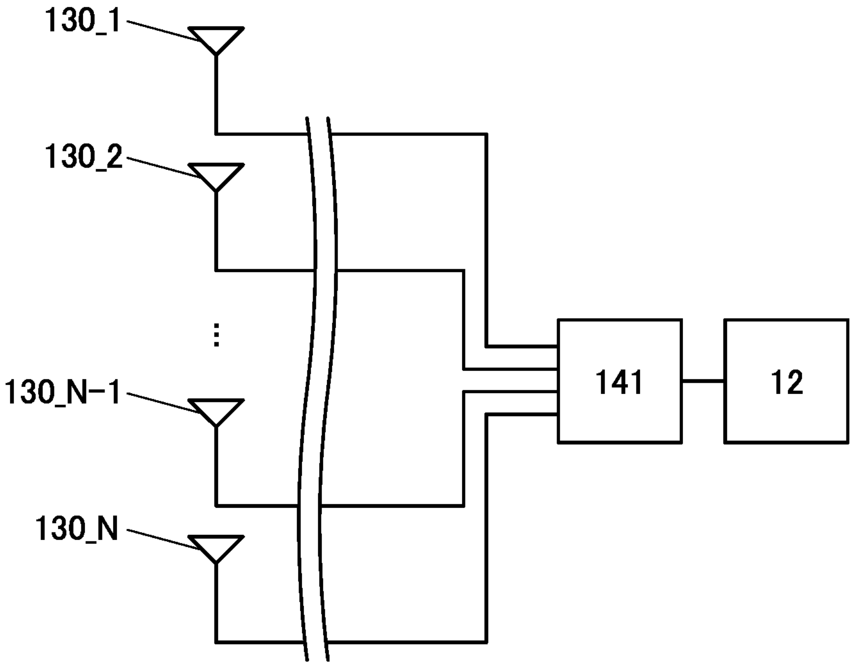
FIG. 3B is a diagram illustrating a circuit connected to an antenna.

FIG. 3B illustrates the integrated circuit 141 for transmitting and receiving a radio signal with a plurality of antennas and a baseband processor 12 output from the integrated circuit 141 in addition to the plurality of antennas 130_1 to 130_N illustrated in FIG. 3A.

The integrated circuit 141 has a function of performing modulation processing or demodulation processing on data of a radio signal that is transmitted or received by the antennas 130_1 to 130_N. Specifically, the integrated circuit 141 has a function of generating a transmission signal by performing modulation processing using a carrier wave on transmission data received from the baseband processor 12 and outputting the transmission signal via the antennas 130_1 to 130_N. In addition, the integrated circuit 141 has a function of receiving a reception signal via the antennas 130_1 to 130_N, generating reception data by performing demodulation processing using a carrier wave on the reception signal, and transmitting the reception data to the baseband processor 12. The integrated circuit 141 may include a duplexer connected to each of the antennas 130_1 to 130_N.

The baseband processor 12 has a function of performing baseband processing including encoding (e.g., error correction encoding) processing, decoding processing, or the like on data that is transmitted to or received from an external device via the antennas 130_1 to 130_N.

Specifically, the baseband processor 12 has a function of receiving transmission data from an application processor, performing encoding processing on the received transmission data, and transmitting the data to the integrated circuit 141. In addition, the baseband processor 12 has a function of receiving reception data from the integrated circuit 141, performing decoding processing on the received reception data, and transmitting the data to the application processor.

The pair of substrates included in the display apparatus of one embodiment of the present invention may have flexibility. When a flexible substrate is used for the display apparatus, part of the display portion can have a curved surface. Alternatively, the display apparatus that is bendable can be provided.

Figure 4A:
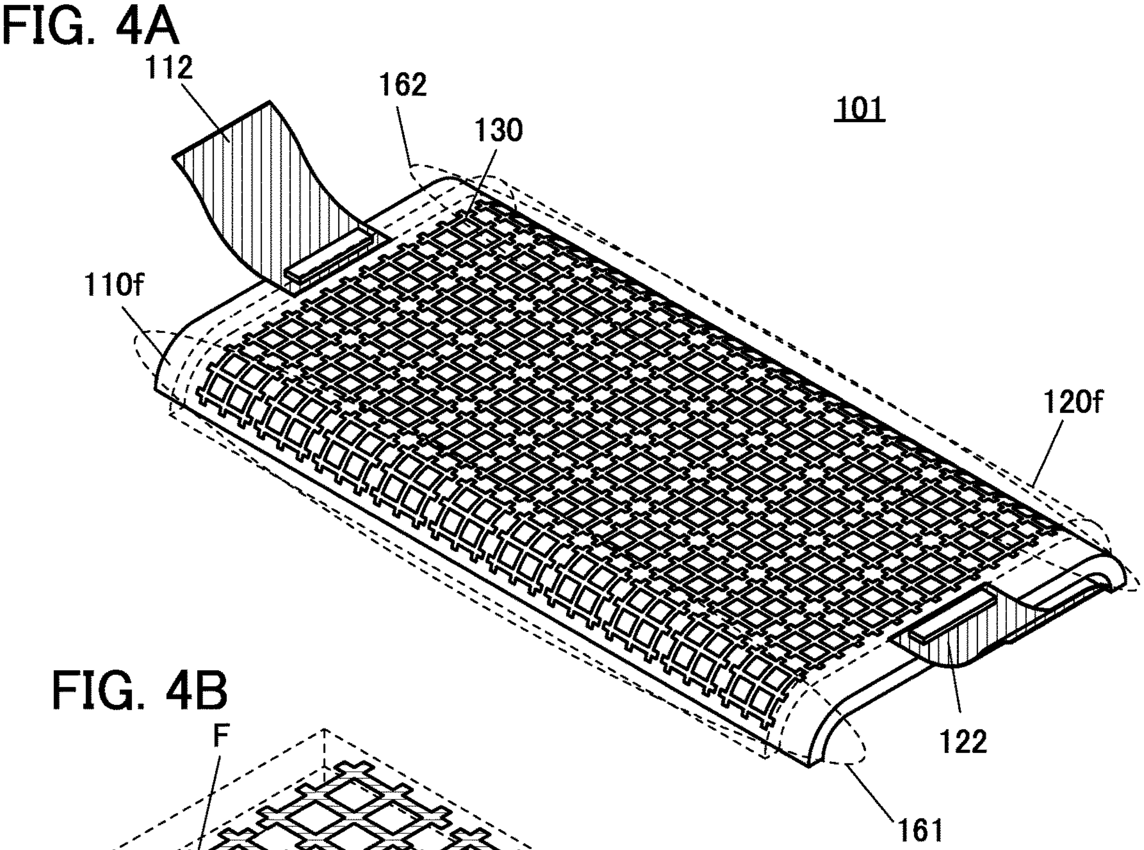
FIG. 4A to FIG. 4C are diagrams illustrating structure examples of a display apparatus.

FIG. 4A illustrates an example in which a pair of substrates (substrate **110*f* and substrate 120*f*) has flexibility. In the display apparatus 101 illustrated in FIG. 4A, components other than the pair of substrates can be the same as the structure illustrated in FIG. 1**.

Figure 4B:
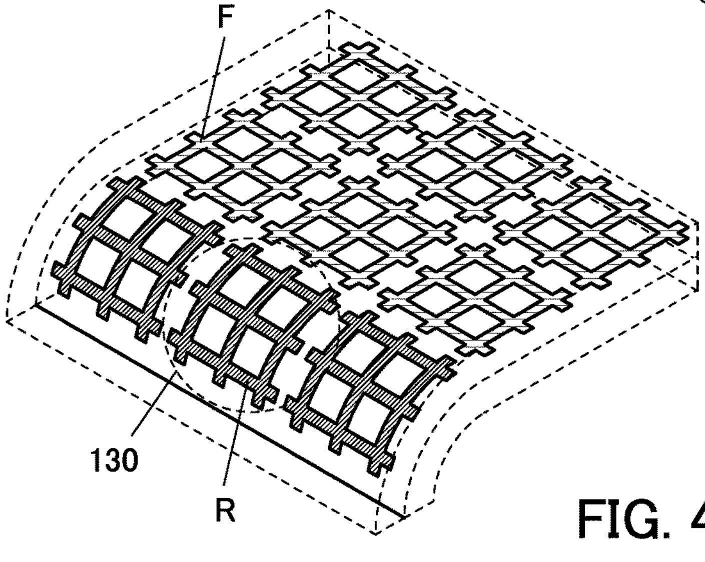

The display apparatus 101 has a rectangular top surface shape and includes convex curved portions 161 and 162 in the vicinity of long-side end portions. As illustrated in FIG. 4B, the antenna 130 positioned in the vicinity of the long-side end portions can have a region R the whole of which has a curvature. In this case, the antenna 130 positioned in a portion other than the vicinity of the end portions can have a region F the whole of which is flat (illustrated by a different hatching from that for the region R).

Figure 4C:
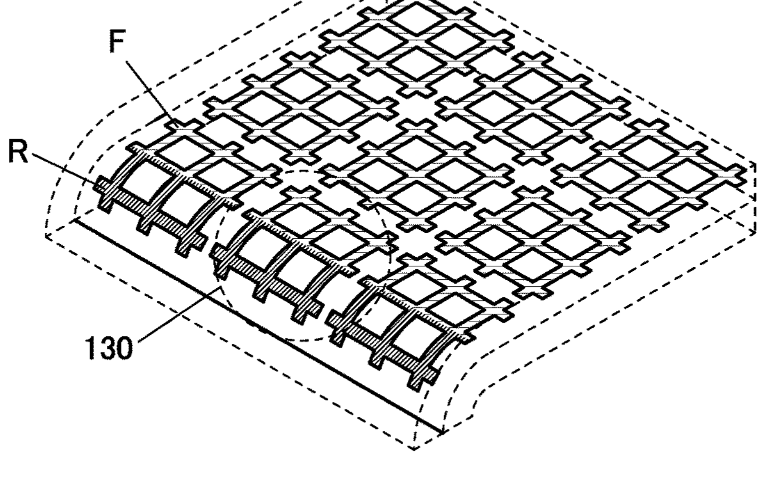

Alternatively, the antenna 130 provided in the vicinity of the long-side end portions may include the region R having a curvature and the flat region F as illustrated in FIG. 4C. Although FIG. 4C illustrates an example in which the region R and the region F have areas with substantially the same size in the antenna 130, one of the region R and the region F may have a larger area than the other.

Note that although FIG. 4B and FIG. 4C each illustrate an example in which the antennas 130 in the curved portion 161 in the vicinity of the long-side end portions are arranged in one column (the column is in the long-axis direction of the rectangular display apparatus), the antennas 130 in a plurality of columns may be provided in the curved portion. In this case, all the plurality of columns of the antennas 130 can include the region R as a whole.

Although the arrangement of antennas is limited to one direction in the structure illustrated in FIG. 1, the antennas can be arranged in a plurality of directions in the structures illustrated in FIG. 4A to FIG. 4C. Thus, a radio wave can be transmitted radially, so that signal transmission are easily performed. In addition, the reception of the radio waves from a plurality of directions can be easily performed.

Figure 5A:
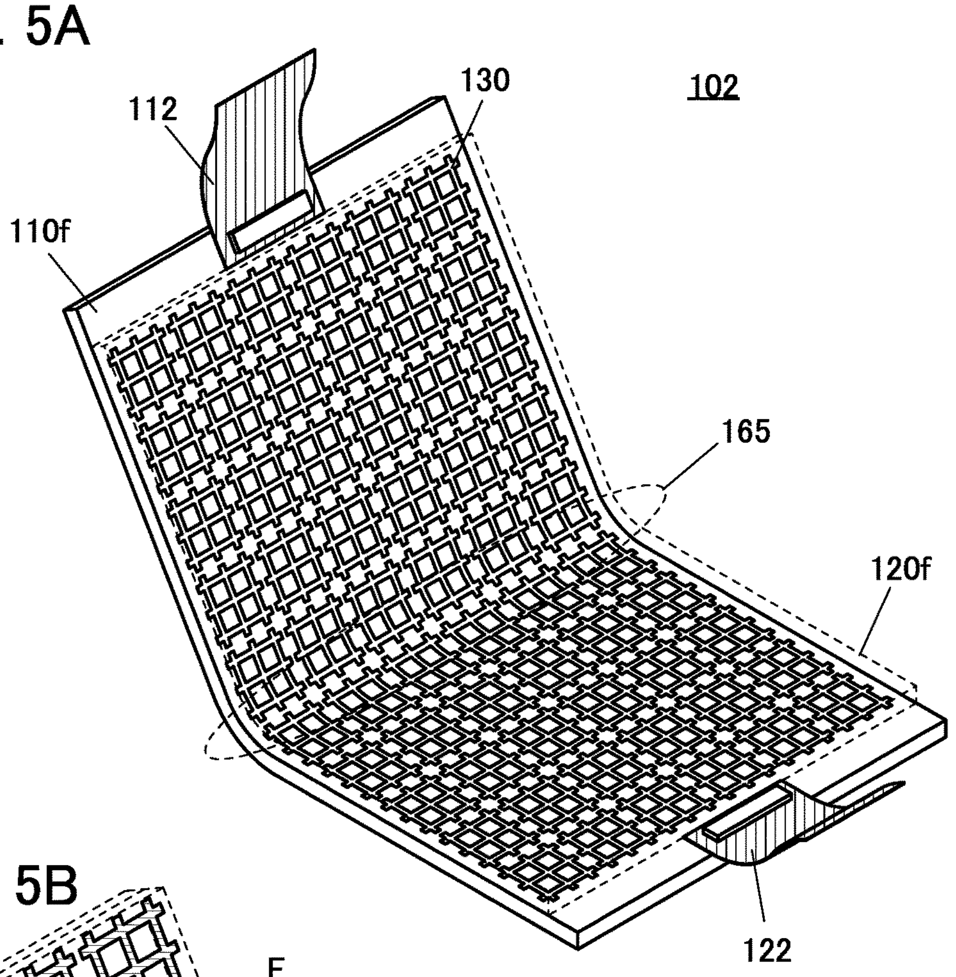
FIG. 5A to FIG. 5C are diagrams illustrating structure examples of a display apparatus.

FIG. 5A is an example in which the pair of substrates (the substrate **110*f* and the substrate 120*f*) has flexibility and illustrates a display apparatus 102 which is different from the display apparatus in FIG. 4A. The display apparatus 102 illustrated in FIG. 5A is different from the display apparatus 101 illustrated in FIG. 4A in that the display apparatus can be folded in two. FIG. 5**A illustrates an example of a folded mode.

The display apparatus 102 has a rectangular top surface shape in the flatly opened state and can be folded in two along a region 165 positioned near the center seen in the long-axis direction such that half of a surface of the substrate **120*f* (opposite to a surface on the substrate 110*f* side) faces the other half thereof. In this structure, as illustrated in FIG. 5A, the region 165 includes a concave curved portion in the folded state. Thus, the antenna 130 positioned in the region 165 can include the region R as illustrated in FIG. 5B and FIG. 5**C.

Figure 5B:
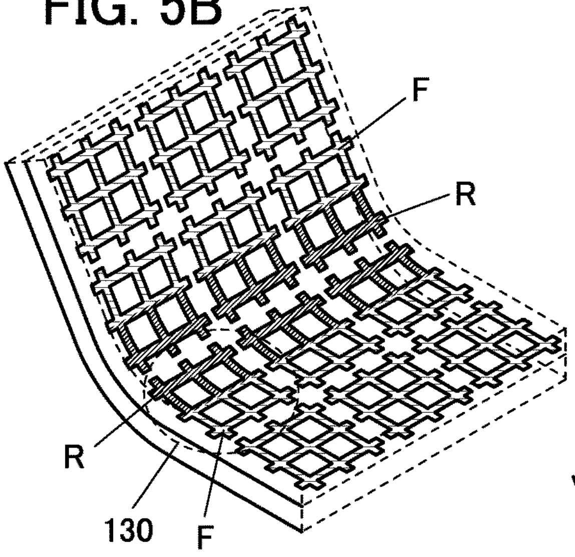
Figure 5C:
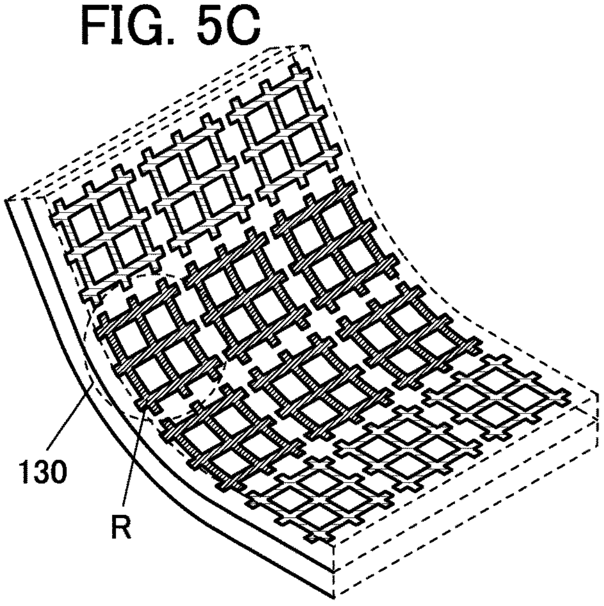

Note that the antenna 130 positioned in the region 165 may include the region R and the region F as illustrated in FIG. 5B. Although FIG. 5B illustrates an example in which the region R and the region F have areas with substantially the same size in the antenna 130, one of the region R and the region F may have a larger area than the other. As illustrated in FIG. 5C, the antenna 130 positioned in the region 165 may include the region R and does not necessarily include the region F.

Although FIG. 5B and FIG. 5C illustrate an example in which the curved portion has two rows (the row is in the short-axis direction of the rectangular display apparatus) of the antennas 130, the curved portion may have one row of the antennas 130. In this case, one antenna may include the region R and the region F or include the region R and does not include the region F.

Alternatively, the curved portion may have a plurality of rows of the antennas 130. In this case, all the antennas 130 include the region R and do not include the region F in some cases. Note that in this structure, one and/or the other of the antennas 130 provided in the vicinity of end portions of the curved portion have/has the region R and the region F in some cases.

In the structures illustrated in FIG. 5A to FIG. 5C, orientations of the antennas can be a plurality of directions. Each of the structures includes a plurality of antennas provided in two planar portions with different angles and a plurality of antennas provided in one curved portion, and the beamforming technology enables individual control of the regions, i.e., which region to increase the intensity of antennas can be controlled. This enables directionality of the antennas to be controlled. In addition, receiving sensitivity can be increased by adjusting the bending angle of the antennas.

Figure 6A:
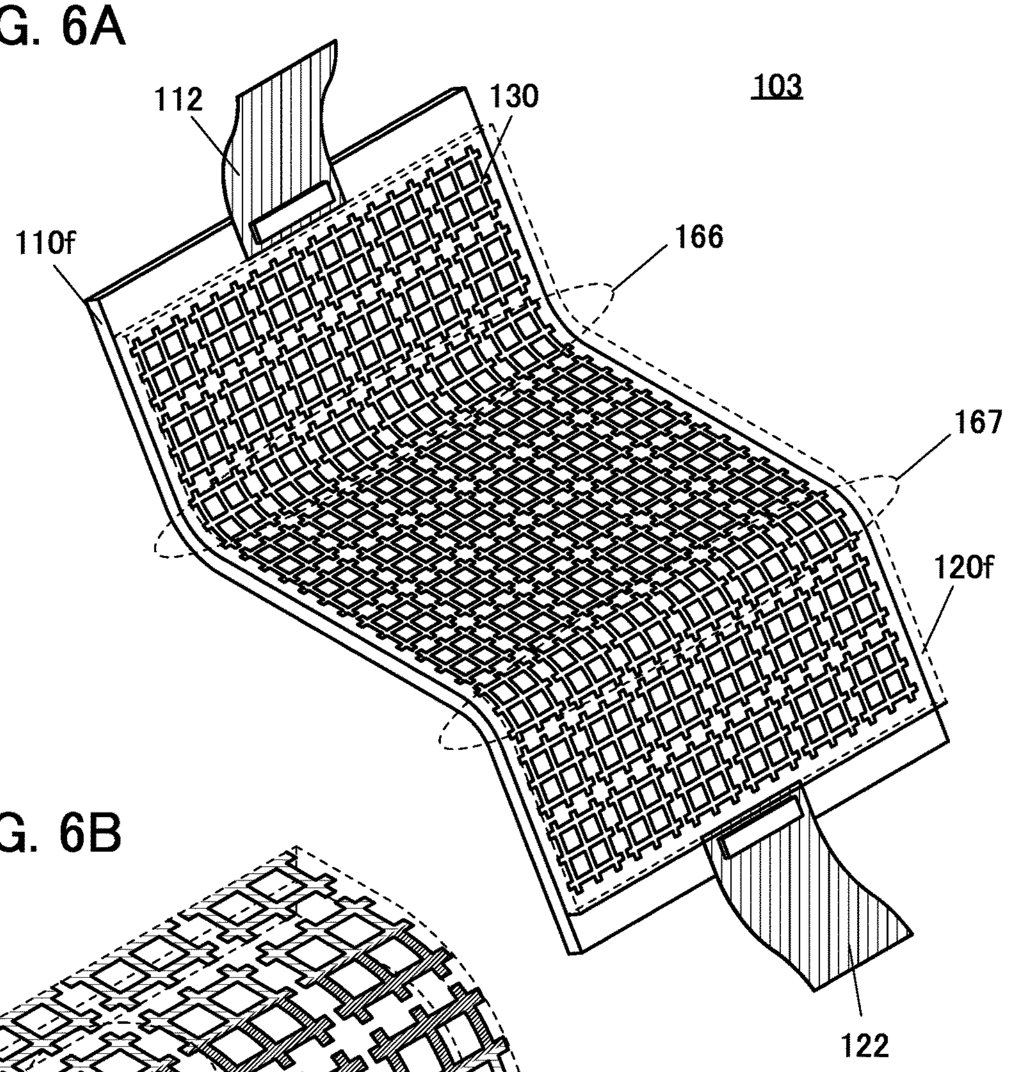
FIG. 6A to FIG. 6C are diagrams illustrating structure examples of a display apparatus.

FIG. 6A illustrates an example in which the pair of substrates (the substrate **110*f* and the substrate 120*f*) has flexibility and illustrates a display apparatus 103 which is different from the display apparatus in FIG. 5A. A display apparatus 102 illustrated in FIG. 6A is different from the display apparatus 102 illustrated in FIG. 5A in that a display apparatus can be folded in three. FIG. 6**A illustrates an example of a folded mode.

The display apparatus 103 has a rectangular top surface shape in a flatly opened state. The display apparatus 103 can be folded along a region 166 positioned closer to the FPC 112 than the center seen in the long-axis direction such that a part of a front surface of one third of the substrate 120*f* (opposite to a surface on the substrate 110*f* side) faces an another part of the front surface of the substrate 120*f*, and can also be folded along a region 167 positioned closer to the FPC 122 than the center seen in the long-axis direction such that a part of a rear surface of the substrate 120*f* faces another part of the rear surface of the substrate 120*f*. In this structure, the region 166 includes a concave curved portion and the region 167 includes a convex curved portion in the folded state as illustrated in FIG. 6A. In the convex curved portion, the antenna 130 can include the region R as illustrated in FIG. 6B and FIG. 6C.

Figure 6B:
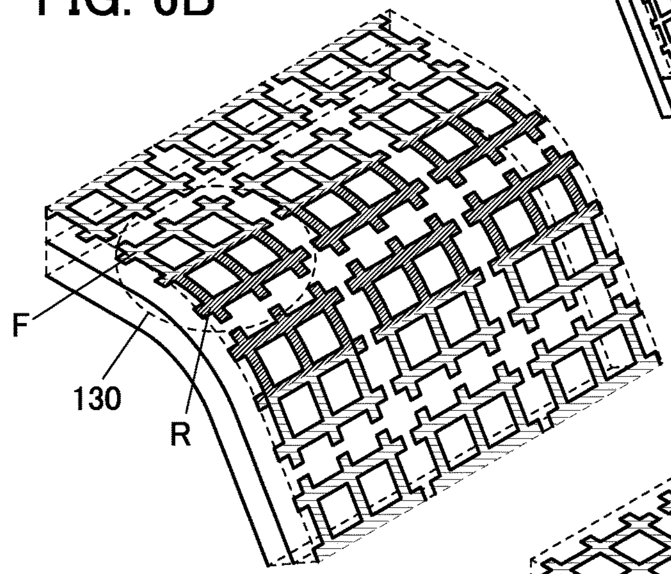
Figure 6C:
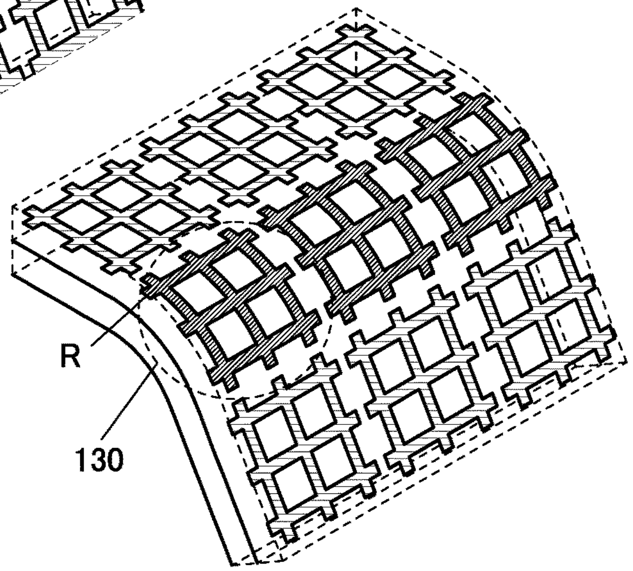

Note that the antenna 130 positioned in the region 167 may include the region R and the region F as illustrated in FIG. 6B. Although FIG. 6B illustrates an example in which the region R and the region F have areas with substantially the same size in the antenna 130, one of the region R and the region F may have a larger area than the other.

Although FIG. 6B illustrates an example in which the curved portion has two rows (the row is in the short-axis direction of the rectangular display apparatus) of the antennas 130, the curved portion may have one row of the antennas 130. In this case, one antenna 130 may include the region R and does not include the region F as illustrated in FIG. 6C or one antenna 130 may include the region R and the region F.

Alternatively, the curved portion may have a plurality of rows of the antennas 130. In this case, all the antennas 130 include the region R and do not include the region F in some cases. Note that in this structure, one and/or the other of the antennas 130 provided in the vicinity of end portions of the curved portion have/has the region R and the region F in some cases.

For the antenna 130 in the region 166 having the concave curved portion, the description of FIG. 5B and FIG. 5C can be referred to.

In the structures illustrated in FIG. 6A to FIG. 6C, orientations of the antennas can be a plurality of directions. Each of the structures includes a plurality of antennas provided in three planar portions with different angles and a plurality of antennas provided in two curved portions, and the beamforming technology enables individual control of the regions, i.e., which region to increase the intensity of antennas can be controlled. This enables directionality of the antennas to be controlled. In addition, receiving sensitivity can be increased by adjusting the bending angle of the antennas.

Note that in all the structure examples described in this embodiment, the substrate 110 and the substrate 120 can be replaced with the substrate 110*f* and the substrate 120*f*, respectively.

Figure 7A:
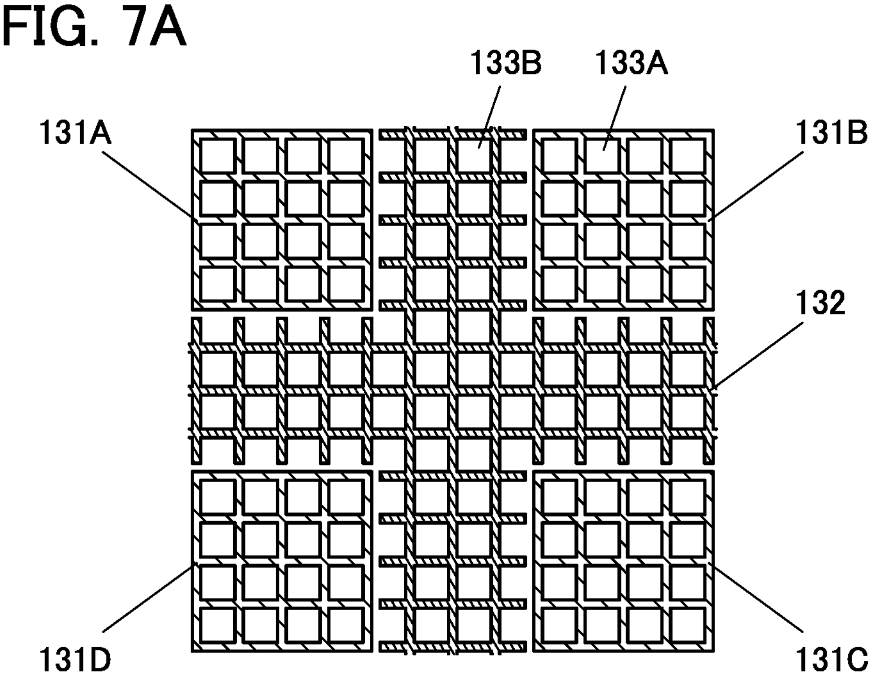
FIG. 7A and FIG. 7B are diagrams illustrating a structure example of conductive layers.

FIG. 7A illustrates an example of a layout (a top view) of conductive layers 131A to 131D which can be used as the antennas 130 (antennas 130_1 to 130_N) illustrated in FIG. 3A and a conductive layer 132 provided between the antennas 130. Openings 133A for transmitting light emitted from the pixels are provided in the conductive layers 131A to 131D. Openings 133B for transmitting light emitted from the pixels are provided in the conductive layer 132.

The conductive layers 131A to 131D functioning as antennas are provided apart from the conductive layer 132 not functioning as an antenna. The opening 133A and the opening 133B are provided in a region overlapping with pixels included in the display portion. This structure allows light from the display element to be emitted to the outside through the opening 133A and the opening 133B; thus, a material not having a light-transmitting property can be used for the conductive layers 131A to 131D. That is, a material such as a metal or alloy that has lower resistance than a light-transmitting conductive material can be used as a material for the conductive layers functioning as antennas.

Figure 7B:
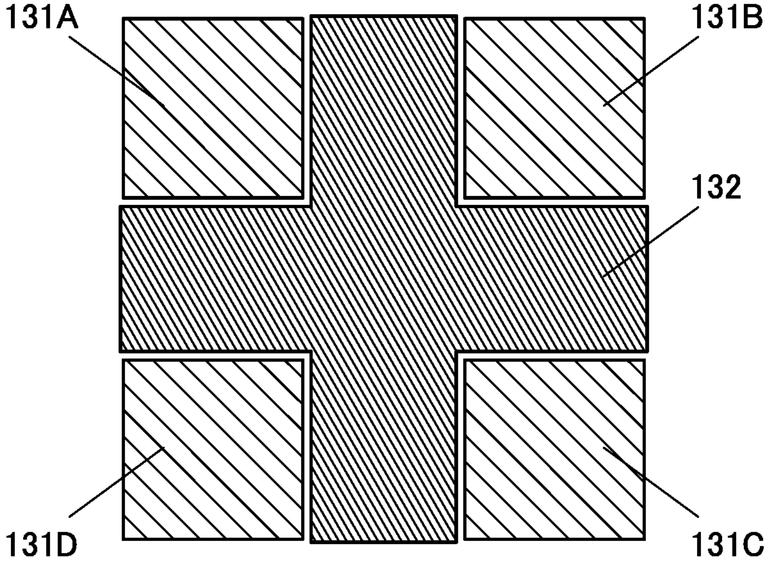

FIG. 7B is a schematic view where regions illustrated in FIG. 7A as the layout diagram are expressed as block diagrams. As in FIG. 7A, FIG. 7B illustrates the conductive layers 131A to 131D and the conductive layer 132.

As illustrated in FIG. 7A and FIG. 7B, the conductive layers functioning as antennas are arranged in a regular pattern with the conductive layer not functioning as an antenna provided therebetween, thereby enabling a structure in which antennas are arranged at intervals of several mm, which corresponds to ½ wavelength of the communication frequency, for example. Thus, the beamforming technology with antennas arranged in an array can be used. Since the beamforming technology enables antenna directionality, the beamforming technology can compensate for radio wave propagation loss caused when communication frequency increases.

As illustrated in FIG. 7A and FIG. 7B, the conductive layers functioning as antennas are arranged in a regular pattern with the conductive layer not functioning as an antenna provided therebetween, the transmittance or the like of a layer where these conductive layer are formed is macroscopically uniform, so that the display quality can be increased.

Although a structure example in which the conductive layers 131A to 131D have square shapes in a top view and are arranged in a regular pattern is illustrated in FIG. 7A and FIG. 7B, one embodiment of the present invention is not limited thereto. The shapes of the conductive layers 131A to 131D may be circles, triangles, pentagons, hexagons, octagons, or the like in a top view. Alternatively, the shapes of the opening 133A and the opening 133B may also be circles, triangles, pentagons, hexagons, octagons so as to correspond to the shapes of the frame of the conductive layers 131A to 131D.

With reference to FIG. 8A to FIG. 8F, structure examples of a conductive layer 131 that can be used as the conductive layers 131A to 131D functioning as antennas and illustrated in FIG. 7A will be described.

Figure 8A:
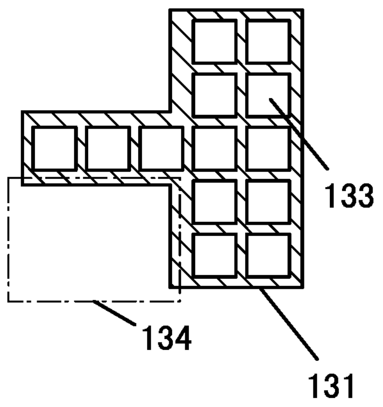
FIG. 8A to FIG. 8F are diagrams illustrating structure examples of a conductive layer.

FIG. 7A illustrates the conductive layers functioning as antennas, each having a rectangular shape with rectangular openings in a planar view; however, one embodiment of the present invention is not limited to this structure. For example, the conductive layer 131 may have an opening 133 and a cutout portion 134, as illustrated in FIG. 8A.

Figure 8B:
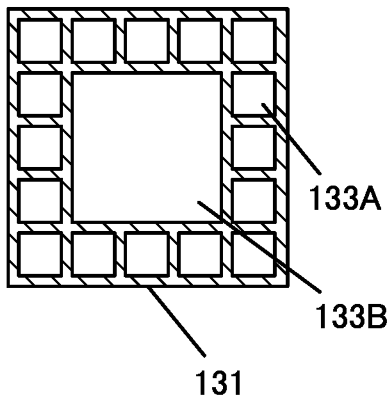

As another structure, the conductive layer 131 may have the opening 133A and the opening 133B with different sizes, as illustrated in FIG. 8B, for example.

Figure 8C:
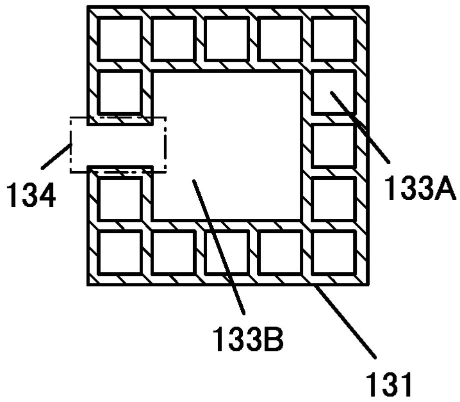

As another structure, the conductive layer 131 may have the cutout portion 134 in addition to the opening 133A and the opening 133B with different sizes, as illustrated in FIG. 8C, for example.

Figure 8D:
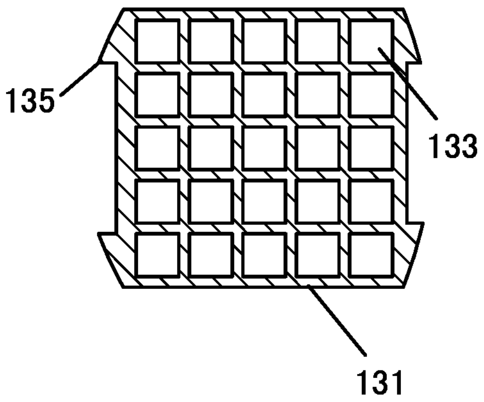

As another structure, the conductive layer 131 may have a protrusion portion 135 in addition to the opening 133, as illustrated in FIG. 8D, for example.

Figure 8E:
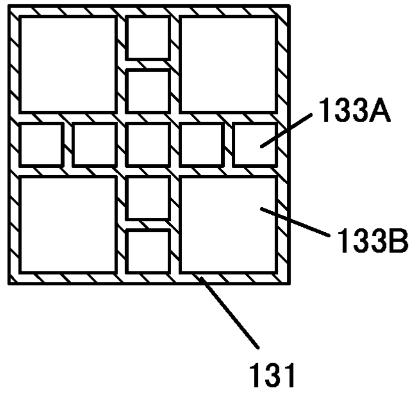

As another structure, the conductive layer 131 may have a plurality of openings 133A and a plurality of 133B with different sizes, as illustrated in FIG. 8E, for example.

Figure 8F:
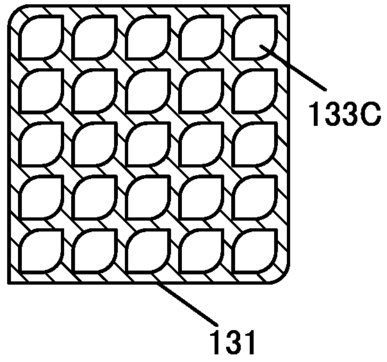

As another structure, the conductive layer 131 may have an opening 133C with round corners, as illustrated in FIG. 8F, for example. In addition, corners of the conductive layer 131 may be round as illustrated in FIG. 8F.

Figure 9A:
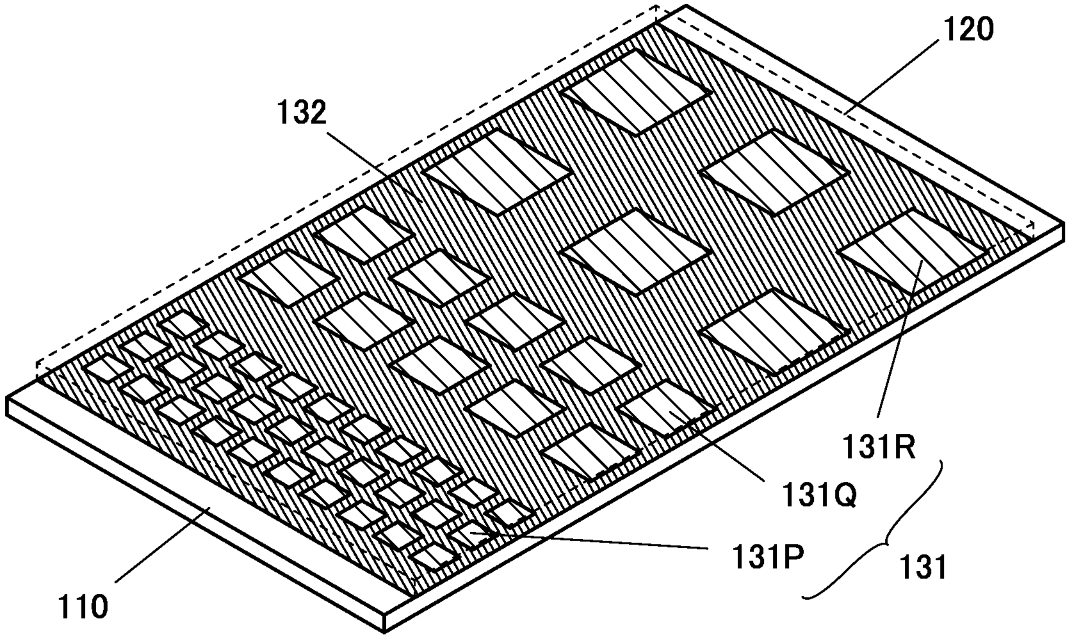
FIG. 9A and FIG. 9B are diagrams illustrating structure examples of a display apparatus.

FIG. 9A is a schematic view that illustrates a display apparatus including a plurality of kinds of conductive layers

131 with different sizes functioning as antennas and the conductive layer 132 in a block diagram similar to FIG. 7B. As the conductive layers 131 with different sizes functioning as the antennas 130, the conductive layers 131P, 131Q, and 131R are illustrated. Arranging a plurality of kinds of antennas with different sizes enables transmission and reception of radio signals with different communication frequencies.

Arranging the conductive layers 131 (the conductive layers 131P, 131Q, and 131R) functioning as the antennas 130 in a regular pattern with the conductive layer 132 not functioning as the antenna 130 provided therebetween as illustrated in FIG. 9A enables the use of beamforming technology with the antennas 130 arranged in an array. The conductive layer 132 not functioning as the antenna 130 may be used as an electrode of the touch sensor.

Figure 9B:
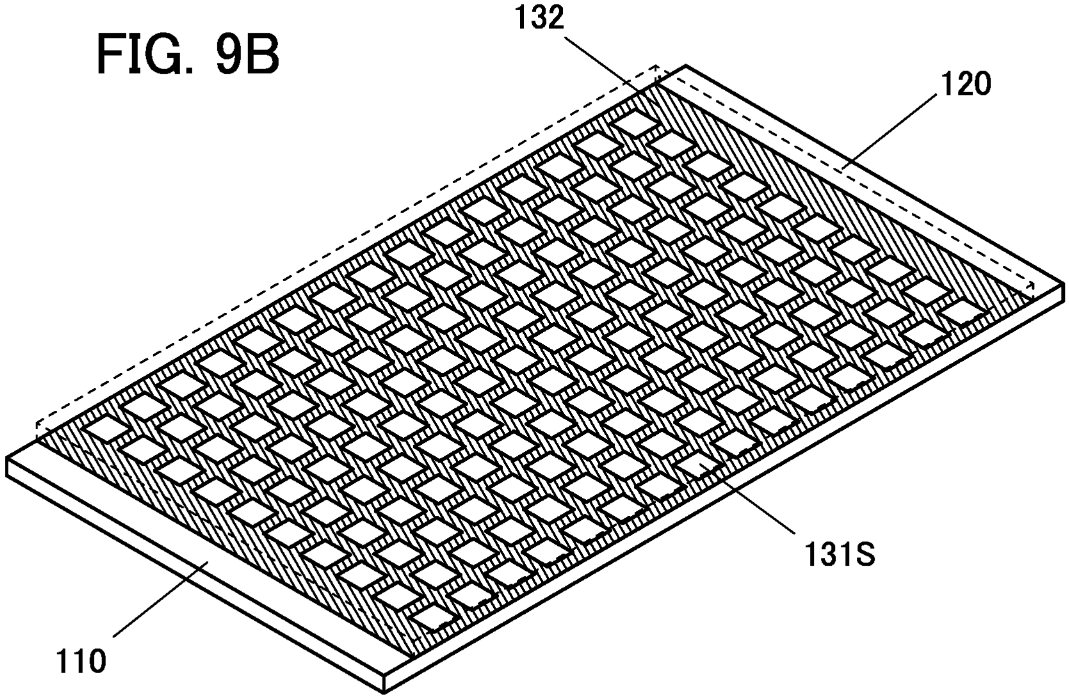

Alternatively, conductive layers 131S may be arranged at regular intervals as illustrated in FIG. 9B. The conductive layer 131S can have a function of an electrode of the touch sensor in addition to a function of an antenna. Note that the conductive layer 132 provided between the conductive layers 131S may function as an electrode of the touch sensor or may not have a specific function.

Figure 10A:
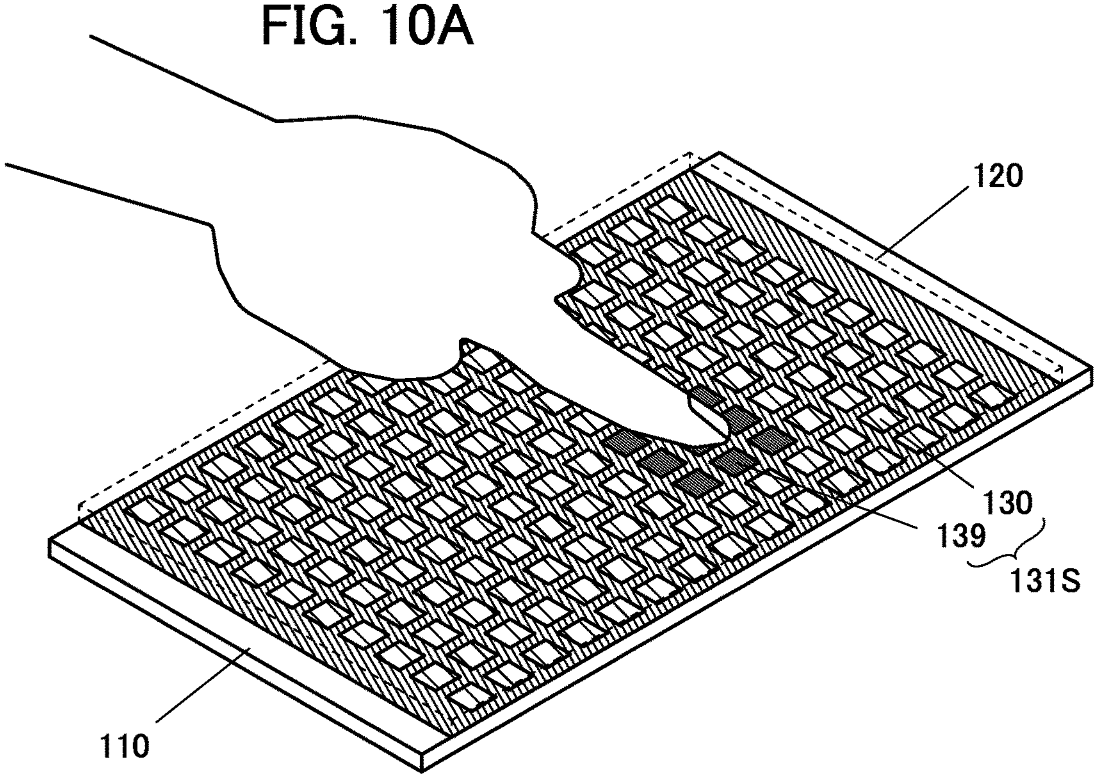
FIG. 10A and FIG. 10B are diagrams illustrating structure examples of a display apparatus.
Figure 10B:
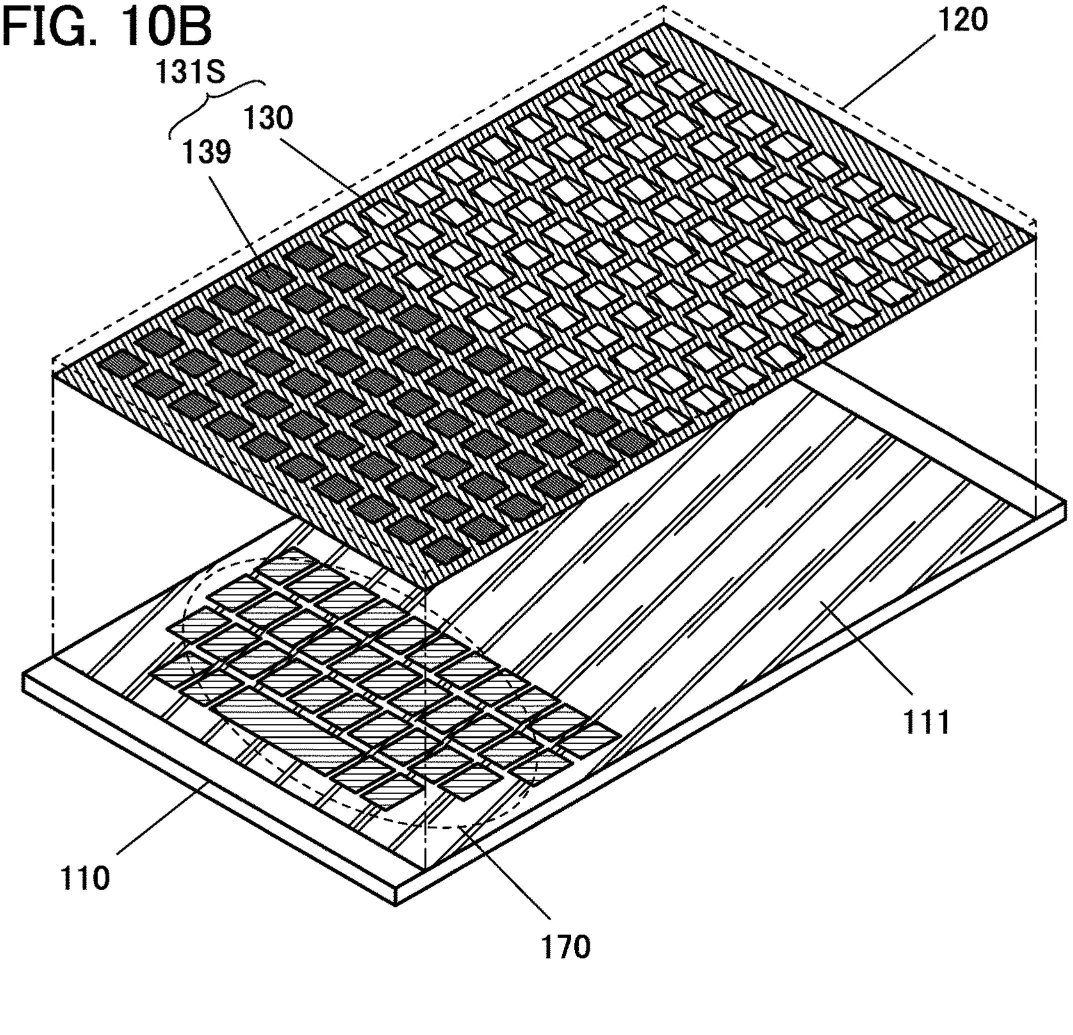

For example, the conductive layer 131S positioned in the vicinity of a region touched by a finger can function as an electrode 139 of the touch sensor, and the conductive layers 131S positioned in the other regions can function as the antennas 130 as illustrated in FIG. 10A. Alternatively, when a keyboard 170 is displayed on the display portion 111, for example, the conductive layer 131S positioned in a region overlapping with the display of the keyboard 170 and the vicinity thereof can function as the electrode 139 of the touch sensor and the conductive layers 131S positioned in the other regions can function as the antennas 130 as illustrated in FIG. 10B.

That is, the conductive layer 131S functions as a touch sensor during a certain period and functions as an antenna during the other period. Alternatively, the conductive layer 131S in a certain region functions as a touch sensor and the conductive layers 131S in the other regions function as an antenna metal. The conductive layer 131S can be operated switching the function of an antenna and the function of a touch sensor depending on regions and time.

Figure 11A:
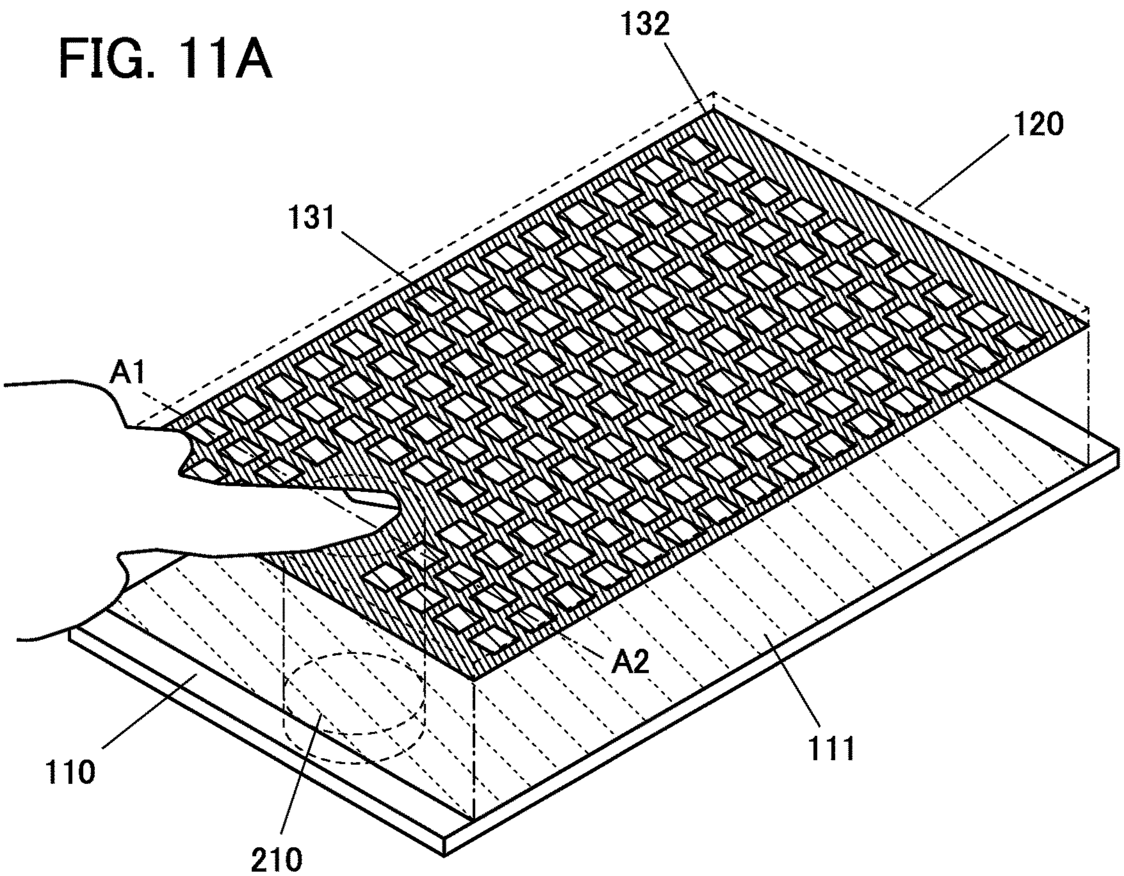
FIG. 11A to FIG. 11D are diagrams illustrating structure examples of a display apparatus.

As illustrated in FIG. 11A, in the case where the display apparatus employs a structure in which the conductive layers 131 functioning as the antennas 130 are arranged so as to overlap with the display portion 111 (including the structure of FIG. 9B) and the display apparatus includes a region where a fingerprint sensor 210 and the display portion 111 overlap with each other, it is preferable that the conductive layer 131 be not provided in the region. As the fingerprint sensor 210, an optical sensor or an ultrasonic wave sensor can be used. When the conductive layer 131 is provided between a finger (fingerprint) and the fingerprint sensor 210, a clear fingerprint information cannot be obtained due to the influence of reflection of light or sound wave in some cases.

Figure 11B:
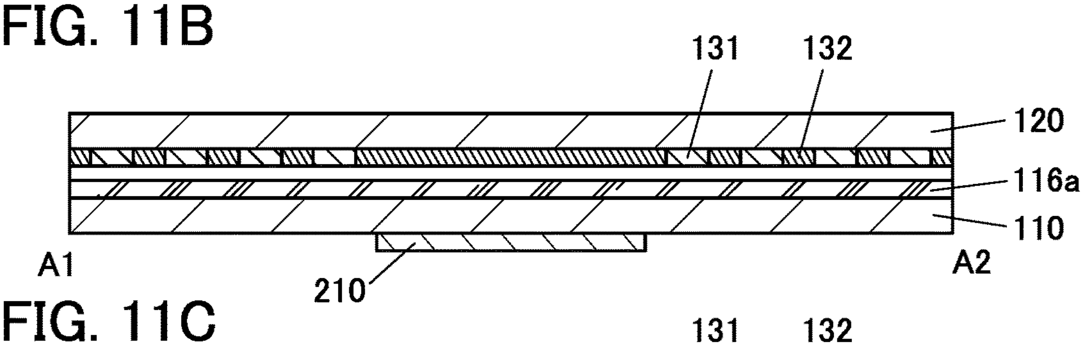

FIG. 11B is a cross-sectional view of a region taken along A1-A2 in FIG. 11A. A pixel array 116*a* forming the display portion 111 is provided between the substrate 110 and the substrate 120, in addition to the conductive layer 131 and the conductive layer 132. The fingerprint sensor 210 can be provided in contact with the lower side of the substrate 110 (a surface opposite to that on the substrate 120 side).

Figure 11C:
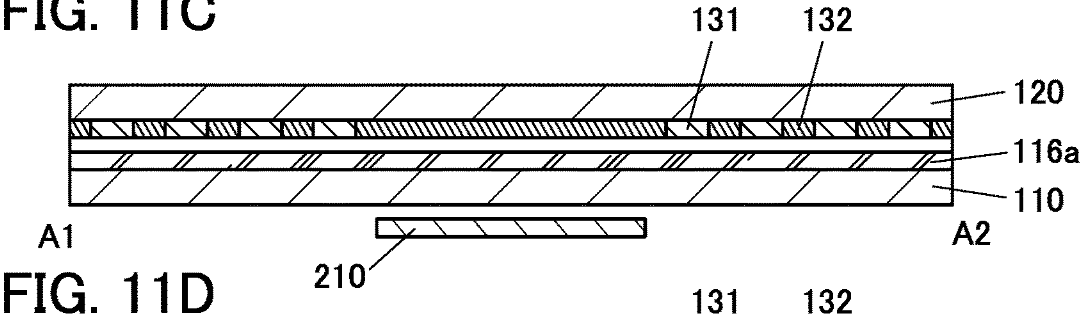

Alternatively, the fingerprint sensor 210 can be provided in a region positioned on the lower side of the substrate 110 and not in contact with the substrate 110 as illustrated in FIG. 11C. In this case, an adhesive layer or a space may be provided between the substrate 110 and the fingerprint sensor 210.

Figure 11D:
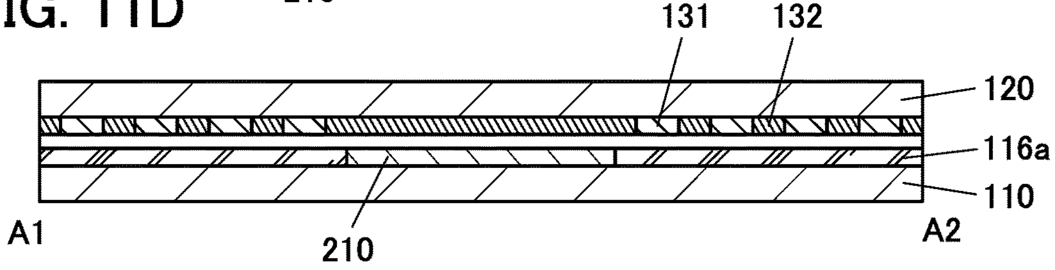

Although FIG. 11A to FIG. 11C shows an example in which the fingerprint sensor 210 externally attached to the display apparatus with use of an sensor module or an sensor IC, the fingerprint sensor 210 may be provided in the pixel array 116*a* as illustrated in FIG. 11D. In this case, a light-receiving device described later can be used as the fingerprint sensor. For example, in the case of using an organic EL element as a display device, the light-receiving device can be manufactured using a common process with the organic EL element.

FIG. 12A to FIG. 12D are cross-sectional views illustrating a layer in which the conductive layer 131 applicable to the conductive layers 131P, 131Q, 131R, and 131S and the conductive layer 132 can be provided. FIG. 12A to FIG. 12D are diagrams each simply illustrating the arrangement of the pixel 116, the conductive layer 131, and the conductive layer 132 provided between the substrate 110 and the substrate 120, and the other components are not illustrated.

The pixel 116 includes a transistor 117 and a display element 118 overlapping with and electrically connected to the transistor 117. In all the structures in FIG. 12A to FIG. 12D, the conductive layer 131 and the conductive layer 132 are preferably provided in a region not overlapping with the display element 118.

Figure 12A:
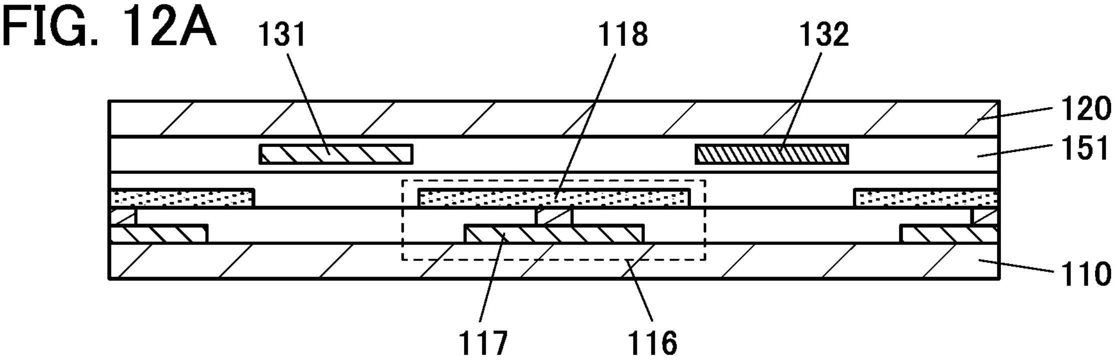
FIG. 12A to FIG. 12D are diagrams illustrating structure examples of a display apparatus.

FIG. 12A illustrates a structure where a layer 151 is provided between the display element 118 and the substrate 120. The conductive layer 131 and the conductive layer 132 are provided in the layer 151. FIG. 12A can be referred to as an in-cell type in which the antenna (the conductive layer 131) and the touch sensor (the conductive layer 132) are formed between the substrates. The layer 151 includes a plurality of insulating layers formed using one or both of an inorganic and organic materials, in addition to the conductive layers.

Figure 12B:
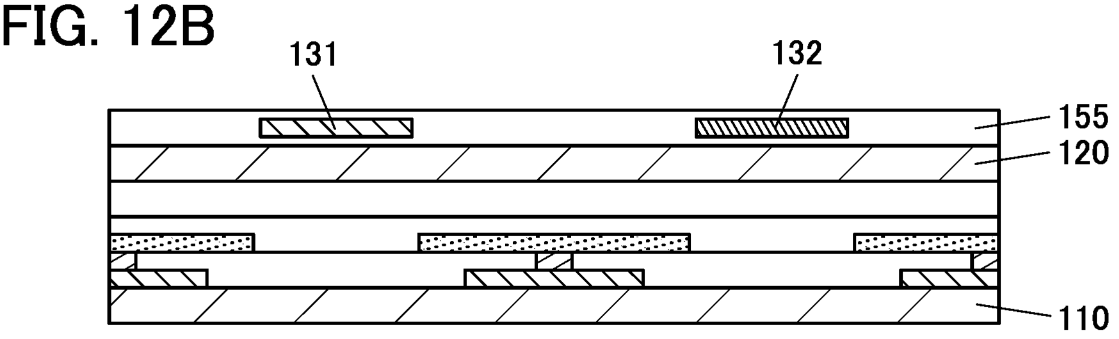

FIG. 12B illustrates a structure where a layer 155 is provided over the substrate 120. The conductive layer 131 and the conductive layer 132 are provided in the layer 155. The structure where the layer 155 is formed over the substrate 120 can be referred to as an on-cell type. A structure where the substrate 120 and the layer 155 are bonded to each other can be referred to as an out-cell type. Note that in the out-out cell type, an adhesive layer is provided between the substrate 120 and the layer 155. The layer 155 includes an insulator or the like formed using one or both of an inorganic and an organic material in addition to the conductive layers.

Figure 12C:
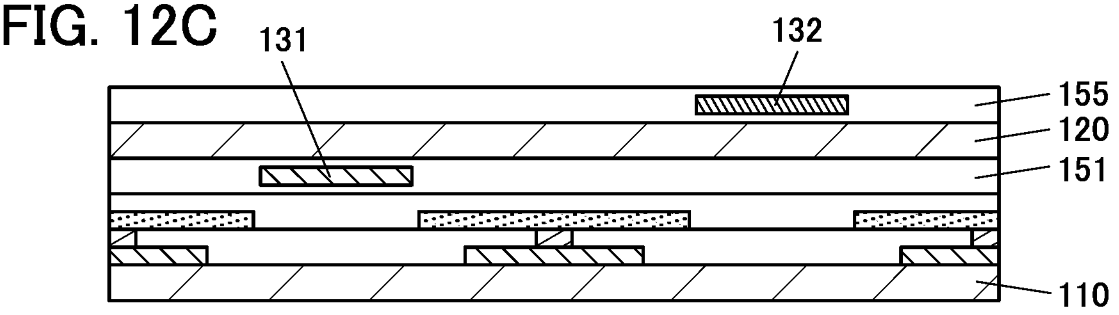
Figure 12D:
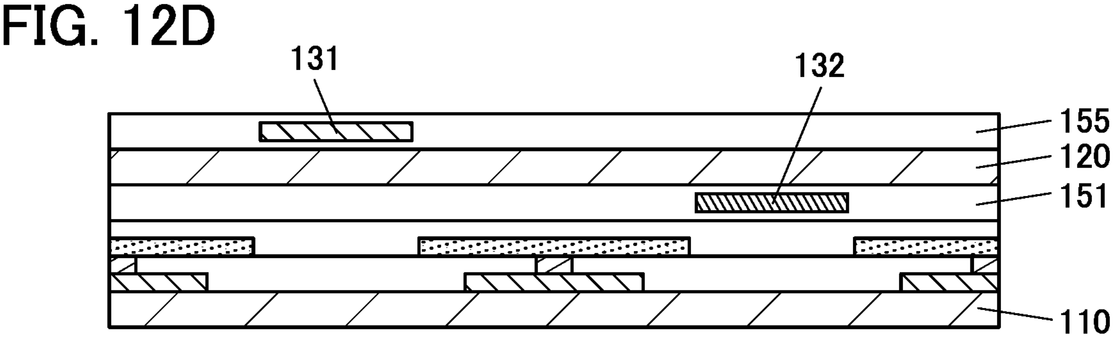

Note that the antenna (the conductive layer 131) may be provided in the layer 151 and the touch sensor (the conductive layer 132) may be provided in the layer 155 as illustrated in FIG. 12C. Alternatively, the antenna (the conductive layer 131) may be provided in the layer 155 and the touch sensor (the conductive layer 132) may be provided in the layer 151 as illustrated in FIG. 12D.

Figure 13A:
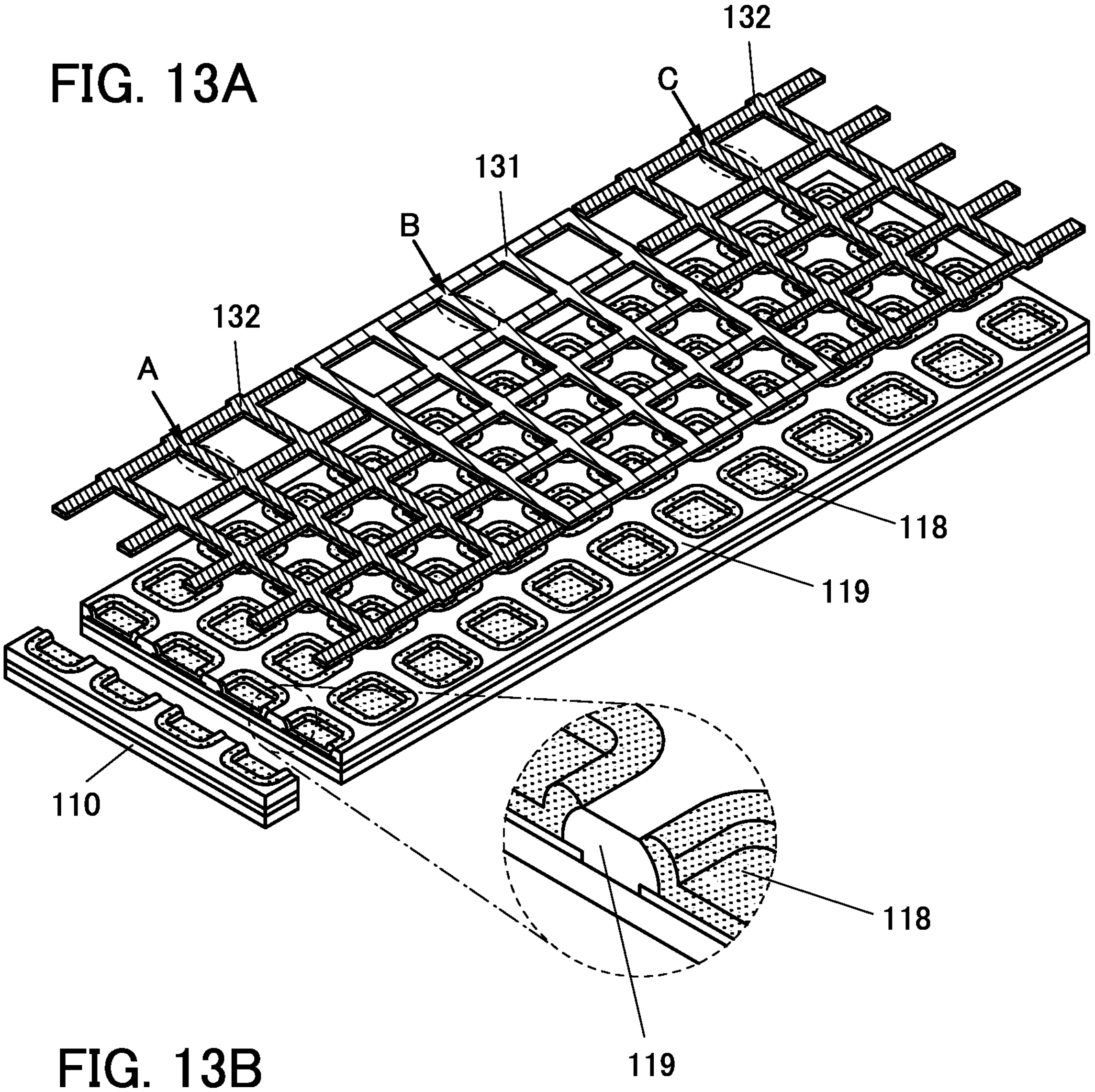
FIG. 13A and FIG. 13B are diagrams illustrating a structure example of a display apparatus.
Figure 13B:
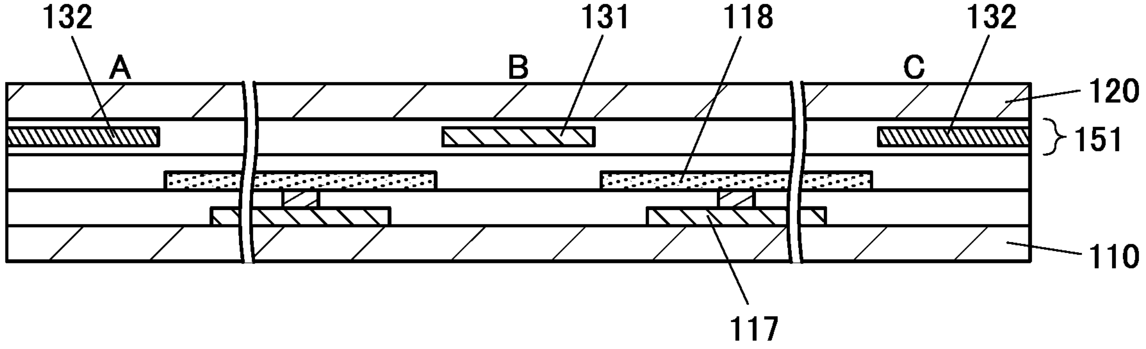

The structure of the in-cell type illustrated in FIG. 12A will be further described. FIG. 13A is a perspective view illustrating the structure in which the conductive layer 131 and the conductive layer 132 are formed at the same height in the layer 151. FIG. 13A also illustrates a cross-sectional view and an enlarged view of part of a region. FIG. 13B is a cross-sectional view including a region A, a region B, a region C and the vicinity thereof illustrated in FIG. 13A. Note that for simplification, some components are not illustrated in FIG. 13A and FIG. 13B.

Here, as the display element 118, an organic EL element is illustrated. An insulating layer 119 is provided between the display elements 118. A side wall of the insulating layer 119 has a curvature and the display element 118 is formed to have a region overlapping with the side wall. Provision of the side wall with a curvature in the insulating layer 119 inhibits disconnection of a common electrode electrically connected to an organic layer of the display element 118.

Figure 14A:
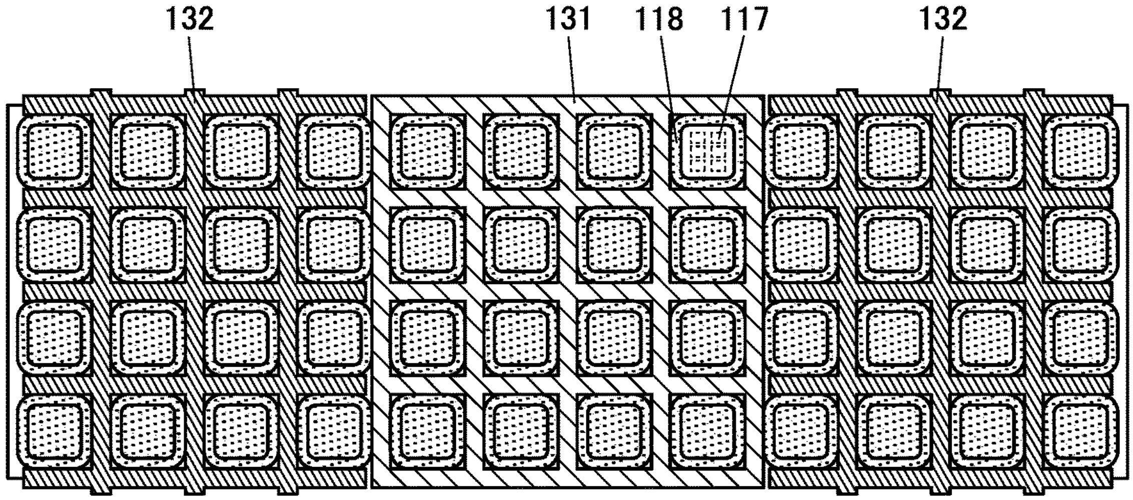
FIG. 14A and FIG. 14B are diagrams illustrating structure examples of a display apparatus.

Here, as illustrated in a top view of FIG. 14A, the conductive layer 131 and the conductive layer 132 are arranged so as to overlap with the insulating layer 119 and not to overlap with the display element 118. With this structure, light from the display element 118 can be efficiently emitted to the outside.

Figure 14B:
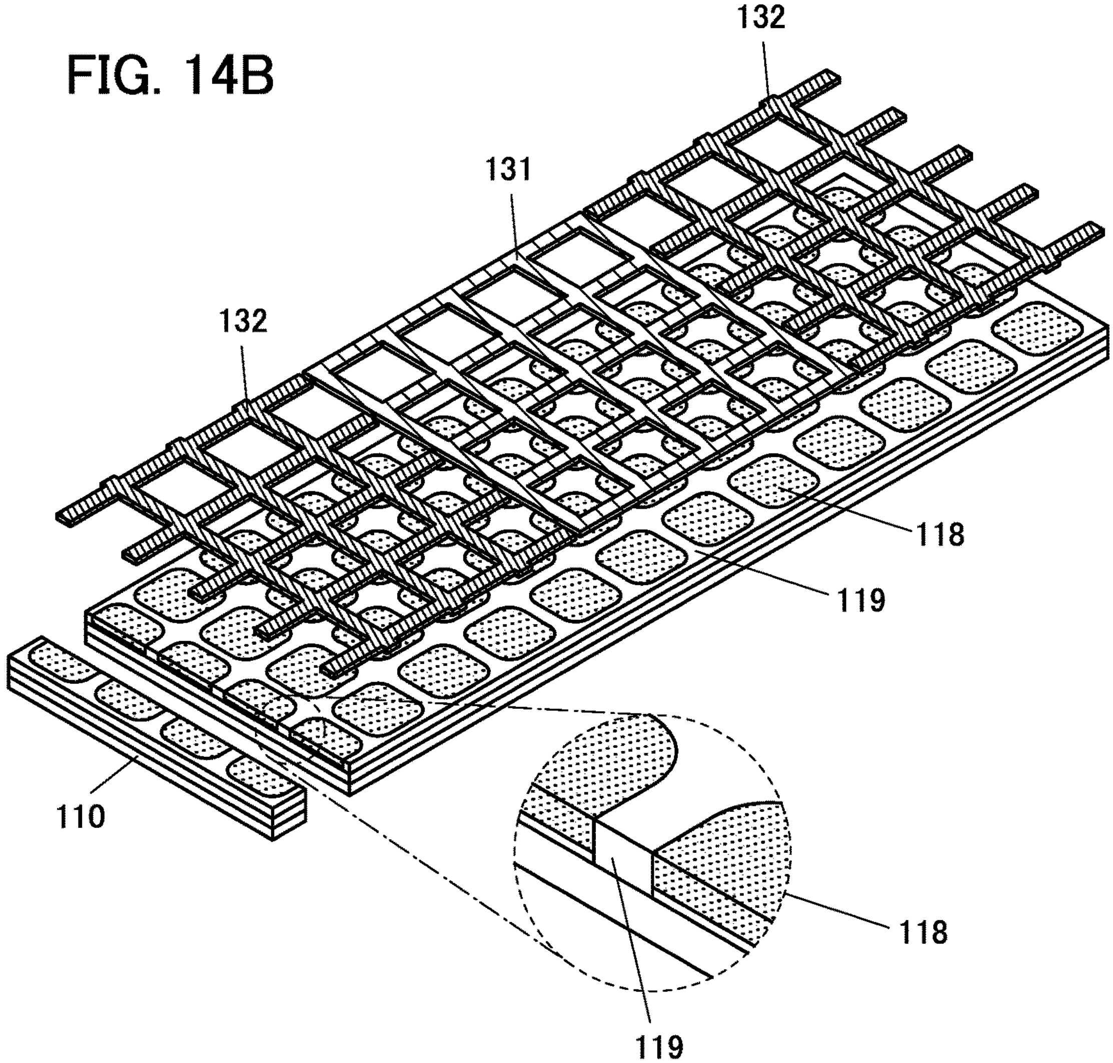

Note that the side wall of the insulating layer 119 does not necessarily have a curvature as illustrated in FIG. 14B. In this structure, the difference in height between the organic layer of the display element 118 and the insulating layer 119 is preferably small. In other words, gaps between the adjacent display elements 118 are filled with the insulating layer 119.

With such a structure, disconnection of the common electrode electrically connected to the organic layer of the display element 118 can be prevented. In the structure illustrated in FIG. 14B, the width between the display elements 118 can be smaller than that in the structure of FIG. 13A; thus, a display element with a high aperture ratio and a high-resolution can be formed. In the case where an organic EL element is used as the display element 118, current density can be reduced by a high aperture ratio, which leads to an increase in the reliability of the element.

As illustrated in FIG. 13A and FIG. 13B, the conductive layer 131 and the conductive layer 132 can be provided at the same height in the layer 151. Here, the same height indicates that surfaces on which the layers are formed are level with each other. Alternatively, the conductive layer 131 and the conductive layer 132 can be provided over one layer.

For example, a conductive film is formed over an insulating layer formed over the pixel and is processed, so that the conductive layer 131 and the conductive layer 132 can be formed. In this case, the conductive layer 131 and the conductive layer 132 are formed using the same conductive film and the same process, so that the manufacturing process can be simplified.

Alternatively, a first conductive film may be formed over an insulating layer formed over the pixel and the first conductive film is processed to form one of the conductive layer 131 and the conductive layer 132; a second conductive film may be formed over the insulating layer and the second conductive film is processed to form the other of the conductive layer 131 and the conductive layer 132. In this case, materials, thicknesses, and the like can differ between the conductive layer 131 and the conductive layer 132, whereby an appropriate structure in accordance with the usage can be provided.

Note that the thickness of the insulating layer formed over the pixel varies in some cases. For example, variation in thickness of the insulating layers can be lower than or equal to 30%, preferably lower than or equal to 20%, further preferably lower than or equal to 10% in the plane of the display portion. Therefore, when the difference in height between the surfaces on which the conductive layer 131 and the conductive layer 132 are formed are within these ranges, the heights of the surfaces on which the conductive layer 131 and the conductive layer 132 are formed can be regarded as being the same.

Figure 15A:
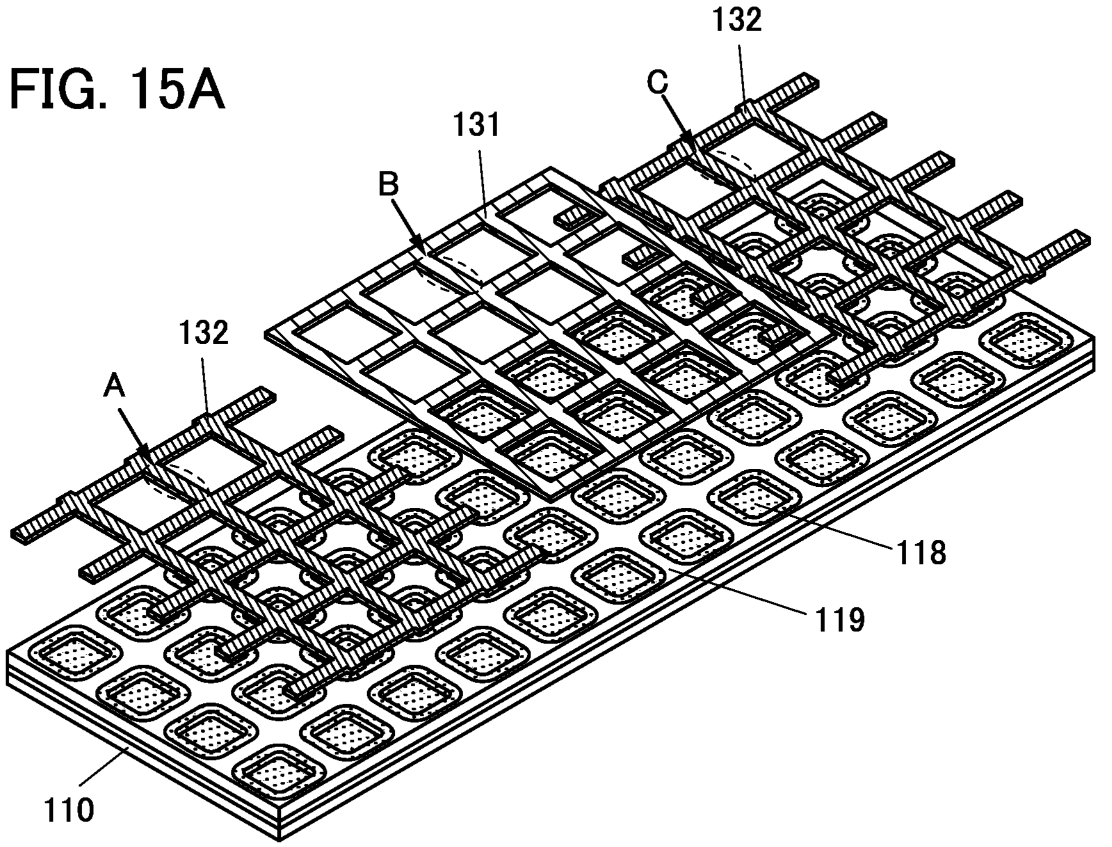
FIG. 15A and FIG. 15B are diagrams illustrating a structure example of a display apparatus.
Figure 15B:
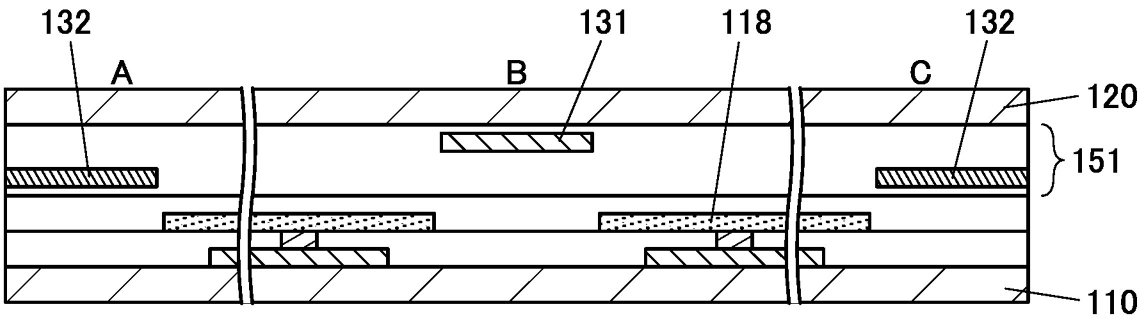

FIG. 15A illustrates a perspective view in which the conductive layer 131 and the conductive layer 132 are formed at different heights in the layer 151, as a modification example of the structure in FIG. 13A. FIG. 15B is a cross-sectional view including a region A, a region B, a region C, and the vicinity thereof illustrated in FIG. 15A. Note that for simplification, some components are not illustrated in FIG. 15A and FIG. 15B.

The conductive layer 131 and the conductive layer 132 can be provided at different heights in the layer 151 as illustrated in FIG. 15A and FIG. 15B. Here, the different heights indicate that surfaces on which the layers are formed are on different levels. Alternatively, the conductive layer 131 and the conductive layer 132 can be provided over different layers.

For example, a first conductive film is formed over a first insulating layer formed over the pixel and processed to form one of the conductive layer 131 and the conductive layer 132. Next, a second insulating layer may be formed over the first insulating layer and one of the conductive layer 131 and the conductive layer 132, and a second conductive film is formed over the second insulating layer and processed to form the other of the conductive layer 131 and the conductive layer 132. Note that a planarization step may be performed after the formation of the second insulating layer.

Constituent materials and thicknesses of the first insulating layer and the second insulating layer may be the same or different. Thus, the interface between the layers is not clear in some cases. Note that since a relatively high signal frequency is used in 5G, a radio wave is likely to be blocked by obstacles. Therefore, the conductive layer 131 used as an antenna is preferably provided at a higher position than (outside of) the conductive layer 132.

Figure 16A:
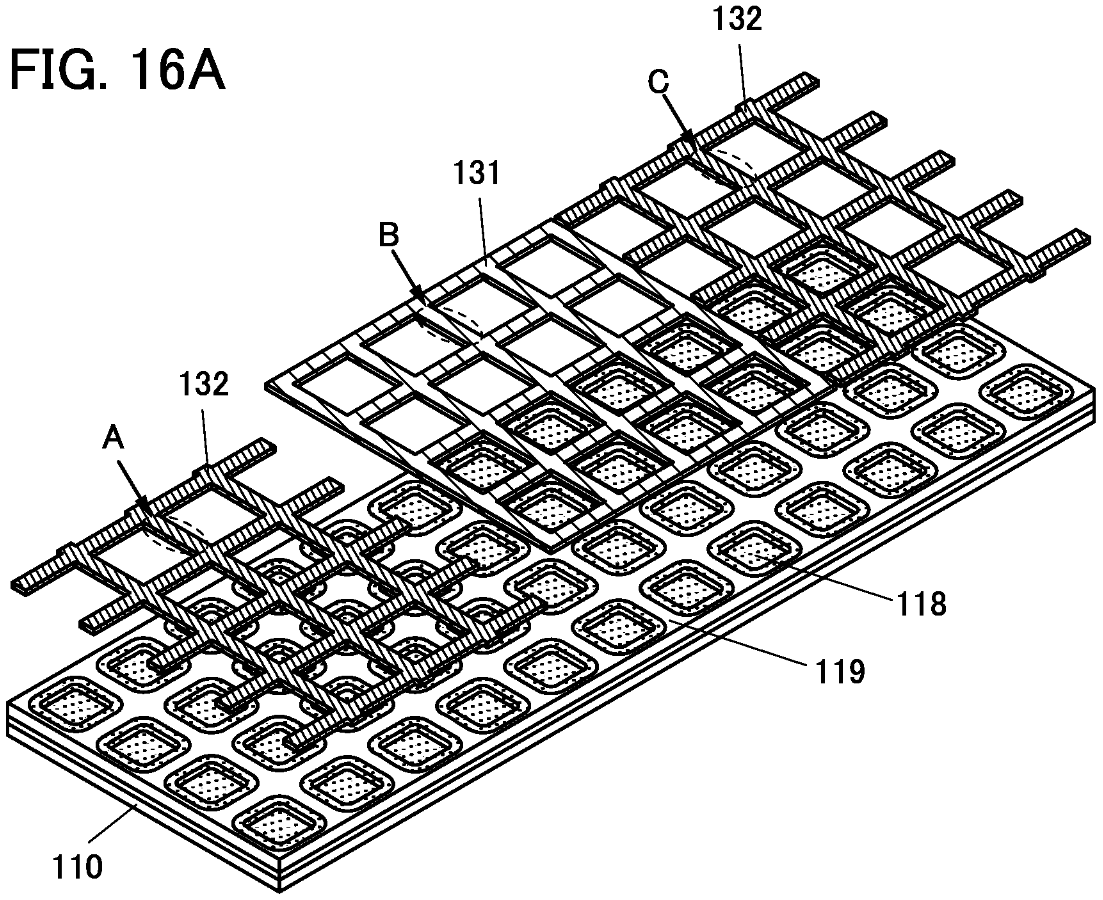
FIG. 16A and FIG. 16B are diagrams illustrating a structure example of a display apparatus.
Figure 16B:
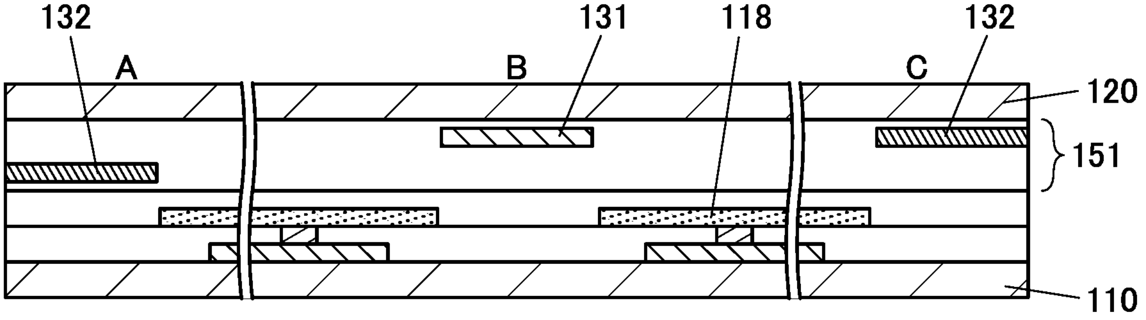

FIG. 16A illustrates a perspective view in which part of the conductive layers 132 is formed at a different height in the layer 151, as a modification example of the structure in FIG. 15A. FIG. 16B is a cross-sectional view including a region A, a region B, a region C, and the vicinity thereof illustrated in FIG. 16A. Note that for simplification, some components are not illustrated in FIG. 16A and the FIG. 16B.

Part of the conductive layers 132 can be provided at a different height in the layer 151 as illustrated in FIG. 16A and FIG. 16B. Here, the different height indicates that surfaces on which the layers are formed are on different levels. Alternatively, part of the conductive layers 132 can be provided over a different layer.

For example, a first conductive film is formed over the first insulating layer formed over the pixel and processed to form the conductive layer 132 provided in a first region. Next, a second insulating layer may be formed over the conductive layer 132 provided in the first region and the first insulating layer, and the second conductive layer is formed over the second insulating layer and processed to form the conductive layer 132 provided in a second region and the conductive layer 131. Note that a planarization step may be performed after the formation of the second insulating layer is formed.

With this structure, the conductive layer 132 provided in the first region can be formed using different materials and thicknesses from those for the conductive layer 132 provided in the second region and the conductive layer 131, whereby an appropriate structure in accordance with the usage can be provided.

Figure 17A:
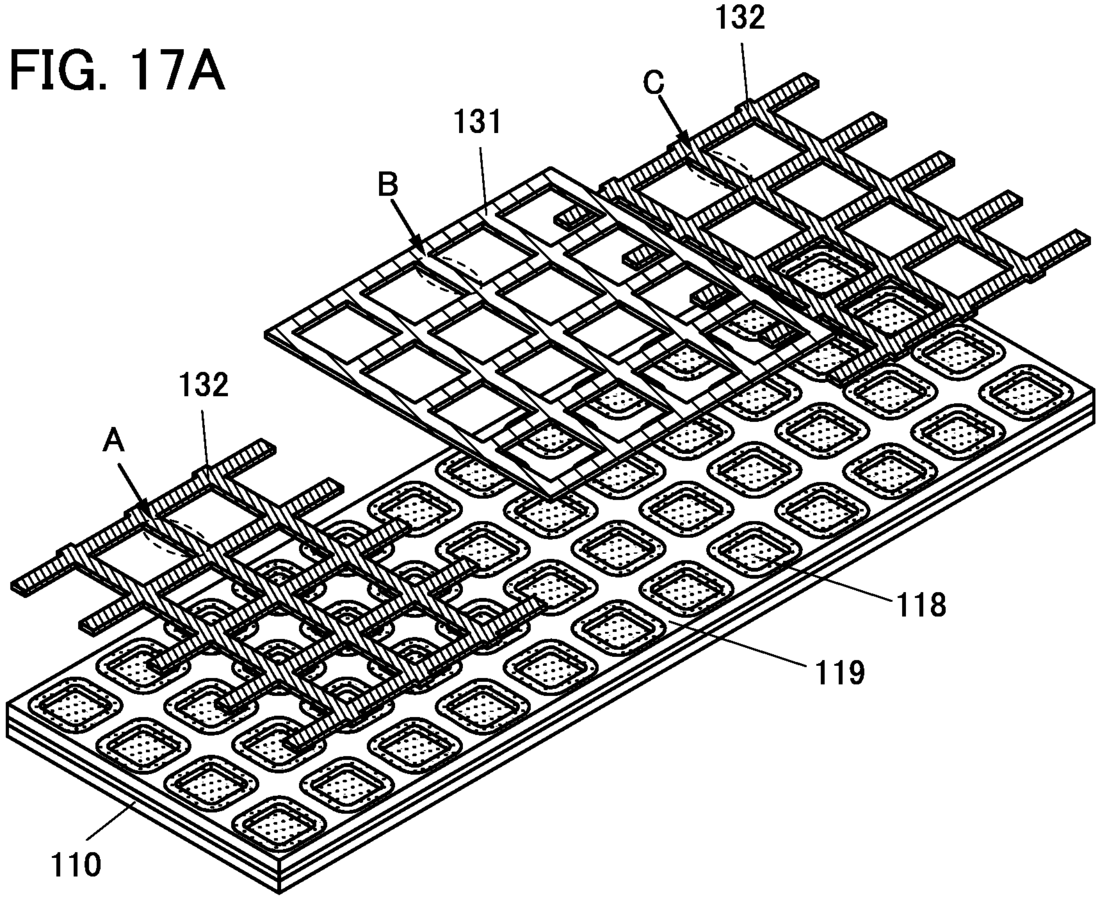
FIG. 17A and FIG. 17B are diagrams illustrating a structure example of a display apparatus.
Figure 17B:
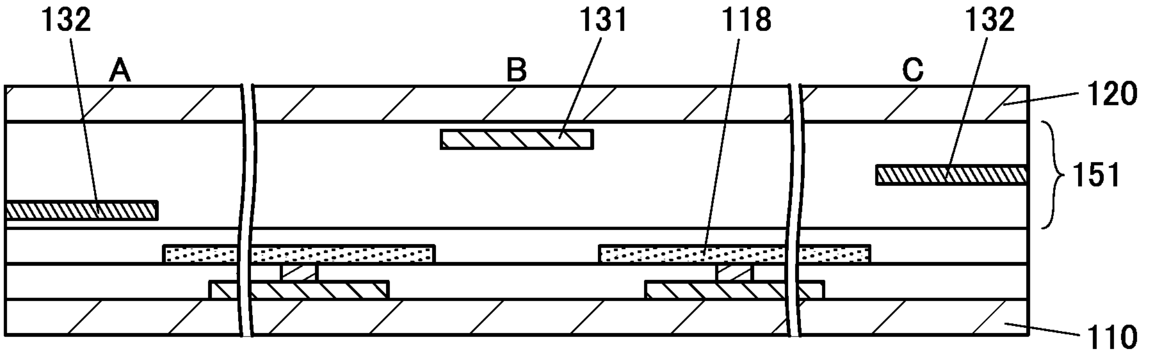

FIG. 17A illustrates a perspective view in which the conductive layer 132 provided in the first region, the conductive layer 131, and the conductive layer 132 provided in the second region are formed at different heights in the layer 151, as a modification example of the structure in FIG. 15A. FIG. 17B is a cross-sectional view including a region A, a region B, a region C, and the vicinity of thereof illustrated in FIG. 17A. Note that for simplification, some components are not illustrated in FIG. 17A and FIG. 17B.

The conductive layer 132 provided in the first region, the conductive layer 131, and the conductive layer 132 provided in the second region can be provided at different heights in the layer 151 as illustrated in FIG. 17A and FIG. 17B. Here, the different heights indicate that the heights of surfaces on which the layers are formed are different. Alternatively, the conductive layer 132 provided in the first region, the conductive layer 131, and the conductive layer 132 provided in the second region can be provided over different layers.

For example, a first conductive film is formed over the first insulating layer formed over the pixel and processed to form the conductive layer 132 provided in the first region. Next, a second insulating layer is formed over the conductive layer 132 provided in the first region and the first insulating layer, and a second conductive film is formed over the second insulating layer and processed to form the conductive layer 132 provided in the second region. Next, a third insulating layer is formed over the second insulating layer and the conductive layer 132 provided in the second region and, a third conductive film is formed over the third insulating layer and processed to form the conductive layer 131. Note that a planarization step may be performed after the formation of the second insulating layer and the formation of the third insulating layer.

With this structure, the conductive layer 132 provided in the first region, the conductive layer 132 provided in the second region, and the conductive layer 131 can be formed using different materials and thicknesses, whereby an appropriate structure in accordance with the usage can be provided.

Figure 18A:
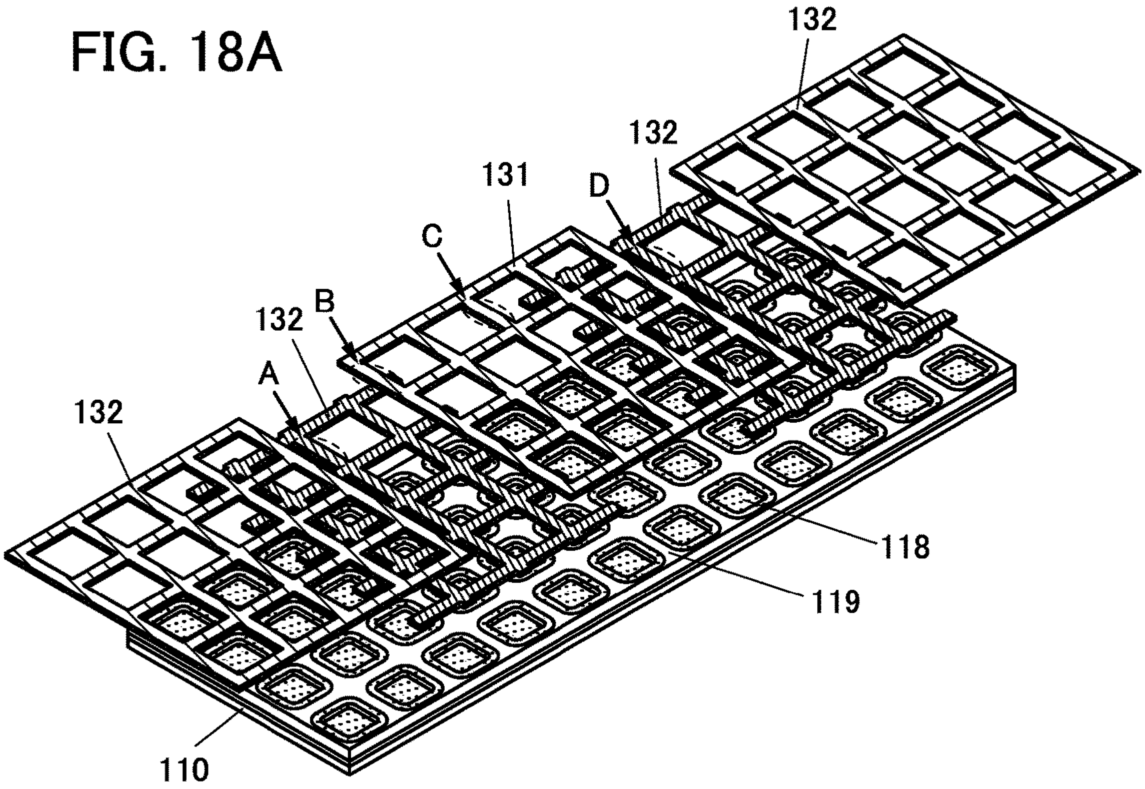
FIG. 18A and FIG. 18B are diagrams illustrating a structure example of a display apparatus.
Figure 18B:
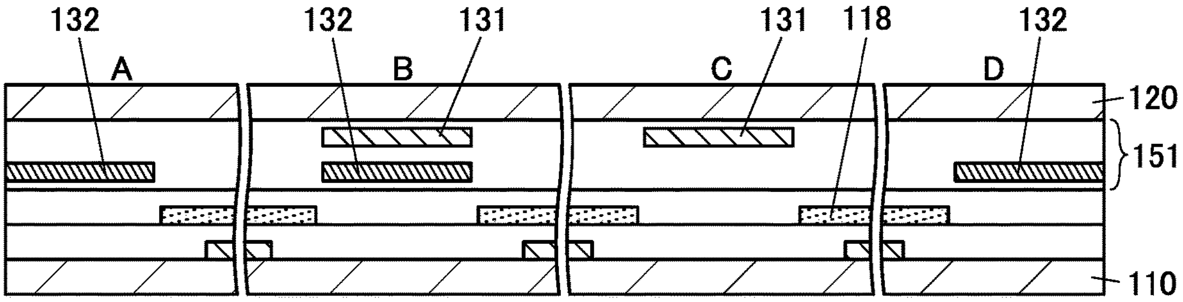

FIG. 18A illustrates a perspective view in which the conductive layer 131 and the conductive layer 132 are formed to have a region overlapping with each other in the layer 151, as a modification example of the structure in FIG. 15A. FIG. 18B is a cross-sectional view including a region A, a region B, a region C, a region D and the vicinity of thereof illustrated in FIG. 18A. Note that for simplification, some components are not illustrated in FIG. 18A and FIG. 18B.

The conductive layer 131 and the conductive layer 132 can be provided at different heights in the layer 151 as illustrated in FIG. 18A and FIG. 18B. The conductive layer 131 and the conductive layer 132 are formed such that one region of the conductive layer 131 and one region of the conductive layer 132 overlap with each other. Here, the different heights indicate that surfaces on which the layers are formed are on different levels. Alternatively, the conductive layer 131 and the conductive layer 132 can be provided over different layers.

For example, a first conductive film is formed over the first insulating layer formed over the pixel and processed to form the conductive layer 132. Next, a second insulating layer is formed over the first insulating layer and the conductive layer 132, and a second conductive film is formed over the second insulating layer and processed to form the conductive layer 131. In this case, the conductive layer 131 is formed so as to have a region overlapping with the conductive layer 132. Note that a planarization step may be performed after the formation of the second insulating layer.

With this structure, the installation area of the conductive layer 132 can be increased, so that a touch sensor with higher definition can be formed. Note that in the region where the conductive layer 131 and the conductive layer 132 overlap with each other, the sensitivity of the touch sensor is reduced in some cases; therefore, the region where the conductive layer 131 and the conductive layer 132 do not overlap with each other is preferably higher than or equal to 500%, further preferably higher than or equal to 80%.

FIG. 19A to FIG. 19E and FIG. 20A to FIG. 20H are schematic views illustrating positional relation of the pixels (subpixels) and the conductive layer 131, seen from the display surface side.

Figure 19A:
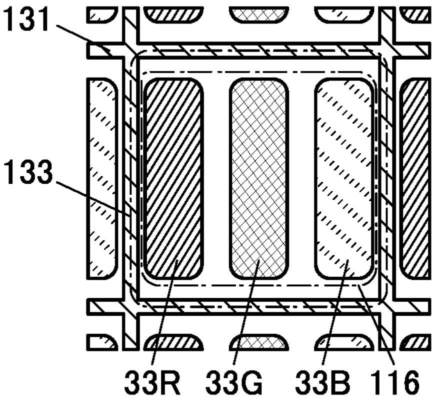
FIG. 19A to FIG. 19E are diagrams illustrating structure examples of a pixel and a conductive layer.

FIG. 19A illustrates an example in which the pixel 116 includes three subpixels: a subpixel 33R, a subpixel 33G, and a subpixel 33B. For example, the subpixel 33R, the subpixel 33G, and the subpixel 33B have a function of expressing red color, a function of expressing green color, and a function of expressing blue color, respectively. Note that the number of subpixels and the colors of the subpixels included in the pixel 116 are not limited thereto.

The plurality of subpixels included in the pixel 116 each have a display element. Typical examples of the display element include light-emitting elements such as organic EL elements; liquid crystal elements; display elements (also referred to as electronic ink) that perform display by an electrophoretic method, an electronic liquid powder (registered trademark) method, or the like; MEMS shutter display elements; and optical interference type MEMS display elements. The subpixel may include a transistor, a capacitor, a wiring that electrically connects the transistor and the capacitor, and the like in addition to the display element. Furthermore, one of the subpixels may be provided with a light-receiving element (e.g., a light-receiving element with an organic photodiode) so that the light-receiving element receives light emitted from the other subpixels, whereby the display apparatus can have additional functions such as an image-capturing function or a sensing function.

Furthermore, a transmissive liquid crystal display, a transflective liquid crystal display, a reflective liquid crystal display, a direct-view liquid crystal display, or the like can be applied to the display apparatus of one embodiment of the present invention. Note that for achieving a transflective liquid crystal display or a reflective liquid crystal display, some or all of pixel electrodes function as reflective electrodes. For example, some or all of pixel electrodes contain aluminum, silver, or the like. Moreover, in such a case, a memory circuit such as an SRAM can be provided under the reflective electrodes. Thus, the power consumption can be further reduced. A structure suitable for employed display elements, which is selected from a variety of pixel circuits, can be used.

In the structure illustrated in FIG. 19A, one opening 133 included in the conductive layer 131 is provided to overlap with three subpixels, i.e., the subpixel 33R, the subpixel 33G, and the subpixel 33B. In this manner, the opening 133 in the conductive layer 131 is preferably provided to overlap with one pixel 116. In other words, the interval between the arranged pixels 116 is preferably aligned with the interval between lattices of the conductive layer 131. Such a structure allows the peripheral portions of the pixels 116 to have the same configurations (e.g., the structures of films in the pixels and in the periphery of the pixels, the thicknesses of the films, and the unevenness of surfaces thereof), leading to a reduction in display unevenness.

Figure 19B:
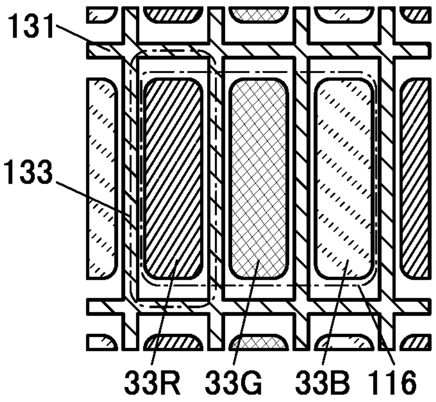
Figure 19C:
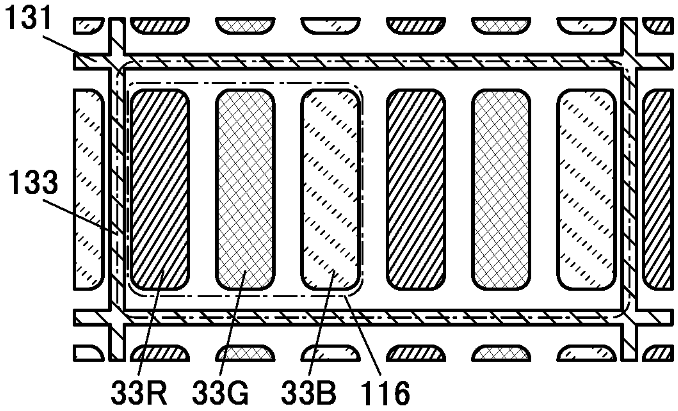

Note that two or more pixels 116 and one opening 133 may overlap with each other as illustrated in FIG. 19C, for example.

FIG. 19B illustrates an example in which one opening 133 and one subpixel overlap with each other. When the conductive layer 131 is provided between two subpixels in one pixel 116 in a plan view, the wiring resistance of the conductive layer 131 can be reduced. As a result, the receiving sensitivity of an antenna can be improved.

Figure 19D:
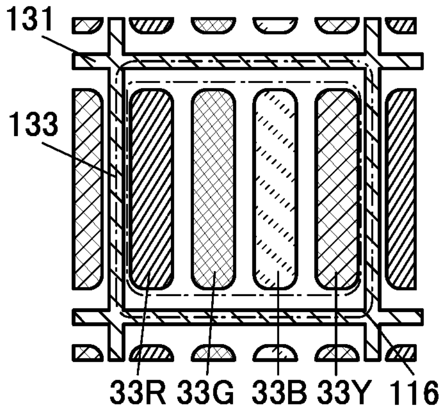

FIG. 19D illustrates an example in which the pixel 116 further includes a subpixel 33Y, as compared with the structure illustrated in FIG. 8A. For example, a pixel capable of expressing a yellow color can be used for the subpixel 33Y. Instead of the subpixel 33Y, a pixel capable of expressing a white color may be used. When the pixel 116 includes subpixels of more than three colors, power consumption can be reduced. Furthermore, a light-receiving element may be provided in the position of the subpixel 33Y.

Figure 19E:
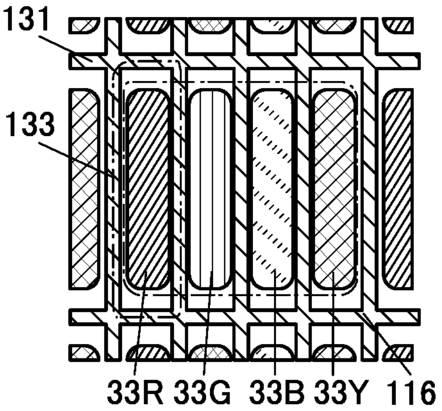

FIG. 19E illustrates an example in which one opening 133 and one subpixel overlap with each other. That is, FIG. 19E illustrates an example in which the conductive layer 131 is provided between two adjacent subpixels in a plan view. In the case where a light-receiving element is provided in the position of the subpixel 33Y, stray light entering the light-receiving element can be reduced with this structure. Note that a structure in which two of the four subpixels overlap with one opening 133 may be employed.

Figure 20A:
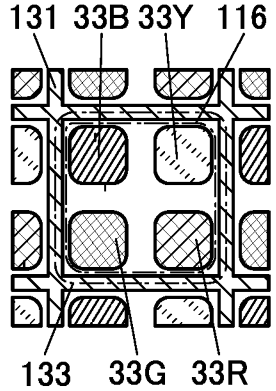
FIG. 20A to FIG. 20H are diagrams illustrating structure examples of a pixel and a conductive layer.
Figure 20B:
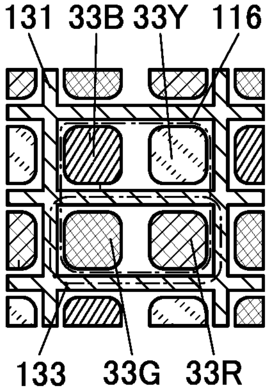
Figure 20C:
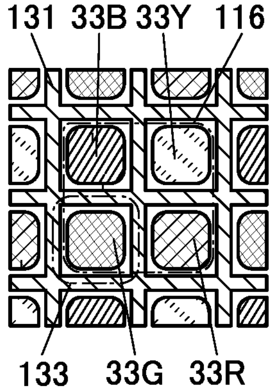

In the examples illustrated in FIG. 19A to FIG. 19E, subpixels are arranged in a stripe pattern; however, subpixels of two colors may be alternated in one direction as illustrated in FIG. 20A to FIG. 20C, for example. FIG. 20A illustrates a structure in which the pixel 116 including four subpixels and one opening 133 overlap with each other. FIG. 20B illustrates a structure in which two adjacent subpixels and one opening 133 overlap with each other. FIG. 20C illustrates a structure in which one subpixel and one opening 133 overlap with each other.

Furthermore, the subpixels included in the pixel 116 may differ in size (e.g., the area of a region contributing to display). For example, the size of the subpixel of a blue color with a relatively low luminosity factor can be set large, whereas the size of the subpixel of a green or red color with a relatively high luminosity factor can be set small.

Figure 20D:
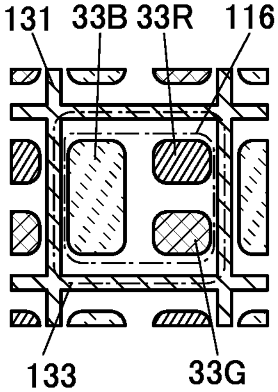
Figure 20E:
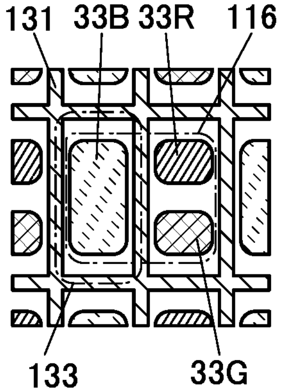

FIG. 20D and FIG. 20E each illustrate an example in which the size of the subpixel 33B is larger than the size of the subpixel 33R and the size of the subpixel 33G. In the examples illustrated here, the subpixel 33R and the subpixel 33G are alternated; however, the three subpixels may be arranged in a stripe pattern as illustrated in FIG. 19A and the like, and may have different sizes from each other.

FIG. 20D illustrates a structure in which the pixel 116 including three subpixels and one opening 133 overlap with each other. FIG. 20E illustrates a structure in which one opening 113 and one subpixel 33B overlap with each other and another opening 133 and two subpixels (the subpixel 33R and the subpixel 33G) overlap with each other.

Figure 20F:
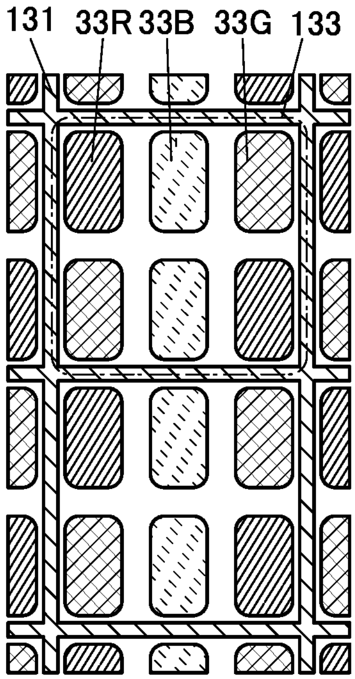
Figure 20G:
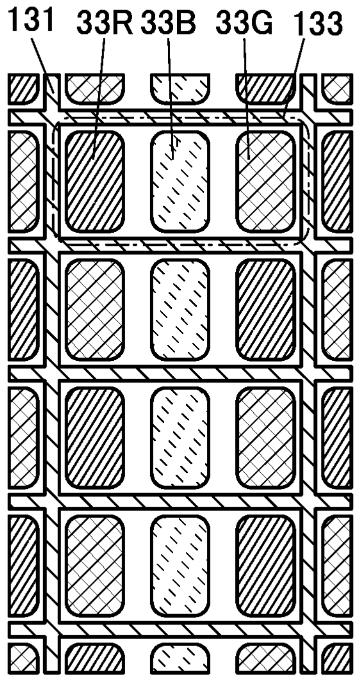
Figure 20H:
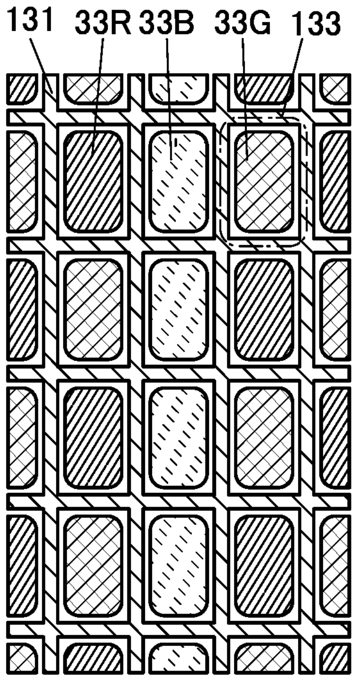

Alternatively, pixel structures as those illustrated in FIG. 20F to FIG. 20H can be employed. Here, the subpixels 33B are arranged in a stripe pattern, and columns in which subpixels 33R and subpixels 33G are alternated are provided on the both sides of a column of the subpixels 33B. Furthermore, one subpixel 33R and one subpixel 33G are provided on each of sides of one subpixel 33B. Although the subpixels have stripe patterns in the structures illustrated in FIG. 20F to FIG. 20H, one embodiment of the present invention is not limited to these examples. For example, in the display apparatus of one embodiment of the present invention, application of pentile subpixels is also possible.

In the structure illustrated in FIG. 20F, six subpixels (two subpixels for each color) overlap with one opening 133. In the structure illustrated in FIG. 20G, three subpixels (one subpixel for each color) overlap with one opening 133. In the structure illustrated in FIG. 20H, one subpixel and one opening 133 overlap with each other. Note that the pixel structure is not limited to the structures described here, and a structure in which two or more adjacent subpixels and one opening 133 overlap with each other may be employed.

The structures, configurations, methods, and the like described in this embodiment can be used in combination as appropriate with the structures, configurations, methods, and the like described in the other embodiments.

Embodiment 2

In this embodiment, structure examples of electronic devices including the display apparatus 100 described in the above embodiment will be described with reference to FIG. 21 and FIG. 22. Although a smartphone is described as an example of electronic devices in this embodiment, the electronic devices may be other electronic devices such as a portable game terminal, a tablet PC (Personal Computer), and a laptop PC. In addition, the electronic device of this embodiment can be used as other electronic devices that can perform wireless communication.

Figure 21A:
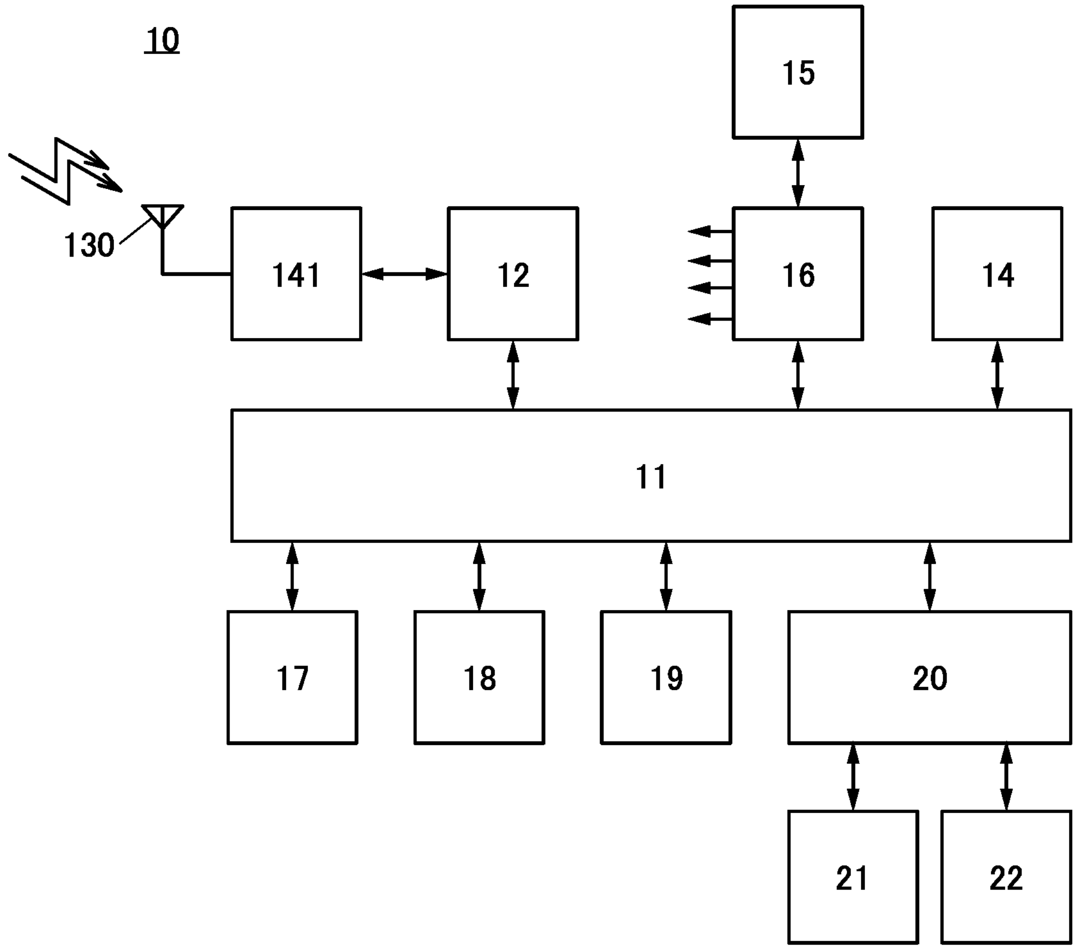
FIG. 21A and FIG. 21B are diagrams illustrating a structure example of an electronic device.

An electronic device 10 illustrated in a block diagram in FIG. 21A includes the antenna 130, an application processor 11, the baseband processor 12, the integrated circuit 141 (IC), a memory 14, a battery 15, a power management IC (PMIC) 16, a display portion 17, a camera portion 18, an operation input portion 19, an audio IC 20, a microphone 21, and a speaker 22. Note that the integrated circuit 141 is also referred to as an RF (Radio Frequency) IC or a wireless chip, for example.

The antenna 130 is provided in accordance with a frequency band compatible with a communication standard of 5G. As described in Embodiment 1, a plurality of antennas for a plurality of frequency bands can be placed, since it is possible to place the antennas to overlap with the display portion of the display apparatus.

The application processor 11 has a function of performing processing for fulfilling various functions of the electronic device 10 by reading out a program stored in the memory 14. For example, the application processor 11 has a function of executing an OS (Operating System) program from the memory 14 and executing an application program with this OS program as an operating platform.

The baseband processor 12 has a function of performing baseband processing including encoding (e.g., error correction encoding) processing, decoding processing, or the like on data that is transmitted and received by the electronic device 10. Specifically, the baseband processor 12 has a function of receiving transmission data from the application processor 11, performing encoding processing on the received transmission data, and transmitting the data to the integrated circuit 141. In addition, the baseband processor 12 has a function of receiving reception data from the integrated circuit 141, performing decoding processing on the received reception data, and transmitting the data to the application processor 11.

The integrated circuit 141 has a function of performing modulation processing or demodulation processing on data that is transmitted and received by the electronic device 10. Specifically, the integrated circuit 141 has a function of generating a transmission signal by performing modulation processing using a carrier wave on the transmission data received from the baseband processor 12 and outputting the transmission signal via the antenna 130. In addition, the integrated circuit 141 has a function of receiving a reception signal via the antenna 130, generating reception data by performing demodulation processing using a carrier wave on the reception signal, and transmitting the reception data to the baseband processor 12.

The memory 14 has a function of storing a program and data used by the application processor 11. Note that the memory 14 includes a nonvolatile memory that holds stored data even when power supply is interrupted and a volatile memory in which stored data is cleared in the case where power supply is interrupted.

The battery 15 is used when the electronic device 10 operates without an external power supply. Note that the electronic device 10 can use the battery 15 as the power supply also in the case where an external power supply is connected. A secondary battery capable of charging and discharging is preferably used as the battery 15.

The power management IC 16 has a function of generating internal power supply from the battery 15 or the external power supply. The internal power supply is applied to each of the blocks in the electronic device 10. At this time, the power management IC 16 has a function of controlling voltage of the internal power supply for each block to which the internal power supply is supplied. The power management IC 16 controls voltage of the internal power supply on the basis of an instruction from the application processor 11. In addition, the power management IC 16 can control supply and interrupt of the internal power supply on a block-by-block basis. The power management IC 16 also has a function of controlling charging to the battery 15 in the case where supply from the external power supply is obtained.

The display portion 17 is a liquid crystal display apparatus or a light-emitting display apparatus and has a function of displaying various images in response to processing in the application processor 11. Images to be displayed on the display portion 17 include a user interface image with which a user gives an operation instruction to the electronic device 10, a camera image, a moving image, and the like.

The camera portion 18 has a function of acquiring an image in accordance with the instruction from the application processor 11. The operation input portion 19 has a function of a user interface for a user to operate and give an operation instruction to the electronic device 10. The audio IC 20 has a function of driving the speaker 22 by decoding audio data transmitted from the application processor 11. In addition, the audio IC 20 has a function of generating audio data by encoding audio information obtained by the microphone 21 and outputting the audio data to the application processor 11.

Figure 21B:
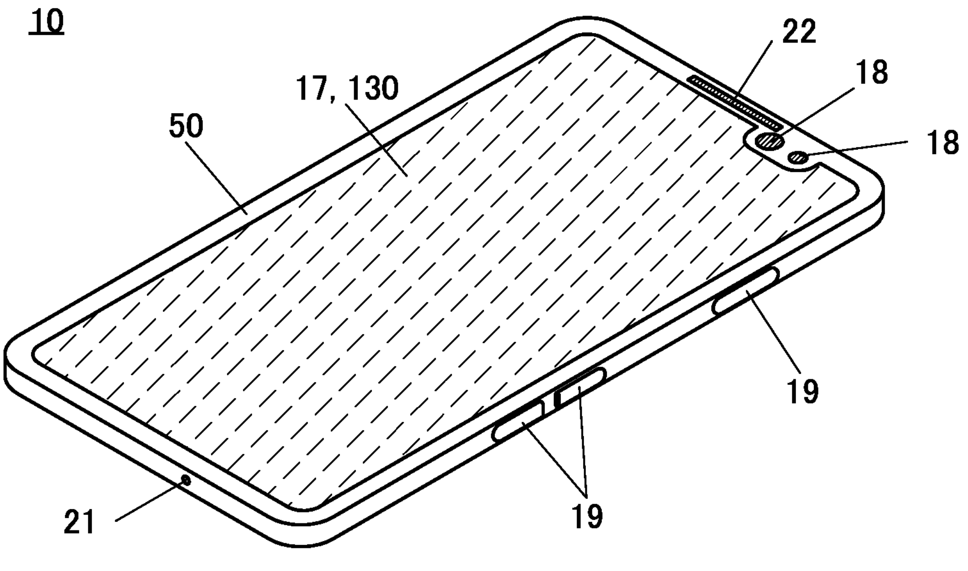

FIG. 21B is a perspective view of the electronic device 10 having the structures illustrated in FIG. 21A. FIG. 21B also illustrates some of the structures (the antenna 130, the display portion 17, the camera portion 18, the operation input portion 19, the microphone 21, and the speaker 22) illustrated in FIG. 21A.

The antenna 130 is provided to overlap with the display portion 17 stored in a housing 50. A structure where the conductive layers functioning as antennas are placed over the display portion enable extension of communication distances and downsizing of integrated circuits.

Figure 22:
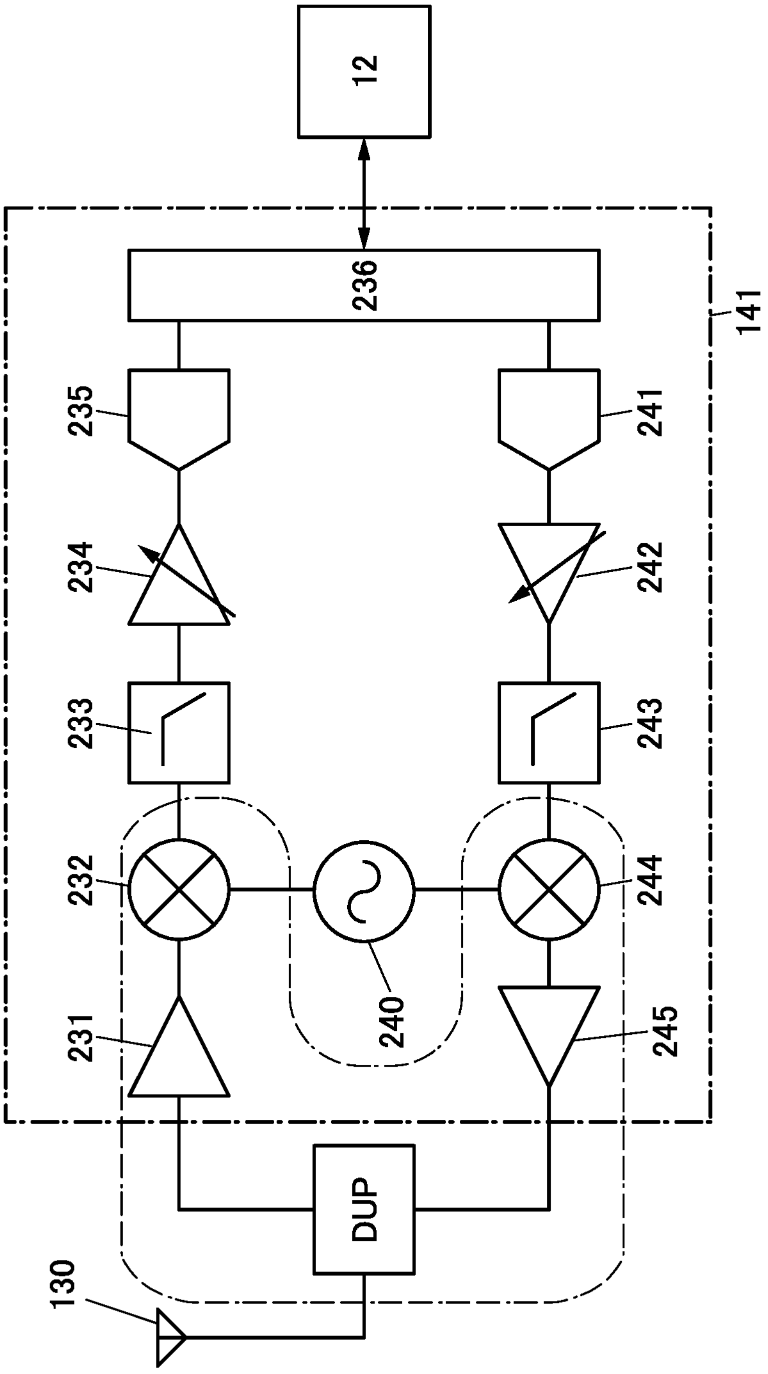
FIG. 22 is a diagram illustrating a structure example of an integrated circuit.

FIG. 22 is a block diagram for illustrating a structure example of the integrated circuit 141. The integrated circuit 141 illustrated in FIG. 22 includes a low noise amplifier 231, a mixer 232, a low-pass filter 233, a variable gain amplifier 234, an analog-digital converter circuit 235, an interface portion 236, a digital-analog converter circuit 241, a variable gain amplifier 242, a low-pass filter 243, a mixer 244, a power amplifier 245, and an oscillation circuit 240. FIG. 22 also illustrates the antenna 130, a duplexer DUP, and the baseband processor 12. Note that the low noise amplifier 231, the mixer 232, the low-pass filter 233, the variable gain amplifier 234, and the analog-digital converter circuit 235 are referred to as a receiving circuit block, and the digital-analog converter circuit 241, the variable gain amplifier 242, the low-pass filter 243, the mixer 244, and the power amplifier 245 are referred to as a transmitting circuit block in some cases.

Note that the baseband processor 12 and the integrated circuit 141 are formed of separate semiconductor chips.

A circuit enclosed by a dashed-dotted line in FIG. 22 (any one of the duplexer DUP, the low noise amplifier 231 which is an amplifier, the mixer 232, the mixer 244, and the power amplifier 245 which is an amplifier) can be manufactured using a transistor overlapping with a conductive layer provided in a substrate. For this reason, some of the circuits included in the integrated circuit 141 which is a semiconductor chip can be provided on the display portion side, which enables the integrated circuit to be downsized.

The low noise amplifier 231 amplifies a signal received by the antenna 130 with low noise. The mixer 232 performs demodulation and downconversion (frequency conversion) using a signal of the oscillation circuit 240. The low-pass filter 233 removes an unnecessary high-frequency component from a signal from the mixer 232. The variable gain amplifier 234 amplifies an output signal from the low-pass filter 233 with a gain taking the input range of the analog-digital converter circuit 235 into account. The analog-digital converter circuit 235 converts the analog signal from the variable gain amplifier 234 into a digital signal. The digital signal is output to the baseband processor 12 via the interface portion 236 and a differential interface circuit.

The digital-analog converter circuit 241 converts the digital signal received by the interface portion 236 into an analog signal. The variable gain amplifier 242 amplifies an output signal from the digital-analog converter circuit 241. The low-pass filter 243 removes an unnecessary high-frequency component from a signal from the variable gain amplifier 242. The mixer 244 performs modulation and upconversion (frequency conversion) of the analog signal using a signal of the oscillation circuit 240. The power amplifier 245 amplifies an output signal from the mixer 244 with a predetermined gain and outputs the signal.

The structures, configurations, methods, and the like described in this embodiment can be used in combination as appropriate with the structures, configurations, methods, and the like described in the other embodiments.

Embodiment 3

In this embodiment, a structure example of a light-emitting apparatus and a display apparatus that can be used for the display apparatus of one embodiment of the present invention will be described.

One embodiment of the present invention is a display apparatus including a light-emitting device. The display apparatus can include a light-receiving device. For example, three kinds of light-emitting devices emitting red (R), green (G), and blue (B) light are included, whereby a full-color display apparatus can be achieved.

In one embodiment of the present invention, fine patterning of EL layers and an EL layer and an active layer (an organic layer included in the light-receiving device) is performed by a photolithography method without a shadow mask such as a metal mask. With the patterning, a high-resolution display apparatus with a high aperture ratio, which had been difficult to achieve, can be manufactured. Moreover, EL layers can be formed separately, enabling the display apparatus to perform extremely clear display with high contrast and high display quality.

It is difficult to set the distance between EL layers for different colors or between an EL layer and an active layer to be less than 10 μm, for example with a formation method using a metal mask; however, with use of the above method, the distance can be decreased to be less than or equal to 3 μm, less than or equal to 2 μm, or less than or equal to 1 μm. For example, with use of an exposure apparatus for LSI, the distance can be decreased to be less than or equal to 500 nm, less than or equal to 200 nm, less than or equal to 100 nm, or less than or equal to 50 nm. This can significantly reduce the area of a non-light-emitting region that may exist between two light-emitting devices or between a light-emitting device and a light-receiving device, so that the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, patterns of the EL layer and the active layer themselves can be made much smaller than those in the case of using a metal mask. For example, in the case of using a metal mask for forming EL layers separately, variation in the thickness occurs between the center and the edge of the pattern; hence, an effective area that can be used as a light-emitting region with respect to the entire pattern area decreases. In contrast, in the above forming method, a pattern is formed by processing a film deposited to have a uniform thickness, which enables a uniform thickness in the pattern; hence, even in a fine pattern, almost the whole area can be used as a light-emitting region. Therefore, the above forming method makes it possible to achieve both a high resolution and a high aperture ratio.

In many cases, an organic film formed using a fine metal mask (FMM) has an extremely small taper angle (e.g., a taper angle of greater than 0° and less than 30°) so that the thickness of the film becomes smaller in a portion closer to an end portion. Therefore, it is difficult to clearly observe a side surface of an organic film formed using an FMM because the side surface and a top surface are continuously connected. In contrast, an EL layer included in one embodiment of the present invention is processed without using an FMM, and has a clear side surface. In particular, part of the taper angle of the EL layer included in one embodiment of the present invention is preferably greater than or equal to 30° and less than 90°, preferably greater than or equal to 60° and less than 90°.

Note that in this specification and the like, an end portion of an object having a tapered shape indicates that the end portion of the object has a cross-sectional shape in which the angle between a side surface (surface) and a bottom surface (surface on which an object is formed) of the object is greater than 0° and less than 900 in a region of the end portion, and the thickness continuously increases from the end portion. A taper angle refers to an angle between a bottom surface (surface on which an object is formed) and a side surface (surface) at an end portion of the object.

Hereinafter, a more specific example will be described.

Figure 23A:
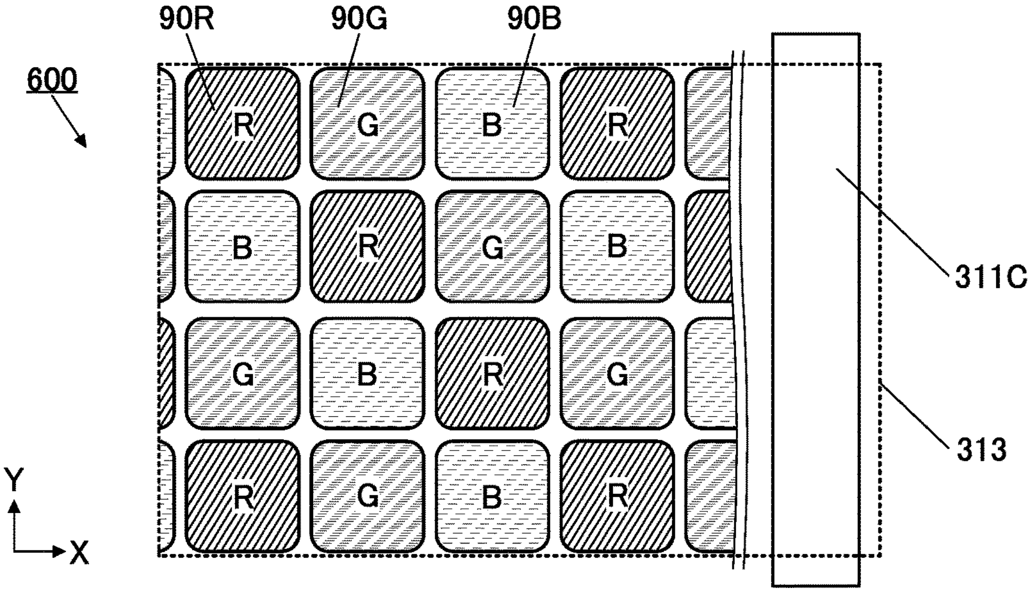
FIG. 23A to FIG. 23C are diagrams illustrating structure examples of display apparatuses.
Figure 23B:
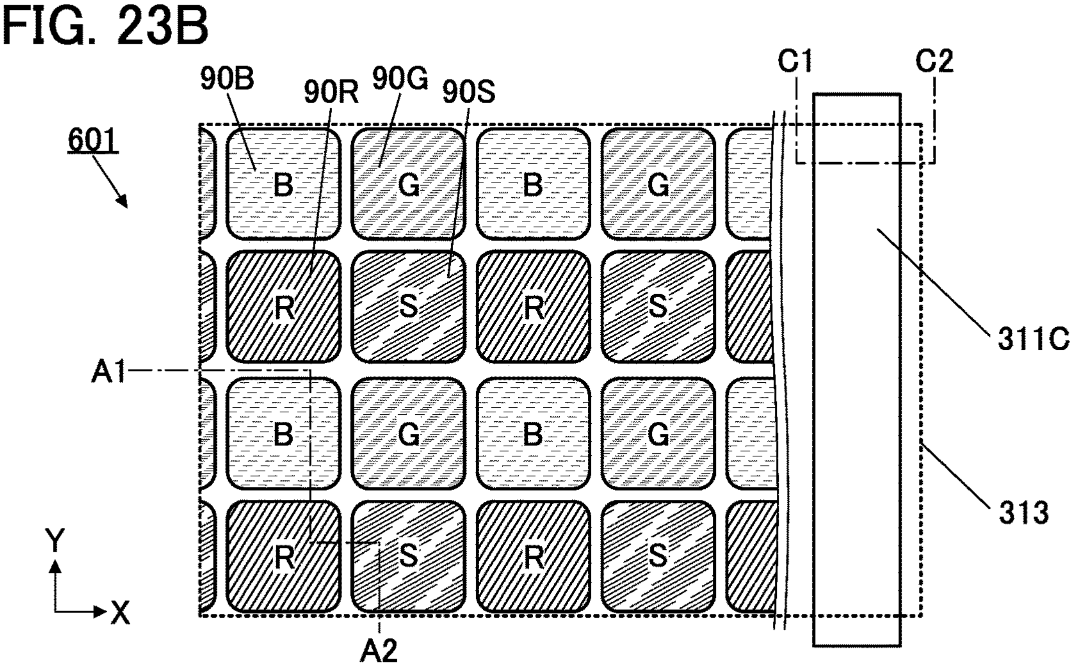

FIG. 23A is a schematic top view of a display apparatus 600. The display apparatus 600 includes a plurality of light-emitting devices 90R emitting red light, a plurality of light-emitting devices 90G emitting green light, and a plurality of light-emitting devices 90B emitting blue light. FIG. 23B illustrates a schematic top view of the display apparatus 101. A display apparatus 601 includes the plurality of light-emitting devices 90R emitting red light, the plurality of light-emitting devices 90G emitting green light, the plurality of light-emitting devices 90B emitting blue light, and a plurality of light-receiving devices 90S. In FIG. 23A and FIG. 23B, regions of the light-emitting devices and the light-receiving devices are denoted by R, G, B, and S to easily differentiate the light-emitting devices and the light-receiving devices.

The light-emitting devices 90R, the light-emitting devices 90G, the light-emitting devices 90B, and the light-receiving devices 90S are arranged in a matrix. The arrangement method of the light-emitting devices is not limited thereto; another method such as a stripe, S stripe, delta, Bayer, zigzag, pentile, or diamond arrangement may also be used.

FIG. 23A and FIG. 23B also illustrates a connection electrode 311C that is electrically connected to a common electrode 313. The connection electrode 311C is supplied with a potential (e.g., an anode potential or a cathode potential) that is to be supplied to the common electrode 313. The connection electrode 311C is provided outside a display region where the light-emitting devices 90R and the like are arranged. In FIG. 23A and FIG. 23B, the common electrode 313 is denoted by a dashed line.

The connection electrode 311C can be provided along the outer periphery of the display region. For example, the connection electrode 311C may be provided along one side of the outer periphery of the display region or two or more sides of the outer periphery of the display region. That is, in the case where the display region has a rectangular top surface shape, a top surface of the connection electrode 311C can have a band shape, an L shape, a square bracket shape, a quadrangular shape, or the like.

Note that the display apparatus 601 including the light-emitting device and the light-receiving device is mainly described below; however, the description of the light-emitting device is the same as that of the display apparatus 600.

Figure 23C:
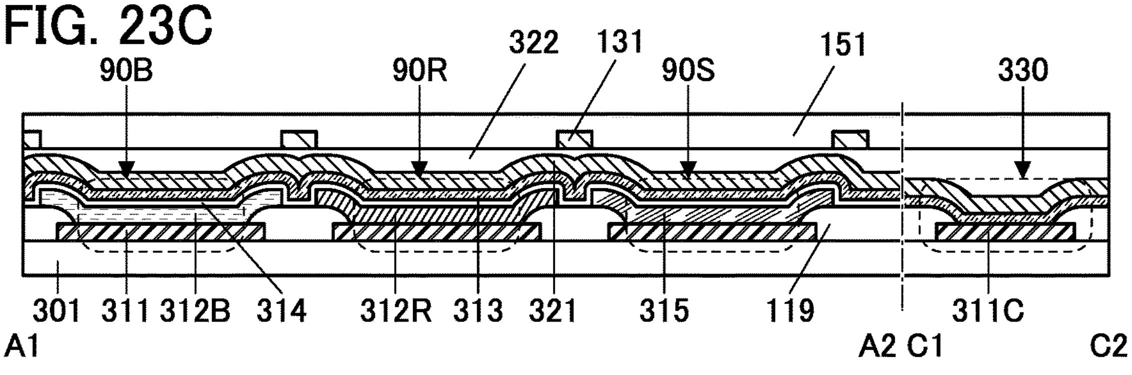

FIG. 23C is a schematic cross-sectional view taken along a dashed-dotted line A1-A2 and a dashed-dotted line C1-C2 in FIG. 23B. FIG. 23C illustrates a schematic cross-sectional view of the light-emitting device 90B, the light-emitting device 90R, and the light-receiving device 90S provided over an insulating layer 301, and the connection electrode 311C.

Note that the light-emitting device 90G that is not illustrated in the schematic cross-sectional view can have a structure similar to that of the light-emitting device 90B or the light-emitting device 90R; hereinafter, the description of the light-emitting device 90B or the light-emitting device 90R can be referred to for the description of the light-emitting device 90G.

The light-emitting device 90B includes a pixel electrode 311, an organic layer 312B, an organic layer 314, and the common electrode 313. The light-emitting device 90R includes the pixel electrode 311, an organic layer 312R, the organic layer 314, and the common electrode 313. The light-receiving device 90S includes the pixel electrode 311, an organic layer 315, the organic layer 314, and the common electrode 313. The organic layer 314 and the common electrode 313 are shared by the light-emitting device 90B, the light-emitting device 90R, and the light-receiving device 90S. The organic layer 314 can also be referred to as a common layer. The pixel electrodes 311 are provided to be apart from each other between the light-emitting devices and between the light-emitting device and the light-receiving device.

The organic layer 312R contains at least a light-emitting organic compound that emits light with intensity in a red wavelength range. The organic layer 312B contains at least a light-emitting organic compound that emits light with intensity in a blue wavelength range. The organic layer 315 contains a photoelectric conversion material that has sensitivity in the visible light or infrared light wavelength range. The organic layer 312R and the organic layer 312B can each be called an EL layer.

The organic layer 312R, the organic layer 312B, and the organic layer 315 may each include one or more of an electron-injection layer, an electron-transport layer, a hole-injection layer, and a hole-transport layer. The organic layer 314 does not necessarily include the light-emitting layer. For example, the organic layer 314 includes one or more of an electron-injection layer, an electron-transport layer, a hole-injection layer, and a hole-transport layer.

Here, the uppermost layer in the stacked-layer structure of the organic layer 312R, the organic layer 312B, and the organic layer 315, i.e., the layer in contact with the organic layer 314 is preferably a layer other than the light-emitting layer. For example, a structure is preferable in which an electron-injection layer, an electron-transport layer, a hole-injection layer, a hole-transport layer, or a layer other than those covers the light-emitting layer so as to be in contact with the organic layer 314. When atop surface of the light-emitting layer is protected by another layer in manufacturing each light-emitting device, the reliability of the light-emitting device can be improved.

The pixel electrode 311 is provided for each element. The common electrode 313 and the organic layer 314 are provided as layers common to the light-emitting devices. A conductive film that transmits visible light is used for either the pixel electrodes or the common electrode 313, and a reflective conductive film is used for the other. When the pixel electrodes are light-transmitting electrodes and the common electrode 313 is a reflective electrode, a bottom-emission display apparatus can be obtained; in contrast, when the pixel electrodes are reflective electrodes and the common electrode 313 is a light-transmitting electrode, a top-emission display apparatus can be obtained. Note that when both the pixel electrodes and the common electrode 313 transmit light, a dual-emission display apparatus can be obtained.

The insulating layer 119 is provided to cover end portions of the pixel electrode 311. The end portions of the insulating layer 119 preferably have tapered shapes. Note that in this specification and the like, an end portion of an object having a tapered shape indicates that the end portion of the object has a cross-sectional shape in which the angle between a surface of the object and a surface on which the object is formed is greater than 0° and less than 90° in a region of the end portion, and the thickness continuously increases from the end portion.

When an organic resin is used for the insulating layer 119, a surface of the insulating layer 119 can be moderately curved. Thus, coverage with a film formed over the insulating layer 119 can be improved.

Examples of materials that can be used for the insulating layer 119 include an acrylic resin, a polyimide resin, an epoxy resin, a polyamide resin, a polyimide-amide resin, a siloxane resin, a benzocyclobutene-based resin, a phenol resin, and precursors of these resins.

Alternatively, an inorganic insulating material may be used for the insulating layer 119. Examples of inorganic insulating materials that can be used for the insulating layer 119 include oxides or nitride films such as silicon oxide, silicon oxynitride, silicon nitride oxide, silicon nitride, aluminum oxide, aluminum oxynitride, and hafnium oxide. Yttrium oxide, zirconium oxide, gallium oxide, tantalum oxide, magnesium oxide, lanthanum oxide, cerium oxide, neodymium oxide, or the like may be used.

As illustrated in FIG. 23C, there are gaps between two organic layers of light-emitting devices of different colors and between two organic layers of the light-emitting device and the light-receiving device. In this manner, the organic layer 312R, the organic layer 312B, and the organic layer 315 are preferably provided so as not to be in contact with each other. This suitably prevents unintentional light emission from being caused by current flowing through adjacent two organic layers. As a result, the contrast can be increased to achieve a display apparatus with high display quality.

The organic layer 312R, the organic layer 312B, and the organic layer 315 each preferably have a taper angle of greater than or equal to 30°. In an end portion of each of the organic layer 312R, an organic layer 312G, and the organic layer 312B, the angle between a side surface (surface) and a bottom surface (surface on which the layer is formed) is preferably greater than or equal to 300 and less than or equal to 120°, further preferably greater than or equal to 450 and less than or equal to 120°, still further preferably greater than or equal to 60° and less than or equal to 120°. Alternatively, the organic layer 312R, the organic layer 312G, and the organic layer 312B each preferably have a taper angle of 90° or a neighborhood thereof (greater than or equal to 800 and less than or equal to 100°, for example).

A protective layer 321 is provided over the common electrode 313. The protective layer 321 has a function of preventing diffusion of impurities such as water into each light-emitting device from the above.

The protective layer 321 can have, for example, a single-layer structure or a stacked-layer structure including at least an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the protective layer 321.

As the protective layer 321, a stacked film of an inorganic insulating film and an organic insulating film can be used. For example, a structure in which an organic insulating film is sandwiched between a pair of inorganic insulating films is preferable. Furthermore, it is preferable that the organic insulating film function as a planarization film. With this structure, a top surface of the organic insulating film can be flat, and accordingly, coverage with the inorganic insulating film over the organic insulating film is improved, leading to an improvement in barrier properties. Moreover, since a top surface of the protective layer 321 is flat, in the case where a component (e.g., an antenna, an electrode of a touch sensor, a color filter, or a lens array) is provided above the protective layer 321, the influence of an uneven shape due to a lower structure is preferably reduced.

FIG. 23C illustrates an example in which a planarization film 322 is provided over the protective layer 321, and the layer 151 that includes the conductive layer 131 functioning as an antenna is provided over the planarization film 322. The conductive layer 131 is formed in a position overlapping with the insulating layer 119 provided between the light-receiving devices.

In a connection portion 330, the common electrode 313 is provided on and in contact with the connection electrode 311C, and the protective layer 321 is provided to cover the common electrode 313. In addition, the insulating layer 119 is provided to cover end portions of the connection electrode 311C.

A structure example of a display apparatus that is partly different from that in FIG. 23C is described below. Specifically, an example in which the insulating layer 119 is not provided is described.

Figure 24A:
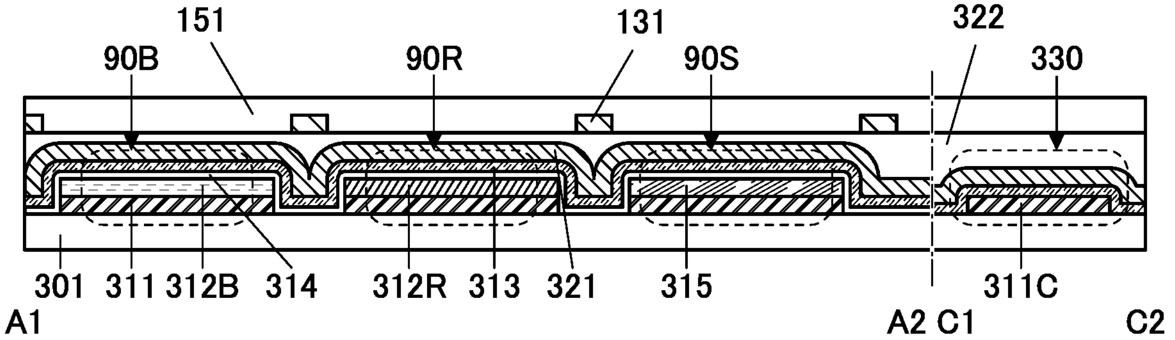
FIG. 24A to FIG. 24D are diagrams illustrating structure examples of a display apparatus.
Figure 24B:
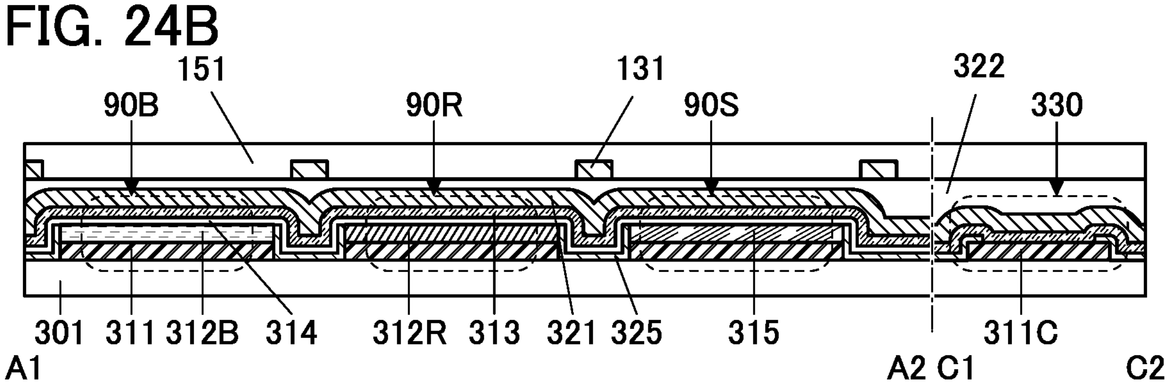
Figure 24C:
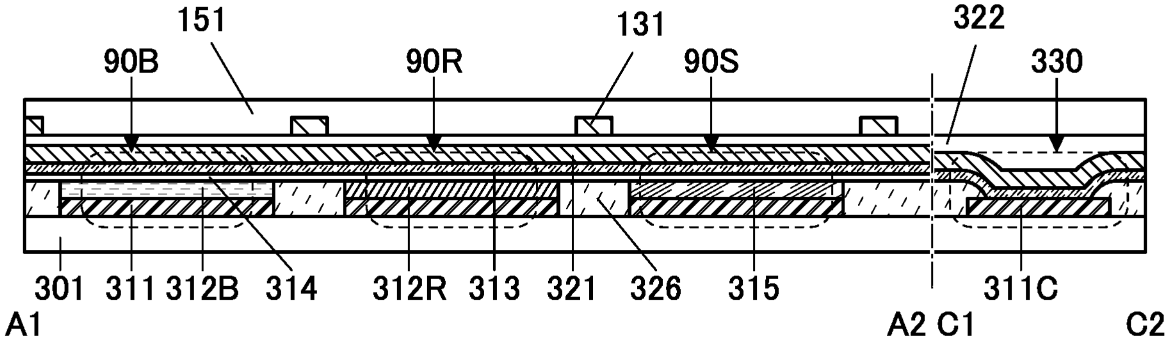

FIG. 24A to FIG. 24C illustrate examples of the case where a side surface of the pixel electrode 311 is substantially aligned with side surfaces of the organic layer 312R, the organic layer 312B, or the organic layer 315.

In FIG. 24A, the organic layer 314 is provided to cover top surfaces and side surfaces of the organic layer 312R, the organic layer 312B, and the organic layer 315. The organic layer 314 can prevent the pixel electrode 311 and the common electrode 313 from being in contact with each other and being electrically short-circuited.

FIG. 24B illustrates an example in which an insulating layer 325 is provided to be in contact with the side surfaces of the organic layer 312R, the organic layer 312B, and the organic layer 315 and side surfaces of the pixel electrode 311. The insulating layer 325 can inhibit the pixel electrode 311 and the common electrode 313 from being electrically short-circuited and effectively inhibit leakage current therebetween.

The insulating layer 325 can be an insulating layer containing an inorganic material. As the insulating layer 325, an inorganic insulating film such as an oxide insulating film, a nitride insulating film, an oxynitride insulating film, or a nitride oxide insulating film can be used, for example. The insulating layer 325 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when an inorganic insulating film such as an aluminum oxide film, a hafnium oxide film, or a silicon oxide film formed by an ALD method is used as the insulating layer 325, the insulating layer 325 can have a small number of pin holes and excel in a function of protecting the organic layer.

Note that in this specification and the like, oxynitride refers to a material that contains more oxygen than nitrogen in its composition, and nitride oxide refers to a material that contains more nitrogen than oxygen in its composition. For example, a silicon oxynitride refers to a material that contains oxygen at a higher proportion than nitrogen, and a silicon nitride oxide refers to a material that contains nitrogen at a higher proportion than oxygen.

The insulating layer 325 can be formed by a sputtering method, a CVD method, a PLD method, an ALD method, or the like. The insulating layer 325 is preferably formed by an ALD method achieving good coverage.

In FIG. 24C, resin layers 326 are provided between two adjacent light-emitting devices and between the light-emitting device and the light-receiving device so as to fill the space between two facing pixel electrodes and two facing organic layers. The resin layer 326 can planarize a surface on which the organic layer 314, the common electrode 313, and the like are formed, which prevents disconnection of the common electrode 313 due to poor coverage in a step between adjacent light-emitting devices.

As the resin layer 326, an insulating layer containing an organic material can be suitably used. For example, the resin layer 326 can be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. The resin layer 326 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. Moreover, the resin layer 326 can be formed using a photosensitive resin. A photoresist may be used as the photosensitive resin. The photosensitive resin can be a material of positive type or a material of negative type.

Furthermore, a material absorbing visible light is preferably used for the resin layer 326. When a material absorbing visible light is used for the resin layer 326, light emitted from the EL layer can be absorbed by the resin layer 326, whereby stray light from an adjacent pixel can be blocked and color mixture can be inhibited. Thus, a display apparatus with high display quality can be provided.

Figure 24D:
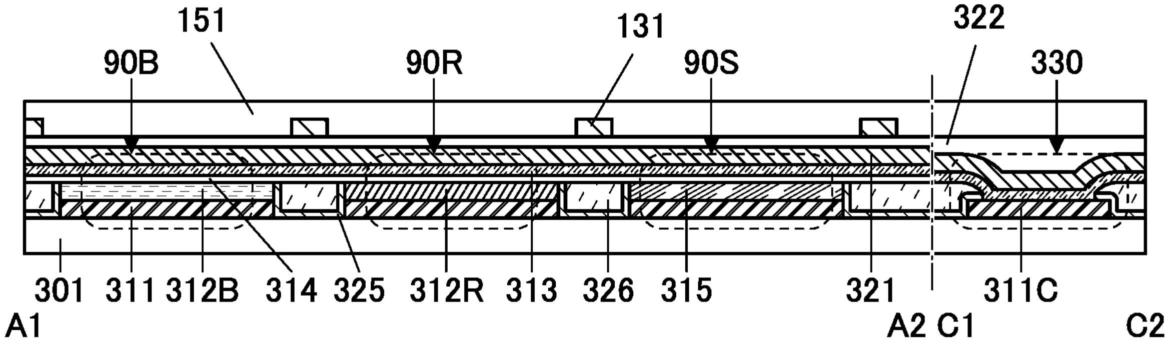

In FIG. 24D, the insulating layer 325 and the resin layer 326 over the insulating layer 325 are provided. Since the insulating layer 325 prevents the organic layer 312R or the like from being in contact with the resin layer 326, impurities such as moisture included in the resin layer 326 can be prevented from being diffused into the organic layer 312R or the like, whereby a highly reliable display apparatus can be provided.

A reflective film (e.g., a metal film containing one or more of silver, palladium, copper, titanium, aluminum, and the like) may be provided between the insulating layer 325 and the resin layer 326 so that light emitted from the light-emitting layer is reflected by the reflective film; hence, the display apparatus may be provided with a function of increasing the light extraction efficiency.

Figure 25A:
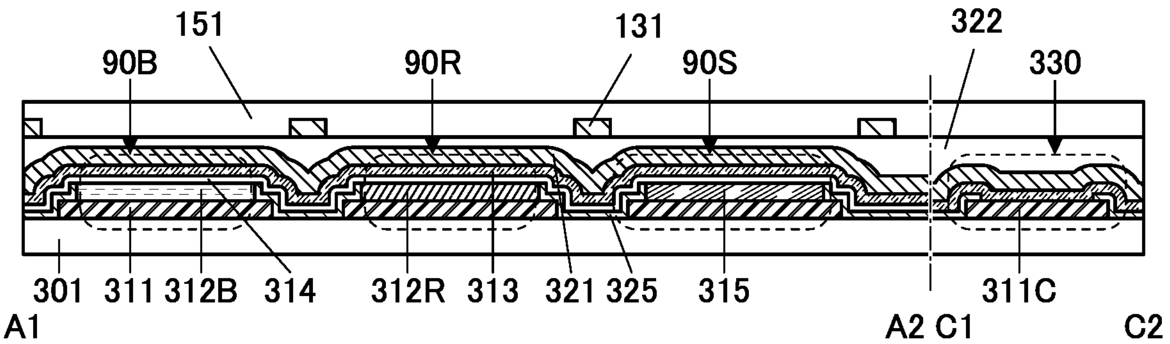
FIG. 25A to FIG. 25C are diagrams illustrating structure examples of a display apparatus.
Figure 25B:
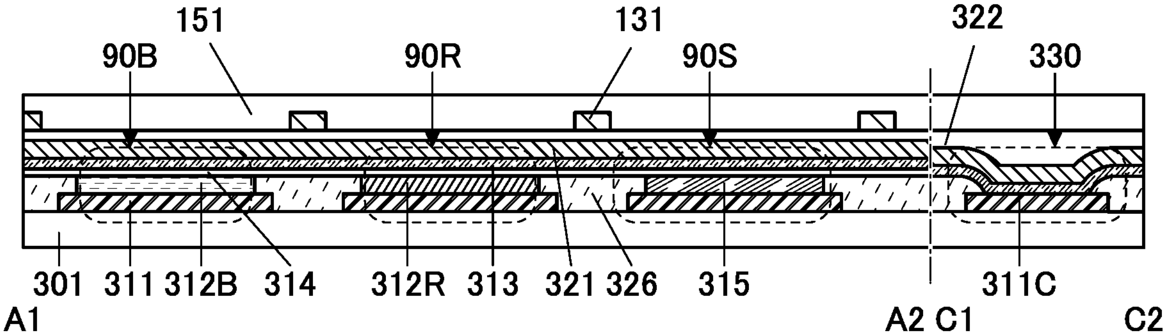
Figure 25C:
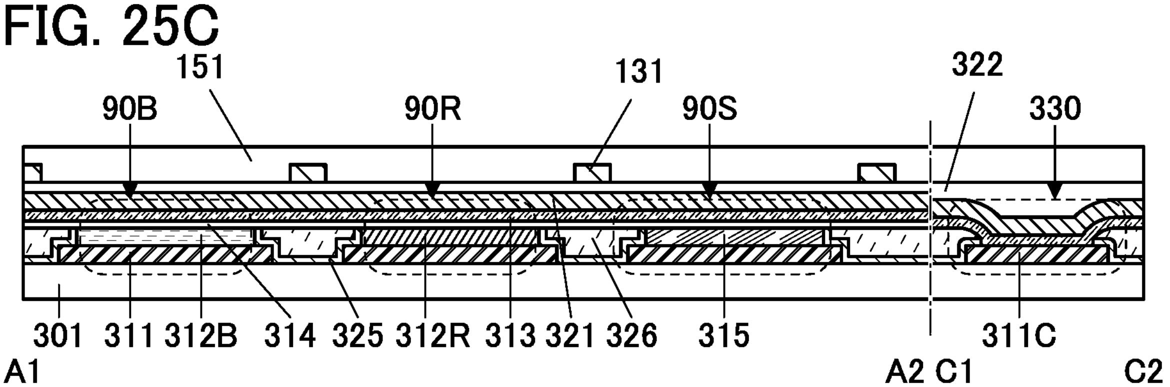

FIG. 25A to FIG. 25C illustrate examples in which the width of the pixel electrode 311 is larger than the width of the organic layer 312R, the organic layer 312B, or the organic layer 315. The organic layer 312R or the like is provided on the inner side than end portions of the pixel electrode 311.

FIG. 25A illustrates an example in which the insulating layer 325 is provided. The insulating layer 325 is provided to cover the side surfaces of the organic layers included in the light-emitting device and the light-receiving device and part of a top surface and the side surfaces of the pixel electrode 311.

FIG. 25B illustrates an example in which the resin layer 326 is provided. The resin layer 326 is positioned between two adjacent light-emitting devices or between the light-emitting device and the light-receiving device, and covers the side surfaces of the organic layers and the top and the side surfaces of the pixel electrode 311.

FIG. 25C illustrates an example in which both the insulating layer 325 and the resin layer 326 are provided. The insulating layer 325 is provided between the organic layer 312R or the like and the resin layer 326.

FIG. 26A to FIG. 26D illustrate examples in which the width of the pixel electrode 311 is smaller than the width of the organic layer 312R, the organic layer 312B, or the organic layer 315. The organic layer 312R or the like extends to an outer side beyond the end portions of the pixel electrode 311.

Figure 26A:
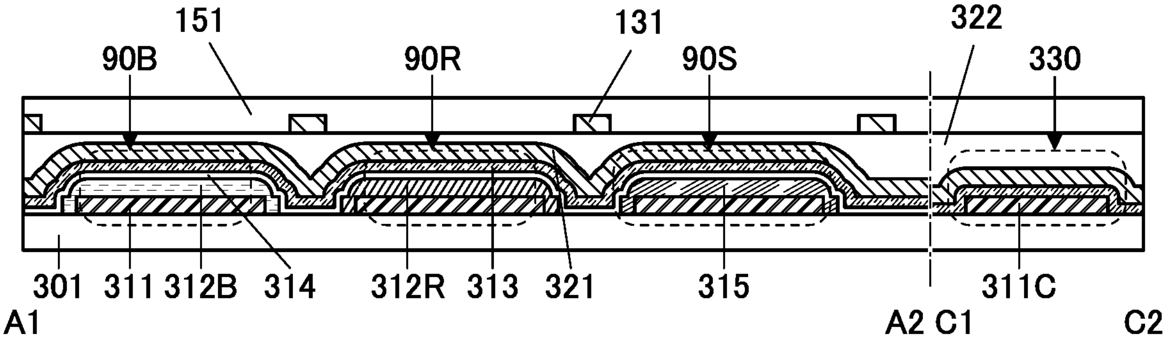
FIG. 26A to FIG. 26D are diagrams illustrating structure examples of a display apparatus.
Figure 26B:
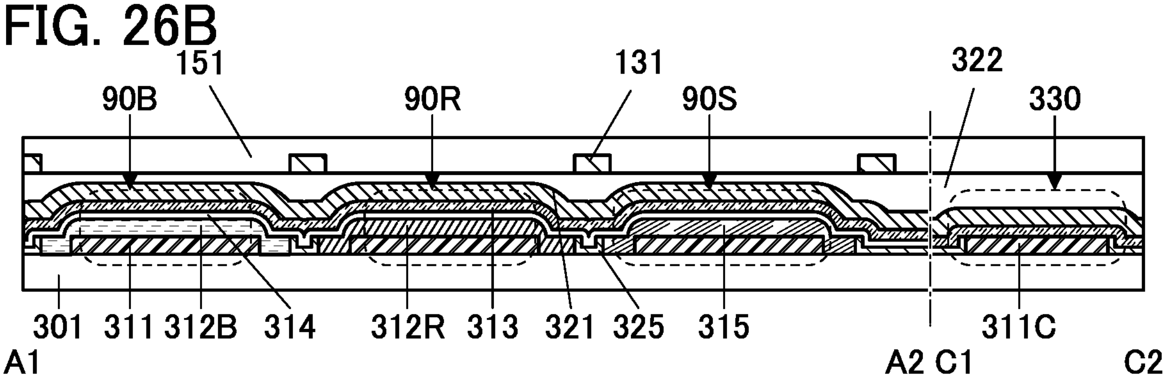

FIG. 26B illustrates an example in which the insulating layer 325 is provided. The insulating layer 325 is provided in contact with the side surfaces of the organic layers of two adjacent light-emitting devices. The insulating layer 325 may be provided to cover not only the side surface but also part of a top surface of the organic layer 312R or the like.

Figure 26C:
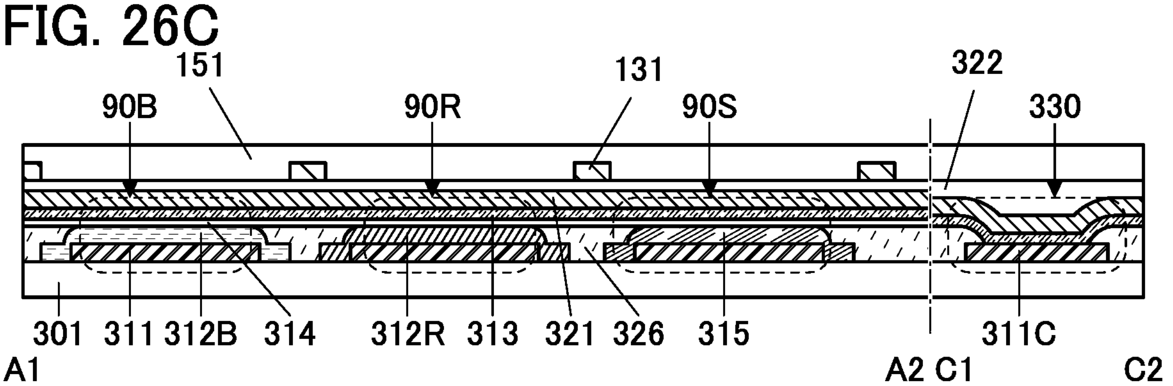

FIG. 26C illustrates an example in which the resin layer 326 is provided. The resin layer 326 is positioned between two adjacent light-emitting devices and covers the side surface and part of the top surface of the organic layer 312R or the like. The resin layer 326 may be formed to be in contact with the side surface of the organic layer 312R or the like and not to cover the top surface thereof.

Figure 26D:
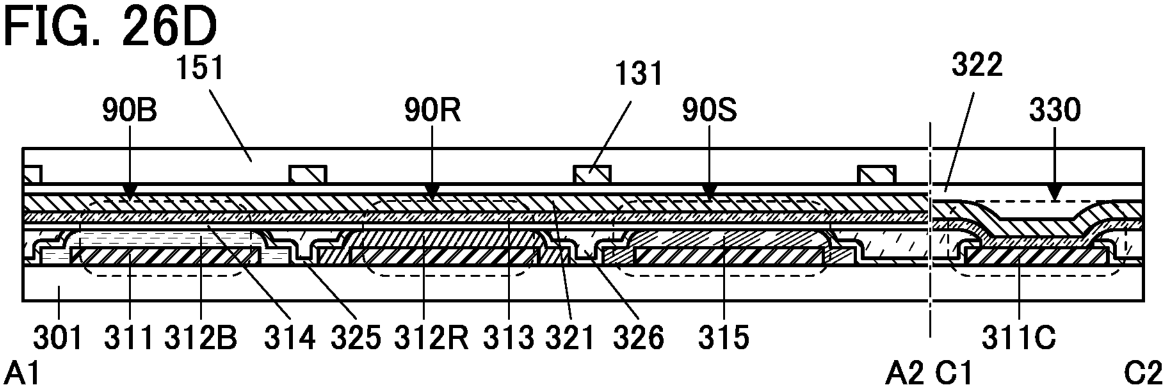

FIG. 26D illustrates an example in which both the insulating layer 325 and the resin layer 326 are provided. The insulating layer 325 is provided between the organic layer 312R or the like and the resin layer 326.

Here, a structure example of the resin layer 326 is described.

A top surface of the resin layer 326 is preferably as flat as possible; however, a surface of the resin layer 326 may have a depressed shape or projecting shape depending on an uneven shape of a surface on which the resin layer 326 is formed, the formation conditions of the resin layer 326, or the like.

FIG. 27A to FIG. 28F are each an enlarged view of an end portion of a pixel electrode 311R included in the light-emitting device 90R, an end portion of a pixel electrode 311G included in the light-emitting device 90G, and the vicinity thereof. The organic layer 312G is provided over the pixel electrode 311G.

Figure 27A:
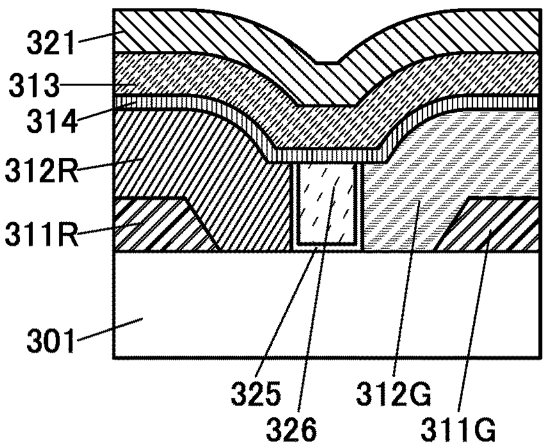
FIG. 27A to FIG. 27F are diagrams illustrating structure examples of a display apparatus.
Figure 27D:
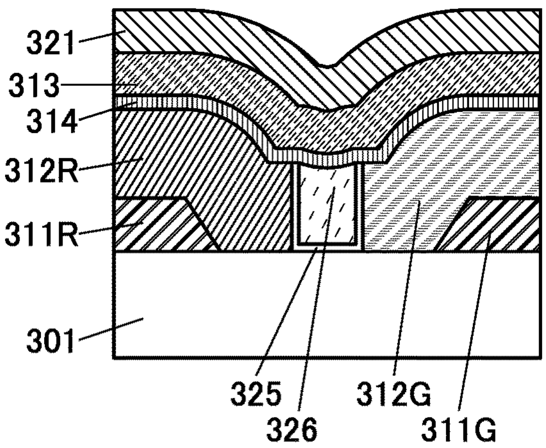
Figure 27B:
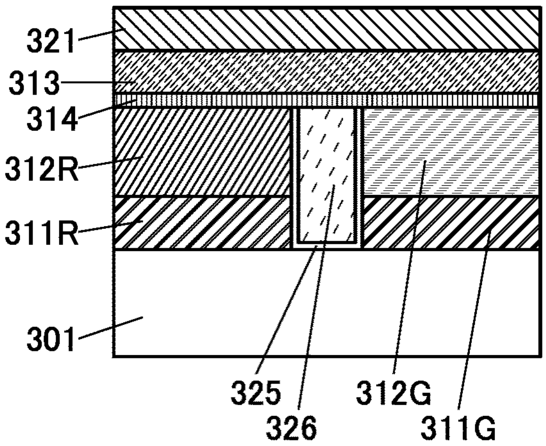
Figure 27E:
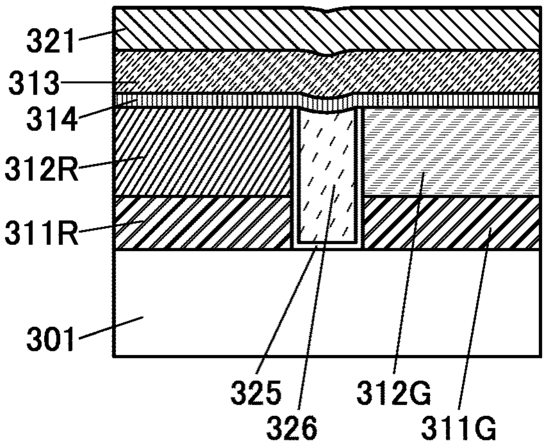
Figure 27C:
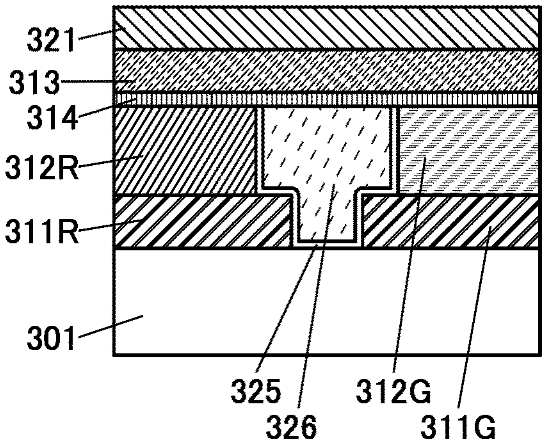

FIG. 27A, FIG. 27B, and FIG. 27C are each an enlarged view of the resin layer 326 having a flat top surface and the vicinity thereof. FIG. 27A illustrates an example of the case where the organic layer 312R or the like has a larger width than the pixel electrode 311. FIG. 27B illustrates an example of the case where the width of the organic layer 312R or the like and the pixel electrode 311 are substantially the same. FIG. 27C illustrates an example of the case where the organic layer 312R or the like has a smaller width than the pixel electrode 311.

The organic layer 312R is provided to cover the end portions of the pixel electrode 311R as illustrated in FIG. 27A, so that the end portion of the pixel electrode 311R preferably have a tapered shape. Accordingly, the step coverage with the organic layer 312R is improved and a highly reliable display apparatus can be provided. Note that the end portions of the pixel electrode 311R may each have a tapered shape even when the organic layer 312R does not cover end portions of the pixel electrode 311R as illustrated in FIG. 27C.

Figure 27F:
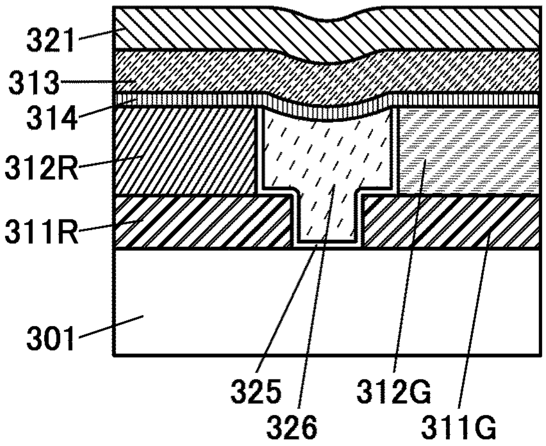

FIG. 27D, FIG. 27E, and FIG. 27F illustrate examples of the case where the top surface of the resin layer 326 is depressed. In this case, a depressed portion that reflects the depressed top surface of the resin layer 326 is formed on each of top surfaces of the organic layer 314, the common electrode 313, and the protective layer 321.

Figure 28A:
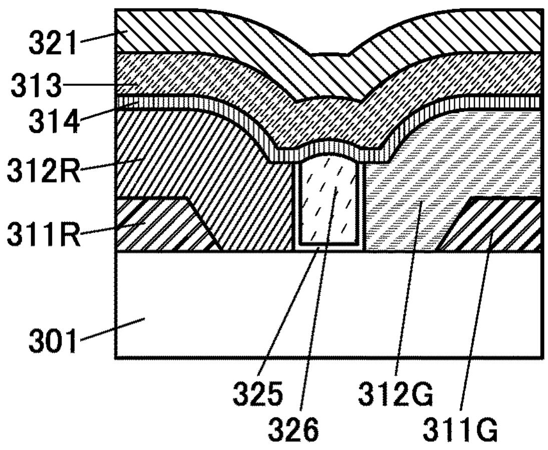
FIG. 28A to FIG. 28F are diagrams illustrating structure examples of a display apparatus.
Figure 28D:
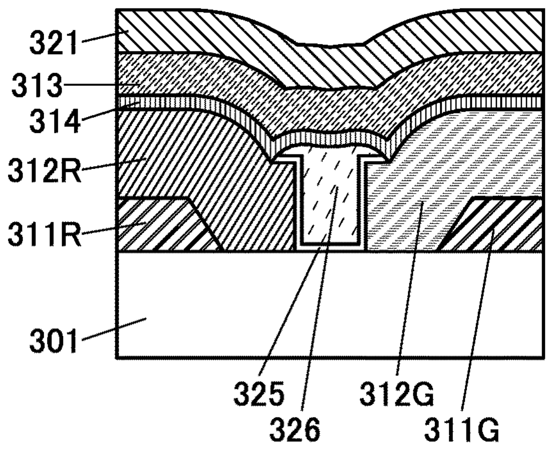
Figure 28B:
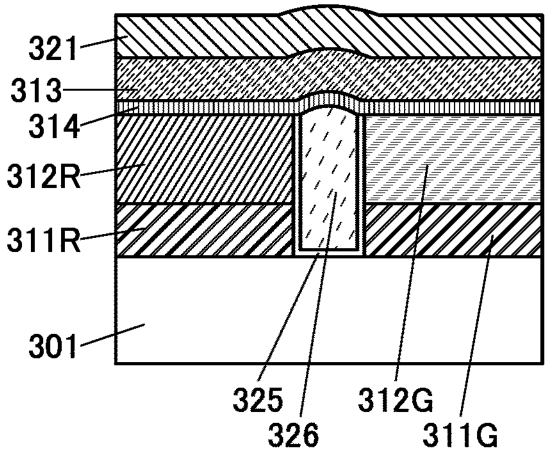
Figure 28E:
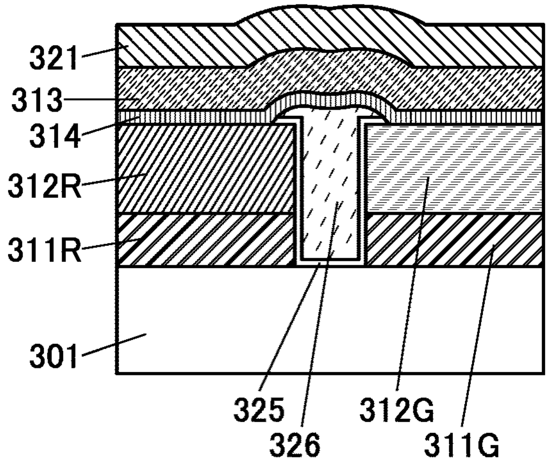
Figure 28C:
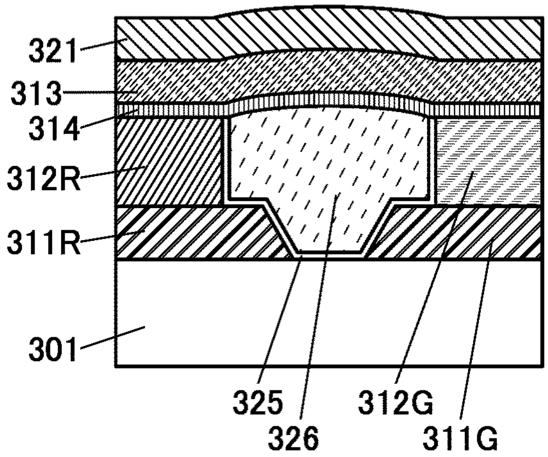

FIG. 28A, FIG. 28B, and FIG. 28C illustrate examples of the case where the top surface of the resin layer 326 is projecting. In this case, a projecting portion that reflects the projecting top surface of the resin layer 326 is formed on each of the top surfaces of the organic layer 314, the common electrode 313, and the protective layer 321.

Figure 28F:
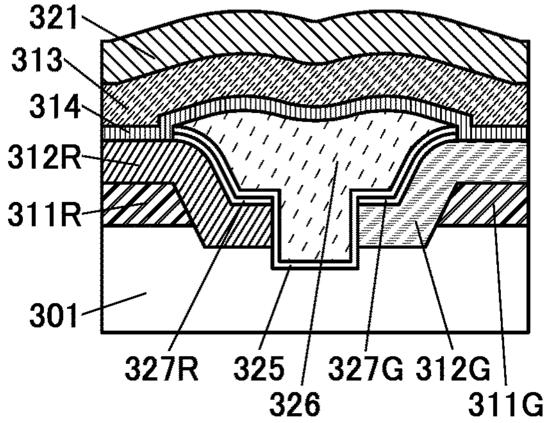

FIG. 28D, FIG. 28E, and FIG. 28F illustrate examples of the case where part of the resin layer 326 covers an upper end portion and part of the top surface of the organic layer 312R and an upper end portion and part of a top surface of the organic layer 312G. Here, the insulating layer 325 is provided between the resin layer 326 and the top surfaces of the organic layer 312R and the organic layer 312G.

FIG. 28D, FIG. 28E, and FIG. 28F illustrate examples of the case where the top surface of the resin layer 326 is partly depressed. In this case, unevenness that reflects the shape of the resin layer 326 is formed on each of the organic layer 314, the common electrode 313, and the protective layer 321.

As illustrated in FIG. 28F, the end portions of the pixel electrode 311R and the pixel electrode 311G each has a tapered shape. The organic layer 312G is formed to cover the end portion of the pixel electrode 311R, and the organic layer 312G is formed to cover the end portion of the pixel electrode 311G. The insulating layer 301 has a depressed portion between the pixel electrode 311R and the pixel electrode 311G. The depressed portion is formed when the pixel electrode 311R and the pixel electrode 311G are processed.

As illustrated in FIG. 28F, the insulating layer 325 is provided so as to cover end portions of the organic layer 312R and the organic layer 312G, and a sacrificial layer 327R is provided in a region between the organic layer 312R and the insulating layer 325. A sacrificial layer 327G is provided in a region between the organic layer 312G and the insulating layer 325. The sacrificial layer 327R and the sacrificial layer 327G function as masks (also referred to as hard masks) for processing the organic layer 312R and the organic layer 312G, respectively. The organic layer 312R and the organic layer 312G can be formed using an inorganic film, more specifically, an inorganic conductive film (typically, tungsten) or an inorganic insulating film (typically, silicon oxide, silicon nitride, or aluminum oxide).

As illustrated in FIG. 28F, a depressed portion is formed in the insulating layer 301 positioned in a region between the organic layer 312R and the organic layer 312G. The depressed portion is formed when the organic layer 312R and the organic layer 312G are processed.

As illustrated in FIG. 28F, the organic layer 314 is formed to cover the organic layer 312G, the organic layer 312G, the sacrificial layer 327R, the sacrificial layer 327G, the insulating layer 325, and the resin layer 326, and the common electrode 313 and the protective layer 321 are provided over the organic layer 314.

As illustrated in FIG. 28F, in a cross-sectional view, when at least part of end portions of the resin layer 326 preferably has a tapered shape, in which case coverage with the organic layer 314 and the common electrode 313 can be improved.

The above is the description of the structure example of the resin layer.

The structures, configurations, methods, and the like described in this embodiment can be used in combination as appropriate with the structures, configurations, methods, and the like described in the other embodiments.

Embodiment 4

In this embodiment, a display apparatus including a light-receiving device and a light-emitting device of one embodiment of the present invention will be described.

A display portion of the display apparatus of one embodiment of the present invention includes a light-receiving device and a light-emitting device. The display portion has a function of displaying an image with the use of the light-emitting devices. Furthermore, the display portion has one or both of an image capturing function and a sensing function with use of the light-receiving devices.

Alternatively, the display apparatus of one embodiment of the present invention may be configured to include a light-receiving and light-emitting device (also referred to as a light-receiving and light-emitting element) and a light-emitting device.

First, the display apparatus including a light-receiving device and a light-emitting device is described.

The display apparatus of one embodiment of the present invention includes light-receiving devices and light-emitting devices in the display portion. In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function. The display portion can be used as an image sensor, a touch sensor, or the like. That is, by sensing light with the display portion, an image can be captured and touch operation with an object (e.g., a finger or a stylus) can be sensed. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting device included in the display portion, the light-receiving device can sense the reflected light (or the scattered light); thus, image capturing, touch operation sensing, or the like is possible even in a dark place.

The light-emitting device included in the display apparatus of one embodiment of the present invention functions as a display device (also referred to as a display element).

As the light-emitting device, an EL element (also referred to as an EL device) such as an OLED or a QLED is preferably used. Examples of light-emitting substance contained in the EL element include a substance emitting fluorescent light (a fluorescent material), a substance emitting phosphorescent light (a phosphorescent material), an inorganic compound (e.g., a quantum dot material), and a substance exhibiting thermally activated delayed fluorescence (a thermally activated delayed fluorescent (TADF) material). Alternatively, as the light-emitting device, an LED such as a micro LED can be used.

The display apparatus of one embodiment of the present invention has a function of sensing light using the light-receiving devices.

When the light-receiving devices are used as an image sensor, the display apparatus can capture an image using the light-receiving devices. For example, the display apparatus can be used as a scanner.

An electronic device including the display apparatus of one embodiment of the present invention can acquire data related to biological information such as a fingerprint or a palm print by using a function of an image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus; thus, the electronic device can be downsized and lightweight.

When the light-receiving devices are used as a touch sensor, the display apparatus can sense touch operation by an object with the use of the light-receiving devices. In other words, a light-receiving device can be referred to as an input device.

As the light-receiving device, a pn photodiode or a pin photodiode can be used, for example. The light-receiving device functions as a photoelectric conversion element (also referred to as a photoelectric conversion device) that senses light incident on the light-receiving device and generates charge. The amount of charge generated from the light-receiving devices depends on the amount of light entering the light-receiving devices.

It is particularly preferable to use an organic photodiode including a layer containing an organic compound as the light-receiving device. An organic photodiode, which is easily made thin, lightweight, and large in area and has a high degree of freedom for shape and design, can be used in a variety of devices.

In one embodiment of the present invention, organic EL elements (also referred to as organic EL devices) are used as the light-emitting devices, and organic photodiodes are used as the light-receiving devices. The organic EL elements and the organic photodiodes can be formed over one substrate. Thus, the organic photodiodes can be incorporated in a display apparatus including the organic EL elements.

If all the layers of the organic EL elements and the organic photodiodes are formed separately, the number of film formation steps becomes extremely large. However, a large number of layers can be shared between the organic photodiodes and the organic EL elements; hence, forming the common layers concurrently can inhibit the increase in the number of film formation steps.

For example, one of a pair of electrodes (a common electrode) can be a layer shared by the light-receiving device and the light-emitting device. As another example, at least one of a hole-injection layer, a hole-transport layer, an electron-transport layer, and an electron-injection layer may be shared by the light-receiving device and the light-emitting device. When the light-receiving device and the light-emitting device include a common layer in such a manner, the number of film formation steps and the number of masks can be reduced, thereby reducing the number of manufacturing steps and the manufacturing cost of the display apparatus. Furthermore, the display apparatus including the light-receiving devices can be manufactured using an existing manufacturing apparatus and an existing manufacturing method for the display apparatus.

Next, a display apparatus including a light-receiving and light-emitting device and a light-emitting device is described. Note that functions, behavior, effects, and the like similar to those in the above are not described in some cases.

In the display apparatus of one embodiment of the present invention, a subpixel exhibiting any color includes a light-receiving and light-emitting device instead of a light-emitting device, and subpixels exhibiting the other colors each include a light-emitting device. The light-receiving and light-emitting device has both a function of emitting light (a light-emitting function) and a function of receiving light (a light-receiving function). For example, in the case where a pixel includes three subpixels of a red subpixel, a green subpixel, and a blue subpixel, at least one of the subpixels includes a light-receiving and light-emitting device and the other subpixels each include a light-emitting device. Thus, the display portion of the display apparatus of one embodiment of the present invention has a function of displaying an image using both a light-receiving and light-emitting device and a light-emitting device.

The light-receiving and light-emitting device functions as both a light-emitting device and a light-receiving device, whereby the pixel can have a light-receiving function without an increase in the number of subpixels included in the pixel. Thus, the display portion of the display apparatus can be provided with one or both of an image capturing function and a sensing function while keeping the aperture ratio of pixels (aperture ratio of subpixels) and the resolution of the display apparatus. Accordingly, in the display apparatus of one embodiment of the present invention, the aperture ratio of the pixel can be more increased and the resolution can be increased more easily than in the case where a subpixel including a light-receiving device is provided separately from a subpixel including a light-emitting device.

In the display apparatus of one embodiment of the present invention, light-receiving and light-emitting devices and light-emitting devices are arranged in a matrix in the display portion, and an image can be displayed on the display portion. The display portion can be used as an image sensor, a touch sensor, or the like. In the display apparatus of one embodiment of the present invention, the light-emitting devices can be used as a light source of the sensor. Thus, image capturing, touch operation sensing, or the like is possible even in a dark place.

The light-receiving and light-emitting device can be manufactured by combining an organic EL element and an organic photodiode. For example, by adding an active layer of an organic photodiode to a stacked-layer structure of an organic EL element, the light-receiving and light-emitting device can be manufactured. Furthermore, in the light-receiving and light-emitting device manufactured of a combination of an organic EL element and an organic photodiode, concurrently forming layers that can be shared with the organic EL element can inhibit an increase in the number of film formation steps.

For example, one of a pair of electrodes (a common electrode) can be a layer shared by the light-receiving and light-emitting devices and the light-emitting devices. As another example, at least one of a hole-injection layer, a hole-transport layer, an electron-transport layer, and an electron-injection layer may be shared by the light-receiving and light-emitting devices and the light-emitting devices.

Note that layers included in the light-receiving and light-emitting devices might have different functions between the case where the light-receiving and light-emitting devices function as the light-receiving devices and the case where the light-receiving and light-emitting devices function as the light-emitting devices. In this specification, the name of a component is based on its function of the case where the light-receiving and light-emitting devices function as the light-emitting devices.

The display apparatus of this embodiment has a function of displaying images using the light-emitting devices and the light-receiving and light-emitting devices. That is, the light-emitting device and the light-receiving and light-emitting device function as a display element.

The display apparatus of this embodiment has a function of sensing light using the light-receiving and light-emitting devices. The light-receiving and light-emitting device can sense light having a shorter wavelength than light emitted by the light-receiving and light-emitting device itself.

When the light-receiving and light-emitting devices are used as an image sensor, the display apparatus of this embodiment can capture an image using the light-receiving and light-emitting devices. When the light-receiving and light-emitting devices are used as a touch sensor, the display apparatus of this embodiment can sense touch operation of an object with the use of the light-receiving and light-emitting device.

The light-receiving and light-emitting device functions as a photoelectric conversion element. The light-receiving and light-emitting device can be manufactured by adding an active layer of the light-receiving device to the above-described structure of the light-emitting device. In the light-receiving and light-emitting device, an active layer of a pn photodiode or a pin photodiode can be used, for example.

In the light-receiving and light-emitting device, it is particularly preferable to use an active layer of an organic photodiode including a layer containing an organic compound. An organic photodiode, which is easily made thin, lightweight, and large in area and has a high degree of freedom for shape and design, can be used in a variety of devices.

A display apparatus that is an example of the display apparatus of one embodiment of the present invention is more specifically described below with reference to drawings.

[Structure Example of Display Apparatus]

Structure Example 1-1

Figure 29A:
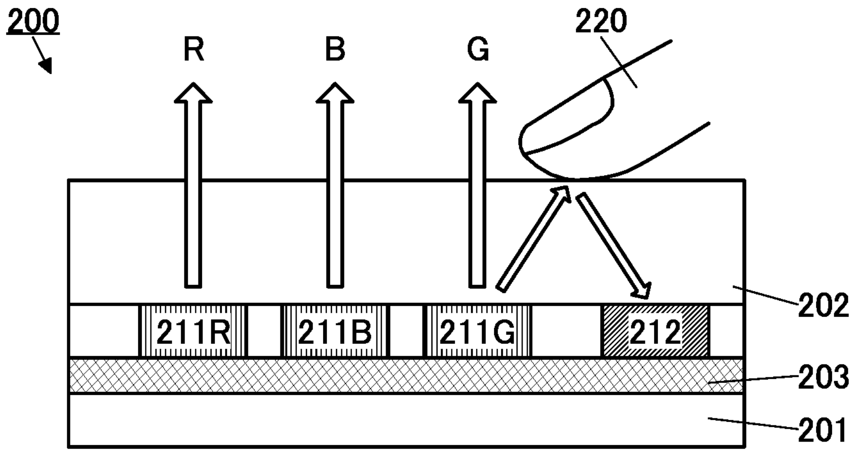
FIG. 29A, FIG. 29B, and FIG. 29D are cross-sectional views illustrating an example of a display apparatus.

FIG. 29A is a schematic view of a display panel 200. The display panel 200 includes a substrate 201, a substrate 202, a light-receiving device 212, a light-emitting device 211R, a light-emitting device 211G, a light-emitting device 211B, a functional layer 203, and the like.

The light-emitting device 211R, the light-emitting device 211G, the light-emitting device 211B, and the light-receiving device 212 are provided between the substrate 201 and the substrate 202. The light-emitting device 211R, the light-emitting device 211G, and the light-emitting device 211B emit red (R) light, green (G) light, and blue (B) light, respectively. Hereinafter, in the case where the light-emitting device 211R, the light-emitting device 211G, and the light-emitting device 211B are not distinguished from each other, each light-emitting device is referred to as a light-emitting device 211 in some cases.

The display panel 200 includes a plurality of pixels arranged in a matrix. One pixel includes one or more subpixels. One subpixel includes one light-emitting device. For example, the pixel can include three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes the light-receiving device 212. The light-receiving device 212 may be provided in all the pixels or in some of the pixels. In addition, one pixel may include a plurality of light-receiving devices 212.

FIG. 29A illustrates a state where a finger 220 touches a surface of the substrate 202. Part of light emitted from the light-emitting device 211G is reflected by a contact portion of the substrate 202 and the finger 220. In the case where part of reflected light is incident on the light-receiving device 212, the contact of the finger 220 with the substrate 202 can be sensed. That is, the display panel 200 can function as a touch panel.

The functional layer 203 includes a circuit for driving the light-emitting device 211R, the light-emitting device 211G, and the light-emitting device 211B and a circuit for driving the light-receiving device 212. The functional layer 203 includes a switch, a transistor, a capacitor, a wiring, and the like. Note that in the case where the light-emitting device 211R, the light-emitting device 211G, the light-emitting device 2111B, and the light-receiving device 212 are driven by a passive-matrix method, a structure not provided with a switch, a transistor, or the like may be employed.

Figure 29B:
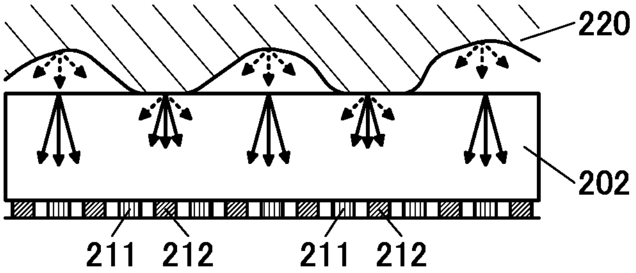

The display panel 200 preferably has a function of sensing a fingerprint of the finger 220. FIG. 29B schematically illustrates an enlarged view of the contact portion in a state where the finger 220 touches the substrate 202. FIG. 29B illustrates the light-emitting devices 211 and the light-receiving devices 212 that are alternately arranged.

The fingerprint of the finger 220 is formed of depressions and projections. Therefore, as illustrated in FIG. 29B, the projections of the fingerprint touch the substrate 202.

Reflection of light from a surface, an interface, or the like is categorized into regular reflection and diffuse reflection. Regularly reflected light is highly directional light with an angle of reflection equal to the angle of incidence. Diffusely reflected light has low directionality and low angular dependence of intensity. As for regular reflection and diffuse reflection, diffuse reflection components are dominant in the light reflected from the surface of the finger 220. Meanwhile, regular reflection components are dominant in the light reflected from the interface between the substrate 202 and the air.

The intensity of light that is reflected from contact surfaces or non-contact surfaces between the finger 220 and the substrate 202 and enters the light-receiving devices 212 which are positioned directly below the contact surfaces or the non-contact surfaces is the sum of intensities of regularly reflected light and diffusely reflected light. As described above, regularly reflected light (indicated by solid arrows) is dominant near the depressions of the finger 220, where the finger 220 is not in contact with the substrate 202; whereas diffusely reflected light (indicated by dashed arrows) from the finger 220 is dominant near the projections of the finger 220, where the finger 220 is in contact with the substrate 202. Thus, the intensity of light received by the light-receiving device 212 positioned directly below the depression is higher than the intensity of light received by the light-receiving device 212 positioned directly below the projection. Accordingly, an image of the fingerprint of the finger 220 can be captured.

When the arrangement interval between the light-receiving devices 212 is smaller than the distance between two projections of the fingerprint, preferably the distance between a depression and a projection adjacent to each other, a clear fingerprint image can be obtained. The interval between a depression and a projection of a human's fingerprint is approximately 200 μm; thus, the arrangement interval between the light-receiving devices 212 is, for example, less than or equal to 400 μm, preferably less than or equal to 200 μm, further preferably less than or equal to 150 μm, still further preferably less than or equal to 100 μm, even still further preferably less than or equal to 50 μm and greater than or equal to 1 μm, preferably greater than or equal to 10 μm, further preferably greater than or equal to 20 μm.

Figure 29C:
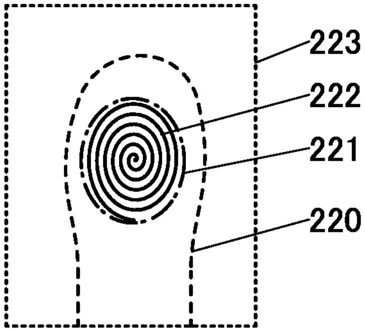
FIG. 29C and FIG. 29E are diagrams illustrating examples of images.

FIG. 29C illustrates an example of a fingerprint image captured with the display panel 200. In FIG. 29C, in an image-capturing range 223, the outline of the finger 220 is indicated by a dashed line and the outline of a contact portion 221 is indicated by a dashed-dotted line. In the contact portion 221, a high-contrast image of a fingerprint 222 can be captured by a difference in the amount of light incident on the light-receiving device 212.

Figure 29D:
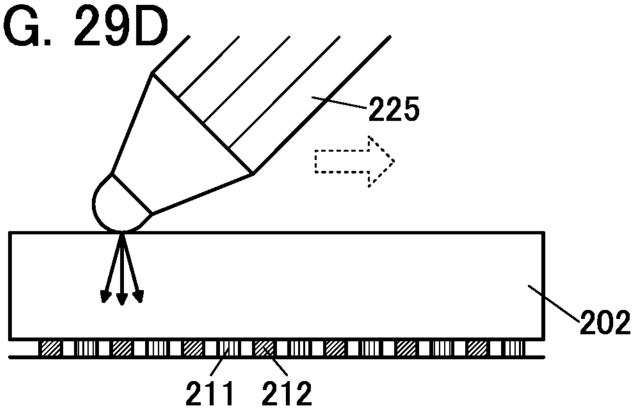

The display panel 200 can also function as a touch panel or a pen tablet. FIG. 29D illustrates a state in which a tip of a stylus 225 slides in a direction indicated by a dashed arrow while the tip of the stylus 225 touches the substrate 202.

As illustrated in FIG. 29D, when diffusely reflected light that is diffused by the contact surface of the tip of the stylus 225 and the substrate 202 is incident on the light-receiving device 212 positioned in a portion overlapping with the contact surface, the position of the tip of the stylus 225 can be sensed with high accuracy.

Figure 29E:
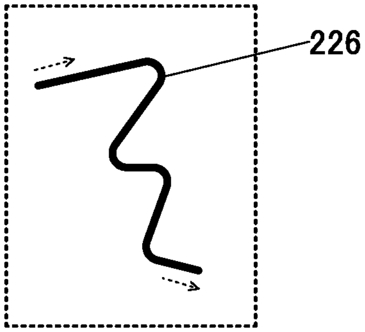

FIG. 29E illustrates an example of a path 226 of the stylus 225 that is sensed in the display panel 200. The display panel 200 can sense the position of an object to be sensed, such as the stylus 225, with high accuracy, so that high-resolution drawing can be performed using a drawing application or the like. Unlike the case of using a capacitive touch sensor, an electromagnetic induction touch pen, or the like, the display panel 200 can sense even the position of a highly insulating object to be sensed, the material of a tip portion of the stylus 225 is not limited, and a variety of writing materials (e.g., a brush, a glass pen, a quill pen, and the like) can be used.

Figure 29F:
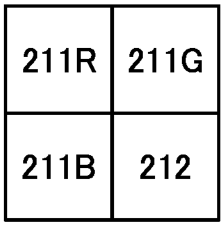
FIG. 29F to FIG. 29H are top views illustrating examples of a pixel.
Figure 29G:
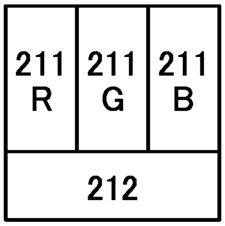
Figure 29H:
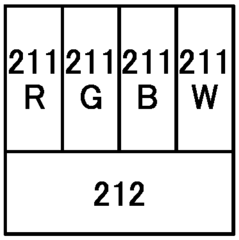

Here, FIG. 29F to FIG. 29H illustrate examples of pixels that can be used for the display panel 200.

The pixels illustrated in FIG. 29F and FIG. 29G each include the light-emitting device 211R for red (R), the light-emitting device 211G for green (G), and the light-emitting device 211B for blue (B), and the light-receiving device 212. The pixels each include a pixel circuit for driving the light-emitting device 211R, the light-emitting device 211G, and the light-emitting device 211B and the light-receiving device 212.

FIG. 29F illustrates an example in which three light-emitting devices and one light-receiving device are provided in a matrix of 2×2. FIG. 29G illustrates an example in which three light-emitting devices are arranged in one column and one laterally long light-receiving device 212 is provided below the three light-emitting devices.

The pixel illustrated in FIG. 29H includes a light-emitting device 211W for white (W). Here, four light-emitting devices are arranged in one column and the light-receiving device 212 is provided below the four light-emitting devices.

Note that the pixel structure is not limited to the above, and a variety of pixel arrangement methods can be employed.

Structure Example 1-2

An example of a structure including a light-emitting device emitting visible light, a light-emitting device emitting infrared light, and a light-receiving device is described below.

Figure 30A:
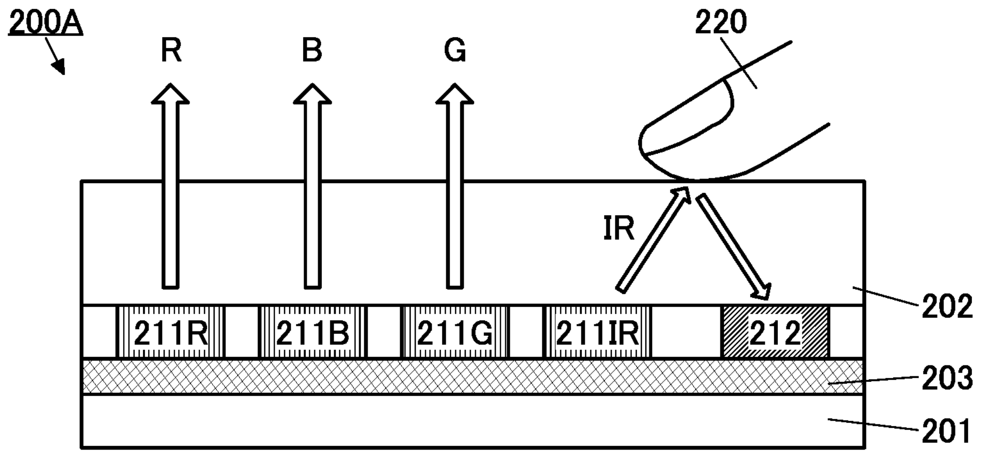
FIG. 30A is a cross-sectional view illustrating a structure example of a display apparatus.

A display panel 200A illustrated in FIG. 30A includes a light-emitting device 211IR in addition to the components illustrated in FIG. 29A as an example. The light-emitting device 211IR is a light-emitting device emitting infrared light IR. Moreover, in that case, an element capable of receiving at least the infrared light IR emitted from the light-emitting device 211IR is preferably used as the light-receiving device 212. As the light-receiving device 212, an element capable of receiving both visible light and infrared light is further preferably used.

As illustrated in FIG. 30A, when the finger 220 touches the substrate 202, the infrared light IR emitted from the light-emitting device 211IR is reflected by the finger 220 and part of the reflected light is incident on the light-receiving device 212, so that the positional information of the finger 220 can be obtained.

Figure 30B:
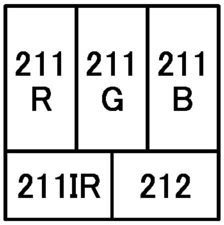
FIG. 30B to FIG. 30D are top views illustrating examples of a pixel.
Figure 30C:
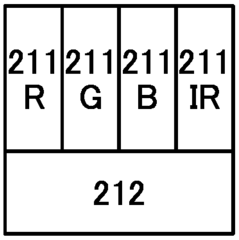
Figure 30D:
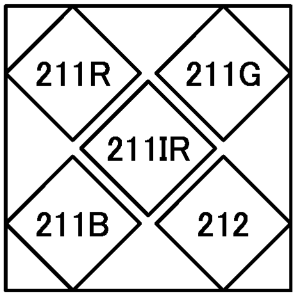

FIG. 30B to FIG. 30D illustrate examples of pixels that can be used for the display panel 200A.

FIG. 30B illustrates an example in which three light-emitting devices are arranged in one column and the light-emitting device 211IR and the light-receiving device 212 are arranged below the three light-emitting devices in a horizontal direction. FIG. 30C illustrates an example in which four light-emitting devices including the light-emitting device 211IR are arranged in one column and the light-receiving device 212 is provided below the four light-emitting devices.

FIG. 30D illustrates an example in which three light-emitting devices and the light-receiving device 212 are arranged in all directions with the light-emitting device 211IR used as a center.

Note that in the pixels illustrated in FIG. 30B to FIG. 30D, the positions of the light-emitting devices can be interchangeable, or the positions of the light-emitting device and the light-receiving device can be interchangeable.

Structure Example 1-3

An example of a structure including a light-emitting device emitting visible light and a light-receiving and light-emitting device emitting and receiving visible light is described below.

Figure 31A:
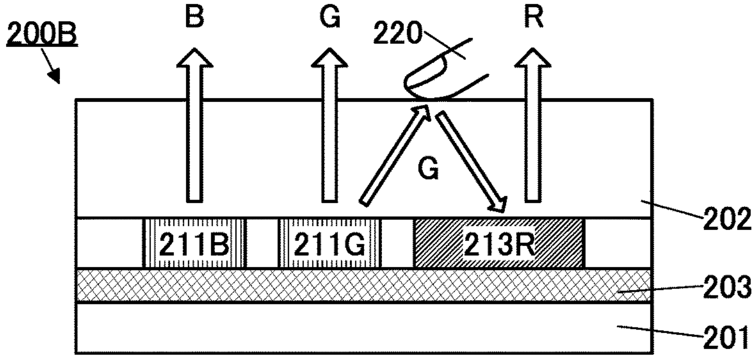
FIG. 31A is a cross-sectional view illustrating a structure example of a display apparatus.

A display panel 200B illustrated in FIG. 31A includes the light-emitting device 211B, the light-emitting device 211G, and a light-receiving and light-emitting device 213R. The light-receiving and light-emitting device 213R has a function of a light-emitting device that emits red (R) light, and a function of a photoelectric conversion element that receives visible light. FIG. 31A illustrates an example in which the light-receiving and light-emitting device 213R receives green (G) light emitted from the light-emitting device 211G. Note that the light-receiving and light-emitting device 213R may receive blue (B) light emitted from the light-emitting device 2111B. Alternatively, the light-receiving and light-emitting device 213R may receive both green light and blue light.

For example, the light-receiving and light-emitting device 213R preferably receives light having a shorter wavelength than light emitted from itself. Alternatively, the light-receiving and light-emitting device 213R may receive light having a longer wavelength than light emitted from itself (e.g., infrared light). The light-receiving and light-emitting device 213R may receive light having approximately the same wavelength as light emitted from itself, however, in that case, the light-receiving and light-emitting device 213R also receives light emitted from itself, whereby its emission efficiency might be decreased. Therefore, the peak of the emission spectrum and the peak of the absorption spectrum of the light-receiving and light-emitting device 213R preferably overlap as little as possible.

Here, light emitted from the light-receiving and light-emitting device is not limited to red light. Light emitted from the light-emitting devices is not limited to a combination of green light and blue light. For example, the light-receiving and light-emitting device can be an element that emits green light or blue light and receives light having a different wavelength from light emitted from itself.

The light-receiving and light-emitting device 213R serves as both a light-emitting device and a light-receiving device as described above, whereby the number of elements provided in one pixel can be reduced. Thus, higher resolution, a higher aperture ratio, higher definition, and the like can be easily achieved.

FIG. 31B to FIG. 31I illustrate examples of pixels that can be used for the display panel 200B.

Figure 31B:
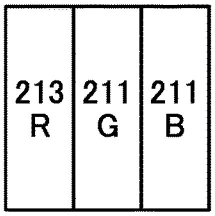
FIG. 31B to FIG. 31I are top views illustrating examples of a pixel.
Figure 31C:
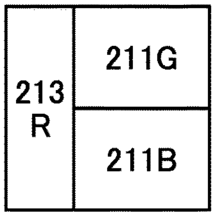

FIG. 31B illustrates an example in which the light-receiving and light-emitting device 213R, the light-emitting device 211G, and the light-emitting device 211B are arranged in one column. FIG. 31C illustrates an example in which the light-emitting device 211G and the light-emitting device 211B are alternately arranged in the vertical direction and the light-receiving and light-emitting device 213R is provided alongside the light-emitting devices.

Figure 31D:
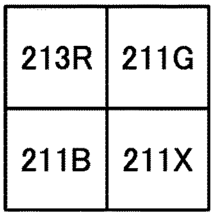

FIG. 31D illustrates an example in which three light-emitting devices (the light-emitting device 211G, the light-emitting device 211B, and a light-emitting device 211X and one light-receiving and light-emitting device are arranged in a matrix of 2×2. The light-emitting device 211X is an element emitting light of a color other than R, G, and B. Examples of light of a color other than R, G, and B include white (W) light, yellow (Y) light, cyan (C) light, magenta (M) light, infrared light (IR), and ultraviolet light (UV). In the case where the light-emitting device 211X emits infrared light, the light-receiving and light-emitting device preferably has a function of sensing infrared light or a function of sensing both visible light and infrared light. The wavelength of light that the light-receiving and light-emitting device senses can be determined depending on the usage of the sensor.

Figure 31E:
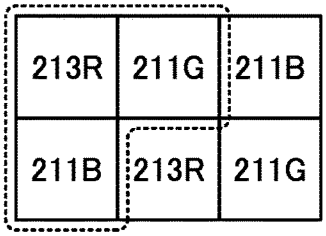

FIG. 31E illustrates two pixels. A region that includes three elements and is enclosed by a dotted line corresponds to one pixel. The pixels each include the light-emitting device 211G, the light-emitting device 211B, and the light-receiving and light-emitting device 213R. In the pixel on the left in FIG. 31E, the light-emitting device 211G is provided in the same row as the light-receiving and light-emitting device 213R, and the light-emitting device 211B is provided in the same column as the light-receiving and light-emitting device 213R. In the pixel on the right in FIG. 31E, the light-emitting device 211G is provided in the same row as the light-receiving and light-emitting device 213R, and the light-emitting device 211B is provided in the same column as the light-emitting device 211G. In the pixel layout in FIG. 31E, the light-receiving and light-emitting device 213R, the light-emitting device 211G, and the light-emitting device 211B are repeatedly arranged in both the odd-numbered row and the even-numbered row, and in each column, the light-emitting devices or the light-receiving and light-emitting device are arranged in the odd-numbered row and the even-numbered row emit light of different colors.

Figure 31F:
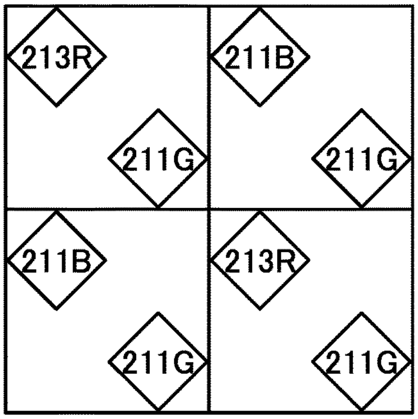

FIG. 31F illustrates four pixels which employ pentile arrangement; adjacent two pixels each have a different combination of two light-emitting devices or light-receiving and light-emitting devices that emit light of different colors. FIG. 31F illustrates top surface shapes of the light-emitting devices or light-receiving and light-emitting devices.

In FIG. 31F, the upper-left pixel and the lower-right pixel each include the light-receiving and light-emitting device 213R and the light-emitting device 211G. The upper-right pixel and the lower-left pixel each include the light-emitting device 211G and the light-emitting device 2111B. That is, in the example illustrated in FIG. 31F, each pixel is provided with the light-emitting device 211G.

The top surface shapes of the light-emitting devices and the light-receiving and light-emitting devices are not particularly limited and can be a circular shape, an elliptical shape, a polygonal shape, a polygonal shape with rounded corners, or the like. FIG. 31F and the like illustrate examples in which the top surface shapes of the light-emitting devices and the light-receiving and light-emitting devices are each a square tilted at approximately 45° (a diamond shape). Note that the top surface shapes of the light-emitting devices and the light-receiving and light-emitting devices of respective colors may vary, or the devices of at least one color or all colors may have the same top surface shape.

The sizes of the light-emitting regions (or light-receiving and light-emitting regions) of the light-emitting devices and the light-receiving and light-emitting devices of respective colors may vary, or the regions of at least one color or all colors may be the same in size. For example, in FIG. 31F, the light-emitting region of the light-emitting device 211G provided in each pixel may have a smaller area than the light-emitting region (or the light-receiving and light-emitting region) of the other elements.

Figure 31H:
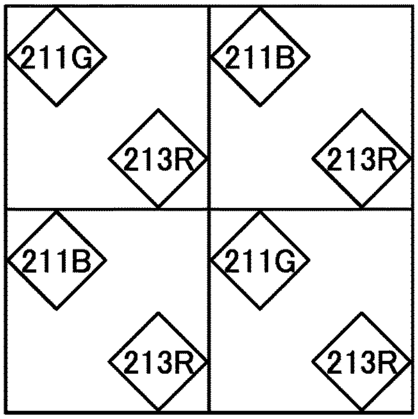
Figure 31G:
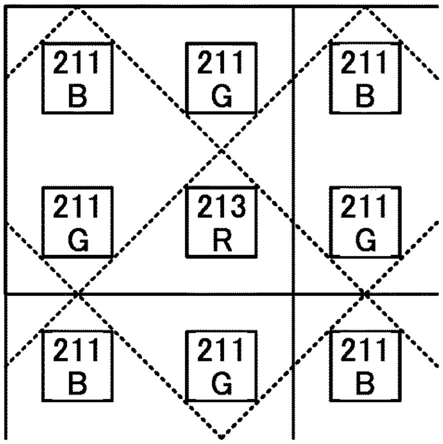

FIG. 31G is a modification example of the pixel arrangement illustrated in FIG. 31F. Specifically, the structure of FIG. 31G is obtained by rotating the structure of FIG. 31F by 45°. Although one pixel is regarded as being formed of two elements in FIG. 31F, one pixel can be regarded as being formed of four elements as illustrated in FIG. 31G.

FIG. 31H is a modification example of the pixel arrangement illustrated in FIG. 31F. In FIG. 31H, the upper-left pixel and the lower-right pixel each include the light-receiving and light-emitting device 213R and the light-emitting device 211G. The upper-right pixel and the lower-left pixel each include the light-receiving and light-emitting device 213R and the light-emitting device 211B. That is, in the example illustrated in FIG. 31H, each pixel is provided with the light-receiving and light-emitting device 213R. The structure illustrated in FIG. 31H achieves higher-resolution image capturing than the structure illustrated in FIG. 31F because of having the light-receiving and light-emitting device 213R in each pixel. Thus, the accuracy of biometric authentication can be increased, for example.

Figure 31I:
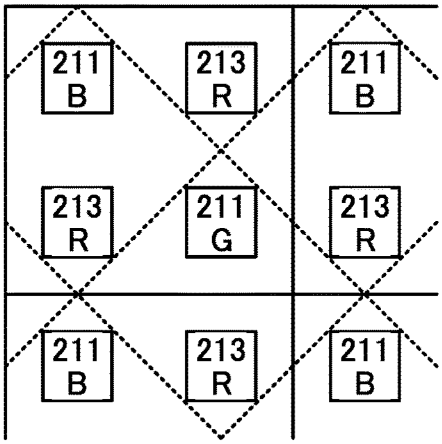

FIG. 31I is a modification example of the pixel arrangement illustrated in FIG. 31H, obtained by rotating the pixel arrangement in FIG. 31H by 45°.

In FIG. 31I, one pixel is described as being composed of four elements (two light-emitting devices and two light-receiving and light-emitting devices). One pixel including a plurality of light-receiving and light-emitting devices having a light-receiving function allows high-resolution image capturing. Thus, the accuracy of biometric authentication can be increased. For example, the resolution of image capturing can be the square root of 2 times the resolution of display.

A display apparatus which employs the structure illustrated in FIG. 31H or FIG. 31I includes p (p is an integer greater than or equal to 2) first light-emitting devices, q (q is an integer greater than or equal to 2) second light-emitting devices, and r (r is an integer greater than p and q) light-receiving and light-emitting devices. As for p and r, r=2p is satisfied. As for p, q, and r, r=p+q is satisfied. Either the first light-emitting devices or the second light-emitting devices emit green light, and the other light-emitting devices emit blue light. The light-receiving and light-emitting devices emit red light and have a light-receiving function.

When a touch operation is sensed using the light-receiving and light-emitting devices, for example, it is preferable that light emitted from a light source be less likely to be perceived by the user. Since blue light has lower visibility than green light, light-emitting devices that emit blue light are preferably used as a light source. Accordingly, the light-receiving and light-emitting devices preferably have a function of receiving blue light. Note that without limitation to the above, light-emitting devices used as a light source can be selected as appropriate depending on the sensitivity of the light-receiving and light-emitting devices.

As described above, the display apparatus of this embodiment can employ any of various types of pixel arrangements.

At least part of this embodiment can be implemented in combination with any of the other embodiments described in this specification, as appropriate.

Embodiment 5

In this embodiment, a light-emitting device (also referred to as light-emitting element) and a light-receiving device (also referred to as a light-receiving element) that can be used in a display apparatus of one embodiment of the present invention will be described.

In this specification and the like, a device manufactured using a metal mask or an FMM (fine metal mask, high-resolution metal mask) is referred to as a device having an MM (metal mask) structure in some cases. In this specification and the like, a device manufactured without using a metal mask or an FMM is referred to as a device having an MML (metal maskless) structure in some cases. A display apparatus having an MML structure is manufactured without using a metal mask and thus has a higher degree of freedom in designing the pixel arrangement, the pixel shape, and the like than a display apparatus having an FMM structure or an MM structure.

Note that in the method for manufacturing a display apparatus having an MML structure, an island-shaped organic layer (hereinafter, an EL layer) that makes up an organic EL element is formed not by patterning with the use of a metal mask but by processing after formation of an EL layer over an entire surface. Accordingly, a high-resolution display apparatus or a display apparatus with a high aperture ratio, which has been difficult to achieve, can be manufactured. Moreover, EL layers can be formed separately for each color, enabling the display apparatus to perform extremely clear display with high contrast and high display quality. In addition, a sacrificial layer provided over an EL layer can reduce damage to the EL layer in the manufacturing process of the display apparatus, increasing the reliability of the light-emitting device.

The display apparatus of one embodiment of the present invention can have a structure in which an insulator covering the end portion of the pixel electrode is not provided. In other words, a structure in which no insulator is provided between the pixel electrode and the EL layer. With this structure, light can be efficiently extracted from the EL layer, leading to extremely low viewing angle dependence. For example, in the display apparatus of one embodiment of the present invention, the viewing angle (the maximum angle with a certain contrast ratio maintained when the screen is seen from an oblique direction) can be greater than or equal to 100° and less than 180°, preferably greater than or equal to 150° and less than or equal to 170°. Note that the viewing angle refers to that in both the vertical direction and the horizontal direction. The display apparatus of one embodiment of the present invention can have improved viewing angle dependence and high image visibility.

In the case where a display apparatus is a device with a fine metal mask (FMM) structure, the pixel arrangement structure or the like is limited in some cases. Here, the FMM structure will be described below.

In order to fabricate the FMM structure, a metal mask provided with an opening portion (also referred to as an FMM) is set to be opposed to a substrate so that an EL material is deposited to a desired region at the time of EL evaporation. Then, the EL evaporation is performed through the FMM to form an EL layer in the desired region. When the size of the substrate at the time of EL evaporation is larger, the size of the FMM is increased and accordingly the weight thereof is also increased. In addition, heat or the like is applied to the FMM at the time of EL evaporation and may change the shape of the FMM. Furthermore, there is a method in which EL evaporation is performed while a certain level of tension is applied to the FMM; hence, the weight and strength of the FMM are important parameters.

Therefore, a structure of pixel arrangement in a device having the FMM structure needs to be designed under certain restrictions; for example, the above-described parameters and the like need to be considered. In contrast, in the display apparatus of one embodiment of the present invention manufactured using an MML structure, an excellent effect such as a higher degree of freedom in the pixel arrangement structure or the like than the FMM structure can be exhibited. This structure is highly compatible with a flexible device or the like, for example, and thus one or both of a pixel and a driver circuit can have a variety of circuit arrangements.

Note that in this specification and the like, a structure in which light-emitting layers in light-emitting devices of respective colors (here, blue (B), green (G), and red (R)) are separately formed or the light-emitting layers are separately patterned is sometimes referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

[Light-Emitting Device]

Structures of light-emitting devices can be classified roughly into a single structure and a tandem structure. A light-emitting device with a single structure includes one light-emitting unit between a pair of electrodes, and the light-emitting unit preferably includes one or more light-emitting layers. To obtain white light emission using two light-emitting layers, two light-emitting layers are selected such that emission colors of the light-emitting layers are complementary colors. For example, when an emission color of a first light-emitting layer and an emission color of a second light-emitting layer are complementary colors, a light-emitting device can be configured to emit white light as a whole. To obtain white light emission by using three or more light-emitting layers, the light-emitting device is configured to emit white light as a whole by combining emission colors of the three or more light-emitting layers.

A light-emitting device with a tandem structure includes two or more light-emitting units between a pair of electrodes, and each light-emitting unit preferably includes one or more light-emitting layers. When light-emitting layers that emit light of the same color are used in each light-emitting unit, luminance per predetermined current can be increased, and the light-emitting device can have higher reliability than that with a single structure. To obtain white light emission with a tandem structure, the light-emitting device is configured to obtain white light emission by combining light from light-emitting layers of a plurality of light-emitting units. Note that a combination of emission colors for obtaining white light emission is similar to that for a single structure. In a light-emitting device with a tandem structure, an intermediate layer such as a charge-generation layer is suitably provided between a plurality of light-emitting units.

When the white-light-emitting device (with a single structure or a tandem structure) and a light-emitting device with an SBS structure are compared to each other, the light-emitting device with an SBS structure can have lower power consumption than the white-light-emitting device. To reduce power consumption, a light-emitting device with an SBS structure is preferably used. Meanwhile, the white-light-emitting device is preferable in terms of lower manufacturing cost or higher manufacturing yield because the manufacturing process of the white-light-emitting device is simpler than that of a light-emitting device with an SBS structure.

<Structure Example of Light-Emitting Device>

Figure 32A:
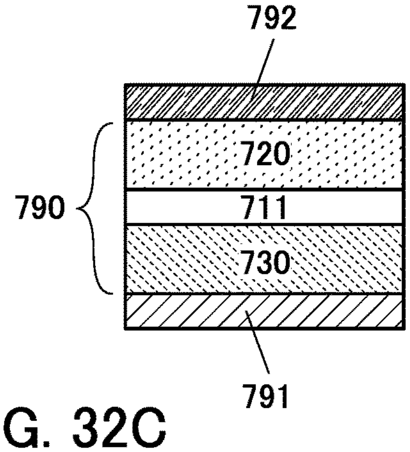
FIG. 32A to FIG. 32F are diagrams illustrating structure examples of a light-emitting device.

As illustrated in FIG. 32A, the light-emitting device includes an EL layer 790 between a pair of electrodes (a lower electrode 791 and an upper electrode 792). The EL layer 790 can be formed of a plurality of layers such as a layer 720, a light-emitting layer 711, and a layer 730. The layer 720 can include, for example, a layer containing a substance with a high electron-injection property (an electron-injection layer) and a layer containing a substance with a high electron-transport property (an electron-transport layer). The light-emitting layer 711 contains a light-emitting compound, for example. The layer 730 can include, for example, a layer containing a substance with a high hole-injection property (a hole-injection layer) and a layer containing a substance with a high hole-transport property (a hole-transport layer).

The structure including the layer 720, the light-emitting layer 711, and the layer 730, which is provided between a pair of electrodes, can function as a single light-emitting unit, and the structure in FIG. 32A is referred to as a single structure in this specification.

Figure 32B:
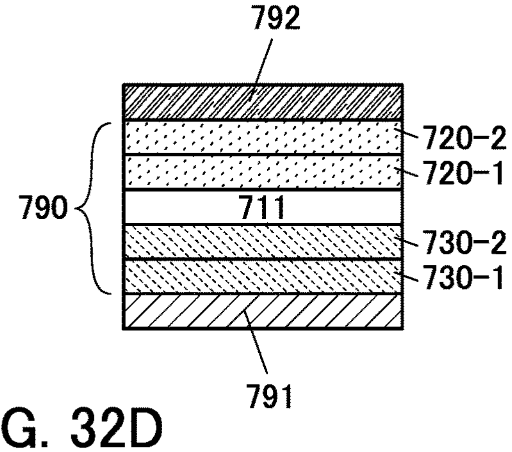

FIG. 32B is a modification example of the EL layer 790 included in the light-emitting device illustrated in FIG. 32A. Specifically, the light-emitting device illustrated in FIG. 32B includes a layer 730-1 over the lower electrode 791, a layer 730-2 over the layer 730-1, the light-emitting layer 711 over the layer 730-2, a layer 720-1 over the light-emitting layer 711, a layer 720-2 over the layer 720-1, and the upper electrode 792 over the layer 720-2. For example, when the lower electrode 791 functions as an anode and the upper electrode 792 functions as a cathode, the layer 730-1 functions as a hole-injection layer, the layer 730-2 functions as a hole-transport layer, the layer 720-1 functions as an electron-transport layer, and the layer 720-2 functions as an electron-injection layer. Alternatively, when the lower electrode 791 functions as a cathode and the upper electrode 792 functions as an anode, the layer 730-1 functions as an electron-injection layer, the layer 730-2 functions as an electron-transport layer, the layer 720-1 functions as a hole-transport layer, and the layer 720-2 functions as a hole-injection layer. With such a stacked-layer structure, carriers can be efficiently injected to the light-emitting layer 711, and the efficiency of the recombination of carriers in the light-emitting layer 711 can be increased.

Figure 32C:
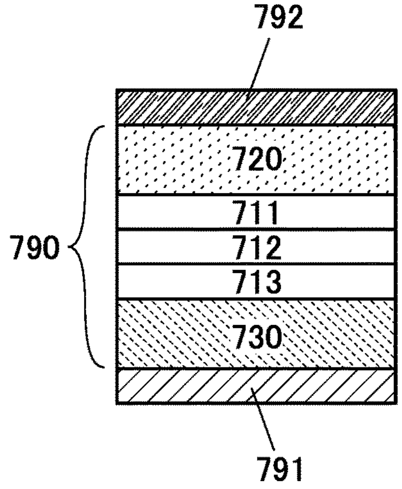
Figure 32D:
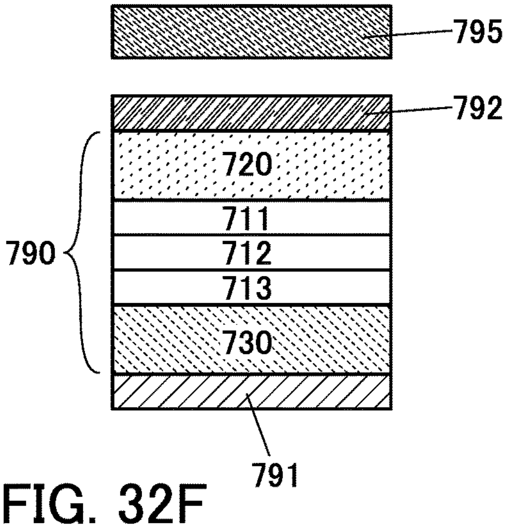

Note that structures in which a plurality of light-emitting layers (light-emitting layers 711, 712, and 713) are provided between the layer 720 and the layer 730 as illustrated in FIG. 32C and FIG. 32D are other variations of the single structure.

Figure 32E:
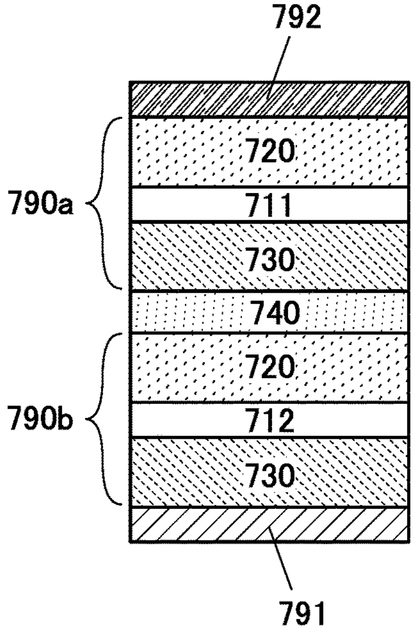
Figure 32F:
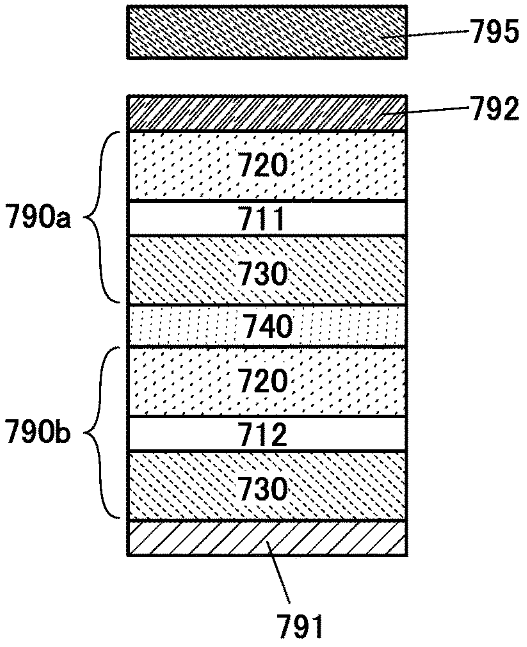

Structures in which a plurality of light-emitting units (EL layer 790*a* and EL layer 790*b*) are connected in series with an intermediate layer (charge-generation layer) 740 therebetween as illustrated in FIG. 32E and FIG. 32F are referred to as a tandem structure in this specification. The structures illustrated in FIG. 32E and FIG. 32F are referred to as a tandem structure in this specification and the like; however, the name of the structure is not limited thereto; a tandem structure may be referred to as a stack structure, for example. The tandem structure enables a light-emitting device capable of high luminance light emission.

In FIG. 32C, light-emitting materials that emits light of the same color may be used for the light-emitting layer 711, the light-emitting layer 712, and the light-emitting layer 713.

Alternatively, different light-emitting materials may be used for the light-emitting layer 711, the light-emitting layer 712, and the light-emitting layer 713. White light can be obtained when the light-emitting layer 711, the light-emitting layer 712, and the light-emitting layer 713 emit light of complementary colors. FIG. 32D illustrates an example in which a coloring layer 795 functioning as a color filter is provided. When white light passes through a color filter, light of a desired color can be obtained.

In FIG. 32E, the same light-emitting material may be used for the light-emitting layer 711 and the light-emitting layer 712. Alternatively, light-emitting materials that emit light of different colors may be used for the light-emitting layer 711 and the light-emitting layer 712. White light can be obtained when the light-emitting layer 711 and the light-emitting layer 712 emit light of complementary colors. FIG. 32F illustrates an example in which the coloring layer 795 is further provided.

In FIG. 32C, FIG. 32D, FIG. 32E, and FIG. 32F, the layer 720 and the layer 730 may each have a stacked-layer structure of two or more layers as illustrated in FIG. 32B.

In FIG. 32D, the same light-emitting material may be used for the light-emitting layer 711, the light-emitting layer 712, and the light-emitting layer 713. Similarly, in FIG. 32F, the same light-emitting material may be used for the light-emitting layer 711 and the light-emitting layer 712. Here, when a color conversion layer is used instead of the coloring layer 795, light of a desired color different from the emission color of the light-emitting material can be obtained. For example, a blue light-emitting material is used for each light-emitting layer and blue light passes through the color conversion layer, whereby light with a wavelength longer than that of blue light (e.g., red light or green light) can be obtained. For the color conversion layer, a fluorescent material, a phosphorescent material, quantum dots, or the like can be used.

The emission color of the light-emitting device can be red, green, blue, cyan, magenta, yellow, white, or the like depending on the material that constitutes the EL layer 790. When the light-emitting device has a microcavity structure, the color purity can be further increased.

In the light-emitting device that emits white light, the light-emitting layer preferably contains two or more kinds of light-emitting substances. To obtain white light emission, the two or more kinds of light-emitting substances are selected so as to emit light of complementary colors. For example, an emission color of a first light-emitting layer and an emission color of a second light-emitting layer are complementary colors, so that the light-emitting device can emit white light as a whole. This can be applied to a light-emitting device including three or more light-emitting layers.

The light-emitting layer preferably contains two or more substances that emit light of red (R), green (G), blue (B), yellow (Y), orange (O), and the like. Alternatively, a light-emitting layer preferably contains two or more light-emitting substances each of which emits light containing two or more of spectral components of R, G, and B.

[Light-Receiving Device]

Figure 33A:
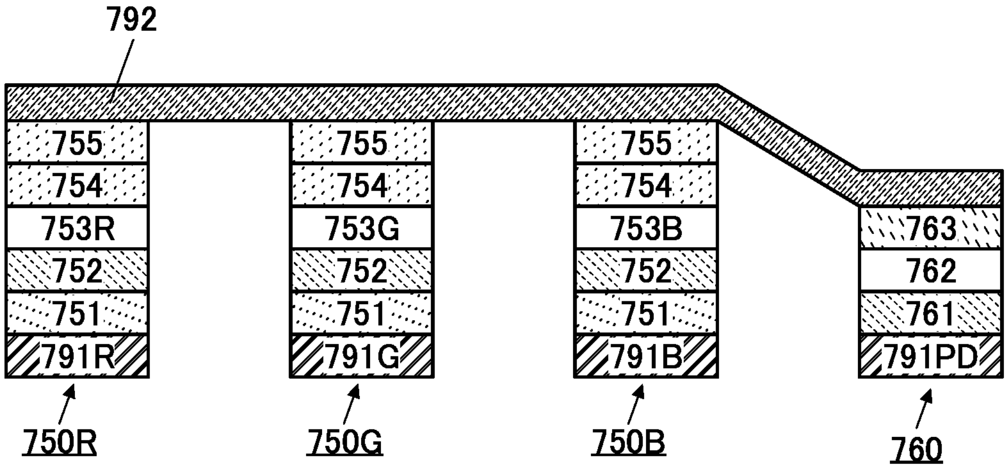
FIG. 33A and FIG. 33B are diagrams illustrating structure examples of light-emitting devices and light receiving devices.

FIG. 33A is a schematic cross-sectional view of a light-emitting device 750R, a light-emitting device 750G, a light-emitting device 750B, and a light-receiving device 760. The light-emitting device 750R, the light-emitting device 750G, the light-emitting device 750B, and the light-receiving device 760 share the upper electrode 792.

The light-emitting device 750R includes a pixel electrode 791R, a layer 751, a layer 752, a light-emitting layer 753R, a layer 754, a layer 755, and the upper electrode 792. The light-emitting device 750G includes a pixel electrode 791G, the layer 751, the layer 752, a light-emitting layer 753G, the layer 754, the layer 755, and the upper electrode 792. The light-emitting device 750B includes a pixel electrode 791B, the layer 751, the layer 752, a light-emitting layer 753B, the layer 754, the layer 755, and the upper electrode 792.

The layer 751 includes, for example, a layer containing a substance with a high hole-injection property (a hole-injection layer). The layer 752 includes, for example, a layer containing a substance with a high hole-transport property (a hole-transport layer). The layer 754 includes, for example, a layer containing a substance with a high electron-transport property (an electron-transport layer). The layer 755 includes, for example, a layer containing a substance with a high electron-injection property (an electron-injection layer).

Alternatively, the layer 751 may include an electron-injection layer, the layer 752 may include an electron-transport layer, the layer 754 may include a hole-transport layer, and the layer 755 may include a hole-injection layer.

FIG. 33A illustrates the layer 751 and the layer 752 separately; however, one embodiment of the present invention is not limited thereto. For example, the layer 752 may be omitted when the layer 751 has functions of both a hole-injection layer and a hole-transport layer or the layer 751 has functions of both an electron-injection layer and an electron-transport layer.

Note that the light-emitting layer 753R included in the light-emitting device 750R contains a light-emitting substance which emits red light, the light-emitting layer 753G included in the light-emitting device 750G contains a light-emitting substance which emits green light, and the light-emitting layer 753B included in the light-emitting device 750B contains a light-emitting substance which emits blue light. Note that the light-emitting device 750G and the light-emitting device 750B have a structure in which the light-emitting layer 753R included in the light-emitting device 750R is replaced with the light-emitting layer 753G and the light-emitting layer 753B, respectively, and the other components are similar to those of the light-emitting device 750R.

The structure (material, thickness, or the like) of the layer 751, the layer 752, the layer 754, and the layer 755 may be the same or different from each other among the light-emitting devices of the respective colors.

The light-receiving device 760 includes a pixel electrode 791PD, a layer 761, a layer 762, a layer 763, and the upper electrode 792. The light-receiving device 760 can be configured not to include a hole-injection layer and an electron-injection layer.

The layer 762 includes an active layer (also referred to as a photoelectric conversion layer). The layer 762 has a function of absorbing light in a specific wavelength range and generating carriers (electrons and holes).

The layer 761 and the layer 763 each include, for example, a hole-transport layer or an electron-transport layer. In the case where the layer 761 includes a hole-transport layer, the layer 763 includes an electron-transport layer. In the case where the layer 761 includes an electron-transport layer, the layer 763 includes a hole-transport layer.

In the light-receiving device 760, the pixel electrode 791PD may be an anode and the upper electrode 792 may be a cathode, or the pixel electrode 791PD may be a cathode and the upper electrode 792 may be an anode.

Figure 33B:
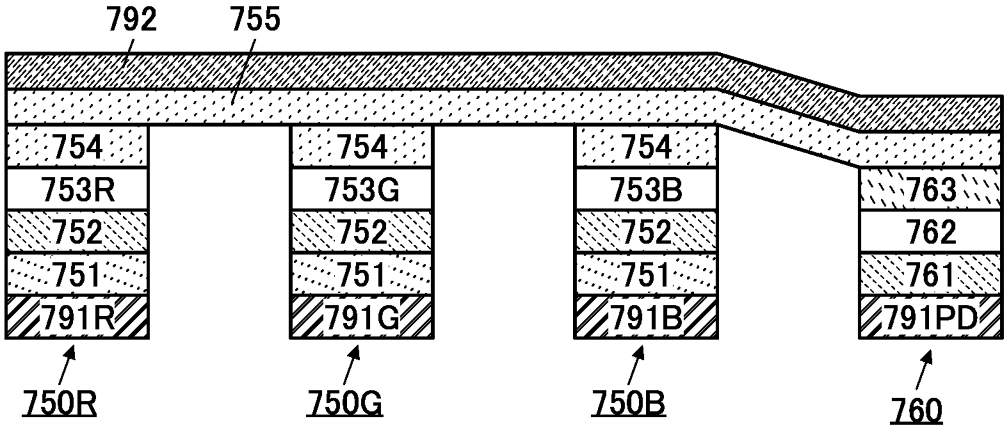

FIG. 33B is a modification example of FIG. 33A. FIG. 33B illustrates an example in which the light-emitting devices and the light-receiving device share not only the upper electrode 792 but also the layer 755. In this case, the layer 755 can be referred to as a common layer. By providing one or more common layers for the light-emitting devices and the light-receiving device in this manner, the manufacturing process can be simplified, resulting in a reduction in manufacturing cost.

Here, the layer 755 functions as an electron-injection layer or a hole-injection layer of the light-emitting device 750R and the like. At this time, the layer 755 functions as an electron-transport layer or a hole-transport layer of the light-receiving device 760. Thus, the light-receiving device 760 illustrated in FIG. 33B is not necessarily provided with the layer 763 functioning as an electron-transport layer or a hole-transport layer.

[Light-Emitting Device]

Here, a specific structure example of a light-emitting device will be described.

The light-emitting device includes at least a light-emitting layer. In addition to the light-emitting layer, the light-emitting device may further include a layer containing any of a substance with a high hole-injection property, a substance with a high hole-transport property, a hole-blocking material, a substance with a high electron-transport property, an electron-blocking material, a substance with a high electron-injection property, an electron-blocking material, a substance with a bipolar property (a substance with a high electron- and hole-transport property), and the like.

Either a low molecular compound or a high molecular compound can be used in the light-emitting device, and an inorganic compound may also be included. Each layer included in the light-emitting device can be formed by a method such as an evaporation method (including a vacuum evaporation method), a transfer method, a printing method, an inkjet method, or a coating method.

For example, the light-emitting device can include one or more of a hole-injection layer, a hole-transport layer, a hole-blocking layer, an electron-blocking layer, an electron-transport layer, and an electron-injection layer.

A hole-injection layer is a layer injecting holes from an anode to a hole-transport layer and containing a material with a high hole-injection property. Examples of a material with a high hole-injection property include an aromatic amine compound and a composite material containing a hole-transport material and an acceptor material (electron-accepting material).

A hole-transport layer is a layer transporting holes, which are injected from the anode by a hole-injection layer, to the light-emitting layer. A hole-transport layer is a layer containing a hole-transport material. For the hole-transport material, a substance having a hole mobility higher than or equal to $1\times10^{-6}$ $cm^2/Vs$ is preferable. Note that other substances can also be used as long as they have a property of transporting more holes than electrons. As the hole-transport material, materials with a high hole-transport property, such as a π-electron rich heteroaromatic compound (e.g., a carbazole derivative, a thiophene derivative, and a furan derivative) and an aromatic amine (a compound having an aromatic amine skeleton), are preferable.

An electron-transport layer is a layer transporting electrons, which are injected from a cathode by an electron-injection layer, to the light-emitting layer. An electron-transport layer is a layer containing an electron-transport material. For the electron-transport material, a substance having an electron mobility higher than or equal to $1\times10^{-6}$ $cm^2/Vs$ is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound including a nitrogen-containing heteroaromatic compound.

An electron-injection layer is a layer injecting electrons from the cathode to an electron-transport layer and containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

For an electron-injection layer, for example, an alkali metal, an alkaline earth metal, or a compound thereof, such as lithium, cesium, ytterbium, lithium fluoride (LiF), cesium fluoride (CsF), calcium fluoride ($CaF_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate, can be used. In addition, an electron-injection layer may have a stacked-layer structure of two or more layers. In the stacked-layer structure, for example, lithium fluoride can be used for a first layer and ytterbium can be used for a second layer.

Alternatively, for an electron-injection layer, an electron-transport material may be used. For example, a compound having an unshared electron pair and having an electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) level of the organic compound having an unshared electron pair is preferably higher than or equal to −3.6 eV and lower than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (guest material).

As one or more kinds of organic compounds, one or both of a hole-transport material and an electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by ExTET (Exciplex-Triplet Energy Transfer), which is energy transfer from an exciplex to a light-emitting substance (a phosphorescent material). When a combination of materials is selected to form an exciplex that exhibits light emission whose wavelength overlaps with the wavelength of the lowest-energy-side absorption band of the light-emitting substance, energy can be transferred smoothly and light emission can be obtained efficiently. With this structure, high efficiency, low-voltage driving, and a long lifetime of a light-emitting device can be achieved at the same time.

[Light-Receiving Device]

The active layer included in the light-receiving device includes a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer include electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads on a plane as in benzene, an electron-donating property (donor property) usually increases; however, fullerene has a spherical shape, and thus has a high electron-accepting property although π-electron conjugation widely spreads therein. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-Phenyl-C71-butyric acid methyl ester (abbreviation: PC70BM), [6,6]-Phenyl-C61-butyric acid methyl ester (abbreviation: PC60BM), and 1',1",4',4"-Tetrahydro-di[1,4]methanonaphthaleno[1,2:2',3',56,60:2",3" ][5,6]fullerene-C60 (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material included in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of a p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase a carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing any of a substance with a high hole-transport property, a substance with a high electron-transport property, a substance with a bipolar property (a substance with a high electron- and hole-transport property), and the like. Without limitation to the above, the light-receiving device may further include a layer containing a substance with a high hole-injection property, a hole-blocking material, a material with a high electron-injection property, an electron-blocking material, or the like.

Either a low molecular compound or a high molecular compound can be used for the light-receiving device, and an inorganic compound may also be included. Each layer included in the light-receiving device can be formed by a method such as an evaporation method (including a vacuum evaporation method), a transfer method, a printing method, an inkjet method, or a coating method As the hole-transport material or the electron-blocking material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

For the active layer, a high molecular compound such as poly[[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the wavelength range. In this case, the third material may be a low molecular compound or a high molecular compound.

The above is the description of the light-receiving device.

The structures, configurations, methods, and the like described in this embodiment can be used in combination as appropriate with the structures, configurations, methods, and the like described in the other embodiments.

Embodiment 6

In this embodiment, a structure example of a display apparatus that can be used as the display apparatus of one embodiment of the present invention will be described.

The display apparatus of this embodiment can be a high-definition display apparatus or a large-sized display apparatus. Accordingly, the display apparatus of this embodiment can be used for display portions of electronic devices such as a digital camera, a digital video camera, a digital photo frame, a mobile phone, a portable game console, a smartphone, a wristwatch terminal, a tablet terminal, a portable information terminal, and an audio reproducing device, in addition to display portions of electronic devices with a relatively large screen, such as a television device, a desktop or notebook personal computer, a monitor of a computer or the like, digital signage, and a large game machine such as a pachinko machine.

Figures 34A, 34B, 34C:
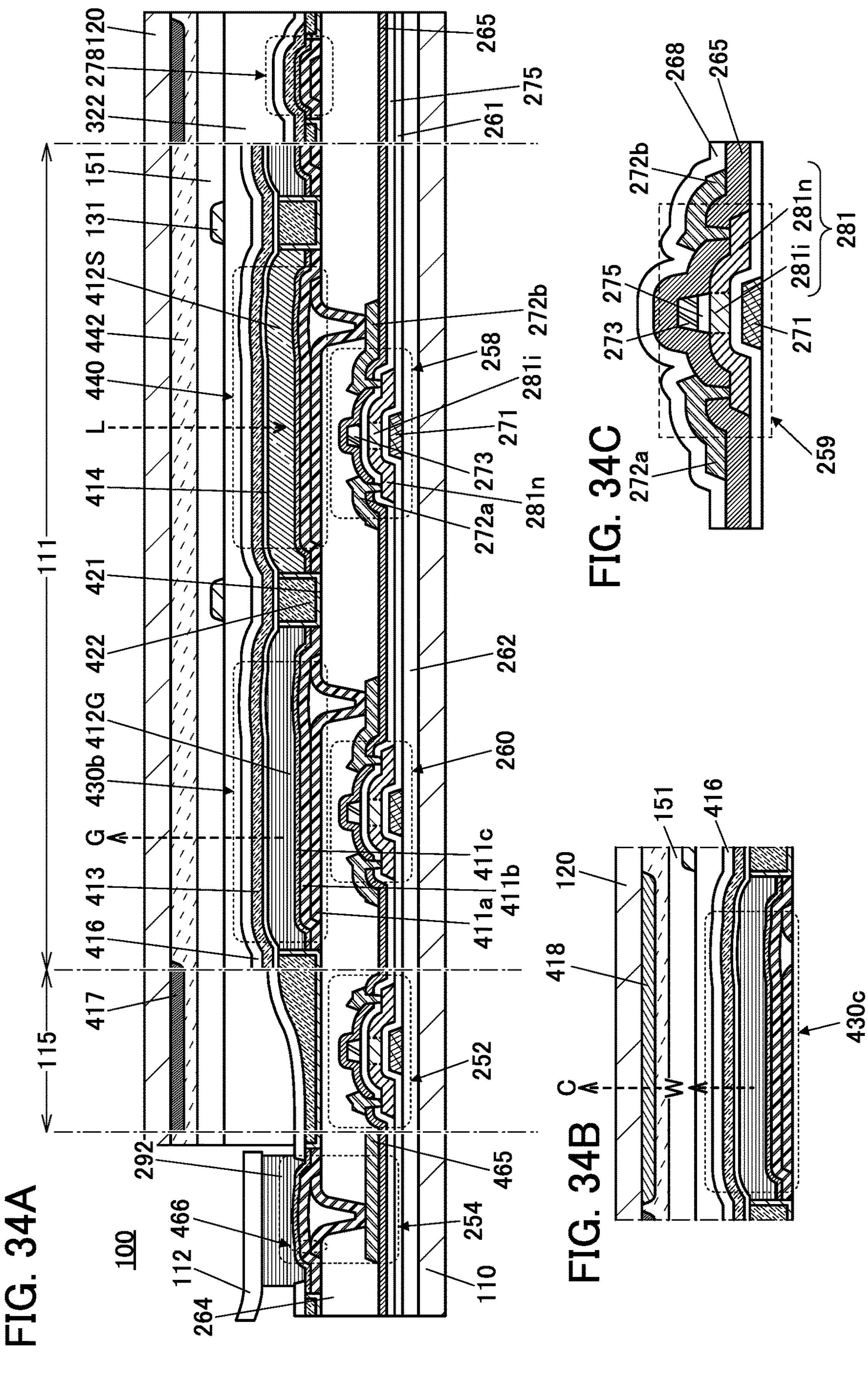
FIG. 34A and FIG. 34B are diagrams illustrating structure examples of a display apparatus.
FIG. 34C is a diagram illustrating a structure example of a transistor.

FIG. 34A illustrates an example of cross sections of part of a region including the FPC 112, part of the circuit 115, part of the display portion 111, and part of a region including a connection portion in the display apparatus 100 illustrated in FIG. 2. FIG. 34A specifically illustrates an example of a cross section of a region including a light-emitting device 430*b* emitting green light (G) and a light-receiving device 440 receiving reflected light (L) in the display portion 111.

The display apparatus 100 illustrated in FIG. 34A includes a transistor 252, a transistor 260, a transistor 258, the light-emitting device 430*b*, the light-receiving device 440, and the like between the substrate 110 and the substrate 120. Note that in the case where the display apparatus 100 does not include the light receiving-device, the light-emitting device is provided at the position of the light-receiving device 440.

The light-emitting device and the light-receiving device described in other embodiments as an example can be used as the light-emitting device 430*b* and the light-receiving device 440, respectively.

Here, in the case where the pixel of the display apparatus includes three kinds of subpixels including light-emitting devices that emit light of different colors, as the three subpixels, subpixels of three colors of red (R), green (G), and blue (B), subpixels of three colors of yellow (Y), cyan (C), and magenta (M), and the like can be given. In the case where the pixel includes four subpixels each including a light-emitting device, as the four subpixels, subpixels of four colors of R, G, B, and white (W), subpixels of four colors of R, G, B, and Y, and the like can be given. Alternatively, the subpixel may include a light-emitting device emitting infrared light.

As the light-receiving device 440, a photoelectric conversion element having sensitivity to light in a red, green, or blue wavelength range or a photoelectric conversion element having sensitivity to light in an infrared wavelength range can be used.

The substrate 120 and the layer 151 are attached to each other with an adhesive layer 442. The conductive layer 131 functioning as an antenna is provided in a position not overlapping with the light-emitting device or the light-receiving device in the layer 151. Note that the conductive layer 132 not functioning as an antenna (see FIG. 7A) is provided in that position in some cases. The adhesive layer 442 is provided to overlap with the light-emitting device 430*b* and the light-receiving device 440 with the layer 151 and the planarization film 322 therebetween, and the display apparatus 100 employs a solid sealing structure. The substrate 120 is provided with a light-blocking layer 417.

The light-emitting device 430*b* and the light-receiving device 440 each include a conductive layer 411*a*, a conductive layer 411*b*, and a conductive layer 411*c* as a pixel electrode. The conductive layer 411*b* has a property of reflecting visible light and functions as a reflective electrode. The conductive layer 411*c* has a property of transmitting visible light and functions as an optical adjustment layer.

The conductive layer 411*a* included in the light-emitting device 430*b* is connected to a conductive layer 272*b* included in the transistor 260 through an opening provided in an insulating layer 264. The transistor 260 has a function of controlling driving of the light-emitting device. The conductive layer 411*a* included in the light-receiving device

440 is electrically connected to the conductive layer 272*b* included in the transistor 258. The transistor 258 has a function of controlling, for example, the timing of light exposure using the light-receiving device 440.

An EL layer 412G or a photoelectric conversion layer 412S is provided to cover the pixel electrode. An insulating layer 421 is provided in contact with a side surface of the EL layer 412G and a side surface of the photoelectric conversion layer 412S, and a resin layer 422 is provided to fill a concave portion of the insulating layer 421. An organic layer 414, a common electrode 413, and a protective layer 416 are provided to cover the EL layer 412G and the photoelectric conversion layer 412S. Providing the protective layer 416 covering the light-emitting device inhibits entry of impurities such as water into the light-emitting device; as a result, the reliability of the light-emitting device can be increased.

The light G from the light-emitting device 430*b* is emitted toward the substrate 120 side. The light-receiving device 440 receives the light L incident through the substrate 120 and converts the light L into an electric signal. For the substrate 120, a material having a high visible-light-transmitting property is preferably used.

Note that in the case where a light-emitting device emits white light, a color filter 418 that converts the white light into light C of a desired color can be provided so as to overlap with a light-emitting device 430*c* emitting white light (light W), as illustrated in FIG. 34B. The color filter 418 can be unnecessary in the case where the white light is emitted toward the substrate 120 side. Although FIG. 34B illustrates an example in which the color filter 418 is formed in contact with the substrate 120, the color filter 418 may be provided over the layer 151, inside the layer 151, or over the protective layer 416.

The transistor 252, the transistor 260, and the transistor 258 are formed over the substrate 110 with an insulating layer 262 therebetween. These transistors can be manufactured using the same material in the same process.

Note that the transistor 252, the transistor 260, and the transistor 258 may be separately formed to have different structures. For example, it is possible to separately form a transistor having a back gate and a transistor having no back gate, or transistors having semiconductors, gate electrodes, gate insulating layers, source electrodes, and drain electrodes that are formed of different materials and/or have different thicknesses.

A connection portion 254 is provided in a region of the substrate 110 that does not overlap with the substrate 120. In the connection portion 254, a wiring 465 is electrically connected to the FPC 112 through a conductive layer 466 and a connection layer 292. The conductive layer 466 can be obtained by processing the same conductive film as the pixel electrode. Thus, the connection portion 254 and the FPC 112 can be electrically connected to each other through the connection layer 292.

Each of the transistor 252, the transistor 260, and the transistor 258 includes a conductive layer 271 functioning as a gate, an insulating layer 261 functioning as a gate insulating layer, a semiconductor layer 281 including a channel formation region 281*i* and a pair of low-resistance regions 281*n*, a conductive layer 272*a* connected to one of the pair of low-resistance regions 281*n*, the conductive layer 272*b* connected to the other of the pair of low-resistance regions 281*n*, an insulating layer 275 functioning as a gate insulating layer, a conductive layer 273 functioning as a gate, and an insulating layer 265 covering the conductive layer 273. The insulating layer 261 is positioned between the conductive layer 271 and the channel formation region 281*i*. The insulating layer 275 is positioned between the conductive layer 273 and the channel formation region 281*i*.

The conductive layer 272*a* and the conductive layer 272*b* are connected to the corresponding low-resistance regions 281*n* through openings provided in the insulating layer 265. One of the conductive layer 272*a* and the conductive layer 272*b* functions as a source, and the other functions as a drain.

FIG. 34A illustrates an example in which the insulating layer 275 covers a top surface and a side surface of the semiconductor layer. The conductive layer 272*a* and the conductive layer 272*b* are connected to the corresponding low-resistance regions 281*n* through openings provided in the insulating layer 275 and the insulating layer 265.

Meanwhile, in a transistor 259 illustrated in FIG. 34C, the insulating layer 275 overlaps with the channel formation region 281*i* of the semiconductor layer 281 and does not overlap with the low-resistance regions 281*n*. The structure illustrated in FIG. 34C can be manufactured by processing the insulating layer 275 using the conductive layer 273 as a mask, for example. In FIG. 34C, the insulating layer 265 is provided to cover the insulating layer 275 and the conductive layer 273, and the conductive layer 272*a* and the conductive layer 272*b* are connected to the corresponding low-resistance regions 281*n* through the openings in the insulating layer 265.

Furthermore, an insulating layer 268 covering the transistor may be provided.

There is no particular limitation on the structure of the transistors included in the display apparatus of this embodiment. For example, a planar transistor, a staggered transistor, an inverted staggered transistor, or the like can be used. A top-gate or a bottom-gate transistor structure may be employed. Alternatively, gates may be provided above and below the semiconductor layer in which a channel is formed.

The structure in which the semiconductor layer where a channel is formed is interposed between two gates is used for the transistor 252, the transistor 260, and the transistor 258. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the semiconductor layer of the transistor, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

The semiconductor layer of the transistor preferably includes a metal oxide (also referred to as an oxide semiconductor). That is, a transistor including a metal oxide in its channel formation region (hereinafter, an OS transistor) is preferably used for the display apparatus of this embodiment.

The band gap of a metal oxide used for the semiconductor layer of the transistor is preferably higher than or equal to 2 eV, further preferably higher than or equal to 2.5 eV. With the use of a metal oxide having a wide band gap, the off-state current of an OS transistor can be reduced. For example, the off-state current value per micrometer of channel width of an OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than that of a Si transistor by approximately ten orders of magnitude.

A metal oxide contains preferably at least indium or zinc and further preferably indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and M is further preferably gallium. Hereinafter, a metal oxide containing indium, M, and zinc is referred to as In-M-Zn oxide in some cases.

When a metal oxide is an In-M-Zn oxide, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio. By increasing the proportion of the number of indium atoms in the metal oxide, the on-state current, field-effect mobility, or the like of the transistor can be improved.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The atomic ratio of In may be less than the atomic ratio of M in the In-M-Zn oxide.

Examples of the atomic ratio of the metal elements in such an In-M-Zn oxide include In:M:Zn=1:3:2 or a composition in the neighborhood thereof, In:M:Zn=1:3:3 or a composition in the neighborhood thereof, and In:M:Zn=1:3:4 or a composition in the neighborhood thereof. By increasing the proportion of the number of M atoms in the metal oxide, the band gap of the In-M-Zn oxide is further increased; thus, the resistance to a negative bias stress test with light irradiation can be improved. Specifically, the amount of change in the threshold voltage or the amount of change in the shift voltage (Vsh) measured in a NBTIS (Negative Bias Temperature Illumination Stress) test of the transistor can be decreased. Note that the shift voltage (Vsh) is defined as Vg at which, in a drain current (Id)-gate voltage (Vg) curve of a transistor, the tangent at a point where the slope of the curve is the steepest intersects the straight line of Id=1 pA.

The display apparatus includes OS transistors and light-emitting devices with an MML (metal maskless) structure, which enables the leakage current that might flow through the transistor and the leakage current that might flow between adjacent light-emitting elements (such leakage current is also referred to as lateral leakage current, side leakage current, or the like) to be very low. With this structure, a viewer can notice any one or more of the image crispness, the image sharpness, a high chroma, and a high contrast ratio in an image displayed on the display apparatus. With the structure where the leakage current that might flow through the transistor and the lateral leakage current that might flow between light-emitting elements are very low, display with little leakage of light at the time of black display (i.e., with few phenomena in which the black image looks whitish) (such display is also referred to as deep black display) can be achieved.

In particular, in the case where a light-emitting device with an MML structure employs the above-described SBS structure, a layer provided between light-emitting elements (for example, also referred to as an organic layer or a common layer which is commonly used between the light-emitting elements) is disconnected; accordingly, display with no or extremely low side leakage can be achieved.

To increase the emission luminance of the light-emitting device included in the pixel circuit, the amount of current fed through the light-emitting device needs to be increased. For this, it is necessary to increase the source-drain voltage of a driving transistor included in the pixel circuit. Since an OS transistor has a higher withstand voltage between the source and the drain than a Si transistor, a high voltage can be applied between the source and the drain of the OS transistor. Accordingly, when an OS transistor is used as the driving transistor included in the pixel circuit, the amount of current flowing through the light-emitting device can be increased, so that the emission luminance of the light-emitting device can be increased.

When transistors operate in a saturation region, a change in source-drain current with respect to a change in gate-source voltage can be smaller in an OS transistor than in a Si transistor. Accordingly, when an OS transistor is used as the driving transistor included in the pixel circuit, the amount of current flowing between the source and the drain can be set minutely by a change in gate-source voltage; hence, the amount of current flowing through the light-emitting device can be controlled. Accordingly, the gray level in the pixel circuit can be increased.

Regarding saturation characteristics of current flowing when transistors operate in a saturation region, an OS transistor can feed more stable current (saturation current) than the Si transistor even when the source-drain voltage gradually increases. Thus, by using an OS transistor as the driving transistor, a stable current can be fed through a light-emitting device that contains an EL material even when the current-voltage characteristics of the light-emitting device vary, for example. In other words, when the OS transistor operates in the saturation region, the source-drain current hardly changes with an increase in the source-drain voltage; hence, the emission luminance of the light-emitting device can be stable.

As described above, the use of the OS transistor as the driving transistor included in the pixel circuit enables “inhibition of black floating”, “an increase in emission luminance”, “an increase in gray levels”, “inhibition of variation in the light-emitting device”, and the like.

Alternatively, the semiconductor layer of the transistor may contain silicon. Examples of silicon include amorphous silicon and crystalline silicon (e.g., low-temperature polysilicon (also referred to as LTPS) or single crystal silicon).

In particular, low-temperature polysilicon (LTPS) has relatively high mobility and can be formed over a glass substrate, and thus can be suitably used for a display apparatus. For example, a transistor including low-temperature polysilicon (LTPS) in a semiconductor layer can be used as the transistor 252 and the like included in the driver circuit, and a transistor including an oxide semiconductor in a semiconductor layer can be used as the transistor 260, the transistor 258, and the like provided for the pixel. By using both an LTPS transistor and an OS transistor, a display panel with low power consumption and high drive capability can be obtained. Furthermore, a structure in which an LTPS transistor and an OS transistor are combined is referred to as LTPO in some cases.

Alternatively, a semiconductor layer of a transistor may contain a layered substance that functions as a semiconductor. The layered substance is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered substance include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

The transistor included in the circuit 115 and the transistor included in the display portion 111 may have the same structure or different structures. A plurality of transistors included in the circuit 115 may have the same structure or two or more kinds of structures. Similarly, a plurality of transistors included in the display portion 111 may have the same structure or two or more kinds of structures.

A material through which impurities such as water and hydrogen do not easily diffuse is preferably used for at least one of the insulating layers covering the transistors. This allows the insulating layer to function as a barrier layer. Such a structure can effectively inhibit diffusion of impurities into the transistors from the outside and increase the reliability of a display apparatus.

An inorganic insulating film is preferably used as each of the insulating layer 261, the insulating layer 262, the insulating layer 265, the insulating layer 268, and the insulating layer 275. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above inorganic insulating films may also be used.

Here, an organic insulating film often has a lower barrier property than an inorganic insulating film. Therefore, the organic insulating film preferably has an opening in the vicinity of an end portion of the display apparatus 100. This can inhibit entry of impurities from the end portion of the display apparatus 100 through the organic insulating film. Alternatively, the organic insulating film may be formed such that its end portion is positioned on the inner side compared to the end portion of the display apparatus 100, to prevent the organic insulating film from being exposed at the end portion of the display apparatus 100.

An organic insulating film is suitable for the insulating layer 264 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

The light-blocking layer 417 is preferably provided on a surface of the substrate 120 on the substrate 110 side. A variety of optical members can be arranged on the outer side of the substrate 120. Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film suppressing the attachment of stain, a hard coat film inhibiting generation of a scratch caused by the use, an impact-absorbing layer, or the like may be provided on the outer surface of the substrate 120.

FIG. 34A illustrates a connection portion 278. In the connection portion 278, the common electrode 413 is electrically connected to a wiring. FIG. 34A illustrates an example of the case in which the wiring has the same stacked-layer structure as the pixel electrode.

For each of the substrate 110 and the substrate 120, glass, quartz, ceramics, sapphire, a resin, a metal, an alloy, a semiconductor, or the like can be used. The substrate on the side from which light from the light-emitting device is extracted is formed using a material which transmits the light. When the substrate 110 and the substrate 120 are formed using a flexible material, the flexibility of the display apparatus can be increased. Furthermore, a polarizing plate may be used as the substrate 110 or the substrate 120. In the case where a flexible material is used for the substrate 110, an adhesive layer may be provided between the substrate 110 and the insulating layer 262.

For each of the substrate 110 and the substrate 120, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 110 and the substrate 120.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the films having high optical isotropy include a triacetyl cellulose (TAC, also referred to as cellulose triacetate) film, a cycloolefin polymer (COP) film, a cycloolefin copolymer (COC) film, and an acrylic resin film.

When a film is used for the substrate and the film absorbs water, the shape of a display panel might be changed, e.g., creases are generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

As the adhesive layer, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable. A two-component-mixture-type resin may be used. An adhesive sheet or the like may be used.

As the connection layer 292, an anisotropic conductive film (ACF), an anisotropic conductive paste (ACP), or the like can be used.

Examples of materials that can be used for a gate, a source, and a drain of a transistor and conductive layers such as a variety of wirings and electrodes included in a display apparatus include metals such as aluminum, titanium, chromium, nickel, copper, yttrium, zirconium, molybdenum, silver, tantalum, and tungsten, and an alloy containing any of these metals as its main component. A film containing any of these materials can be used in a single layer or as a stacked-layer structure.

For a conductive material having a light-transmitting property, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked film of any of the above materials can be used as a conductive layer. For example, a stacked film of indium tin oxide and an alloy of silver and magnesium, or the like is preferably used for increased conductivity. These materials can also be used, for example, for the conductive layers such as a variety of wirings and electrodes included in a display apparatus, and conductive layers (conductive layers functioning as a pixel electrode and a common electrode) included in the light-emitting device.

For an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

Note that the structure illustrated in FIG. 34A is particularly suitable for small display apparatuses used for information terminals such as smartphones and large display apparatuses used for televisions, digital signage, and the like. For example, the structure illustrated in FIG. 34A can be suitably used for a display apparatus having a diagonal screen size of approximately 2 inches to 100 inches.

One embodiment of the present invention can also be applied to smaller display apparatuses. For example, one embodiment of the present invention can be applied to small display apparatuses with a diagonal smaller than 2 inches that are used in glasses-type and goggles-type electronic devices for virtual reality (VR), augmented reality (AR), and the like.

Figure 35A:
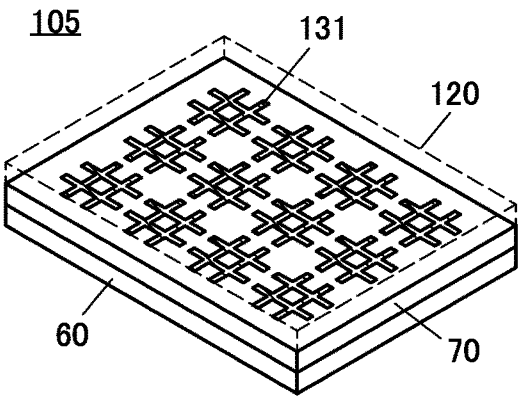
FIG. 35A to FIG. 35D are diagrams illustrating structure examples of a display apparatus.
Figure 35B:
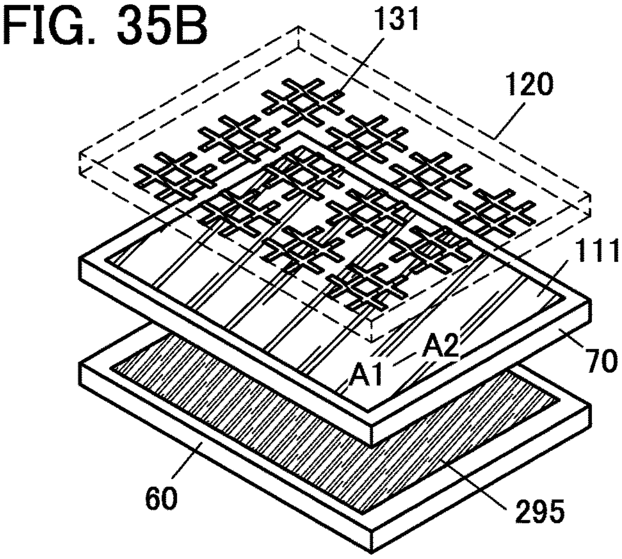

FIG. 35A is a schematic view of a display apparatus 105 which is one example of the above-described small display apparatuses, and FIG. 35B is a development view thereof. The display apparatus 105 includes a layer 70 between a substrate 60 and the substrate 120. The substrate 60 is a semiconductor substrate such as a single crystal silicon substrate and can be provided with a circuit 295 including one or more of a pixel circuit, a driver circuit of a pixel, a memory circuit, a central processing unit, and the like. In the layer 70, the pixel circuit and the display element included in the display portion 111, the conductive layer 131 functioning as the antenna of one embodiment of the present invention, and the like can be provided.

Figure 35C:
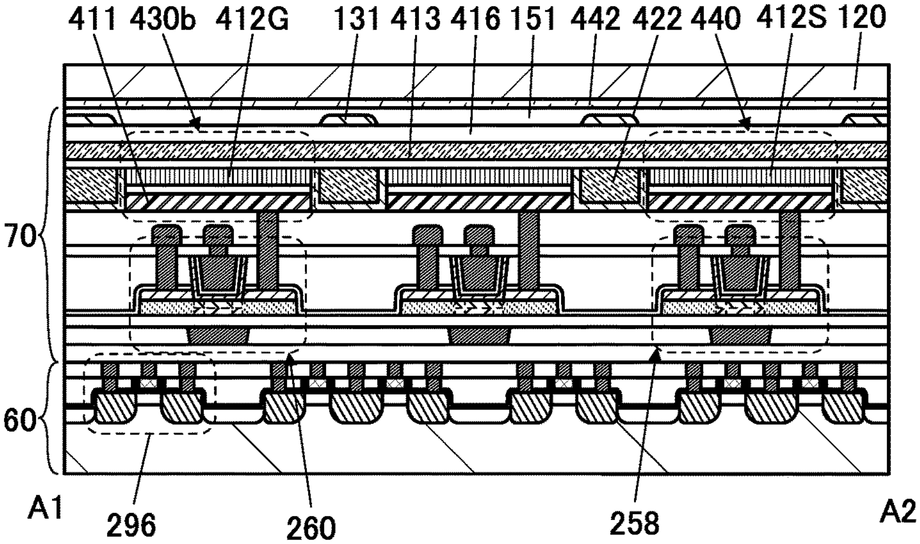

FIG. 35C illustrates a structure example of the display apparatus 105. FIG. 36C is a cross-sectional view of a region along A1-A2 in FIG. 36B. Note that the same components as those in FIG. 34A are denoted by the same reference numerals and the description thereof is omitted. The substrate 60 includes a Si transistor 296 for forming the circuit 295. The layer 70 includes an OS transistor and a display element that are included in the pixel circuit, an antenna, and the like.

By stacking the substrate 60 and the layer 70 in this manner, the pixel circuit and the circuit 295 including the driver circuit and the like can be stacked, so that a display apparatus with a narrow frame can be formed. Furthermore, a wiring connecting the pixel circuit to the driver circuit and the like can be shortened with this structure and thus the wiring resistance and the wiring capacitance can be reduced, so that the display apparatus with high speed and low power consumption can be formed.

Figure 35D:
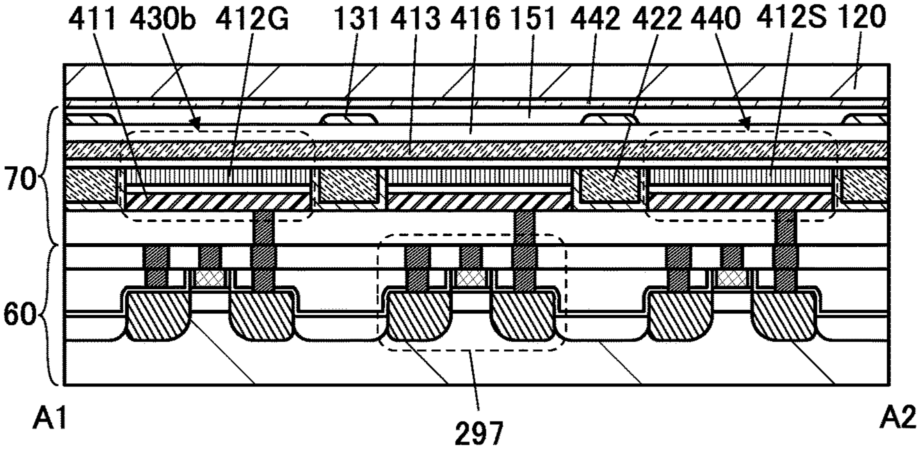

Note that the OS transistor is not necessarily provided in the layer 70 as illustrated in FIG. 35D. In this case, a structure can be employed in which the display element, the antenna, and the like are provided in the layer 70 and the Si transistor 297 included in the pixel circuit is provided in the substrate 60.

The structures, configurations, methods, and the like described in this embodiment can be used in combination as appropriate with the structures, configurations, methods, and the like described in the other embodiments.

Embodiment 7

In this embodiment, an example of a display apparatus including the light-receiving device of one embodiment of the present invention or the like will be described.

In the display apparatus of this embodiment, a plurality of kinds of subpixels including light-emitting devices that emit light of different colors can be included in a pixel. For example, the pixel can include three kinds of subpixels. As the three subpixels, subpixels of three colors of red (R), green (G), and blue (B), subpixels of three colors of yellow (Y), cyan (C), and magenta (M), and the like can be given. Alternatively, the pixel can include four kinds of subpixels. As the four subpixels, subpixels of four colors of R, G, B, and white (W), subpixels of four colors of R, G, B, and Y, and the like can be given.

There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of a top surface shape of the subpixel include polygons such as a triangle, a tetragon (including a rectangle and a square), and a pentagon; polygons with rounded corners; an ellipse; and a circle. Here, the top surface shape of the subpixel corresponds to a top surface shape of a light-emitting region of the light-emitting device.

In the display apparatus including the light-emitting device and the light-receiving device in the pixel, the pixel has a light-receiving function, which enables sensing of a touch or approach of an object while an image is displayed. For example, an image can be displayed by using all the subpixels included in the display apparatus; or light can be emitted by some of the subpixels as a light source and an image can be displayed by using the remaining subpixels.

Figure 36A:
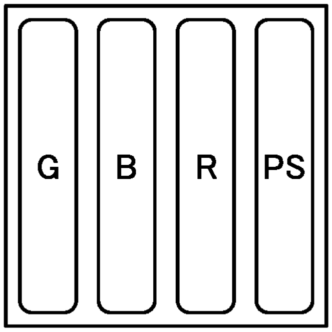
FIG. 36A to FIG. 36F are diagrams illustrating examples of a pixel.
Figure 36B:
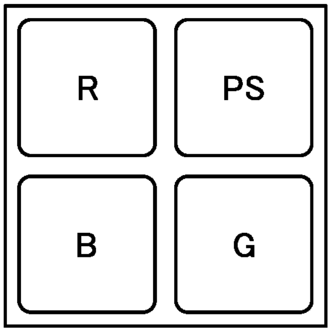
Figure 36C:
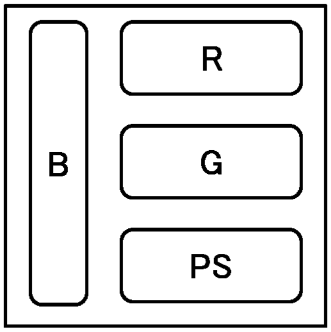

Pixels illustrated in FIG. 36A, FIG. 36B, and FIG. 36C each include a subpixel G, a subpixel B, a subpixel R, and a subpixel PS.

The pixel illustrated in FIG. 36A employs stripe arrangement. The pixel illustrated in FIG. 36B employs matrix arrangement.

The pixel arrangement illustrated in FIG. 36C has a structure in which three subpixels (the subpixel R, the subpixel G, and the subpixel S) are vertically arranged next to one subpixel (the subpixel B).

Figure 36D:
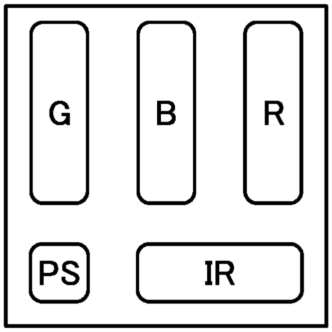
Figure 36E:
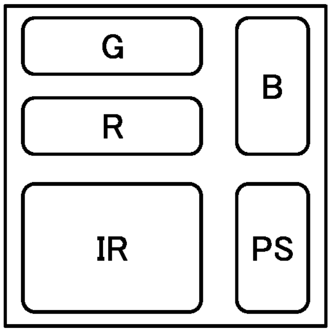
Figure 36F:
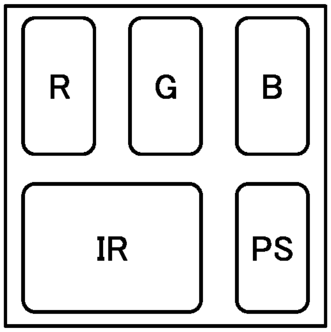

Pixels illustrated in FIG. 36D, FIG. 36E, and FIG. 36F each include the subpixel G, the subpixel B, the subpixel R, a subpixel IR, and the subpixel PS.

FIG. 36D, FIG. 36E, and FIG. 36F illustrate examples in which one pixel is provided in two rows. Three subpixels (the subpixel G, the subpixel B, and the subpixel R) are provided in the upper row (first row), and two subpixels (one subpixel PS and one subpixel IR) are provided in the lower row (second row).

In FIG. 36D, the three vertically oriented subpixel G, subpixel B, and subpixel R are arranged laterally, and the subpixel PS and the horizontally oriented subpixel IR are arranged laterally below the three subpixels. In FIG. 36E, the two horizontally oriented subpixel G and subpixel R are arranged in the vertical direction; the vertically oriented subpixel B is arranged laterally next to the subpixels G and R; and the horizontally oriented subpixel IR and the vertically oriented subpixel PS are arranged laterally below the subpixels R, G, and B. In FIG. 36F, the three vertically oriented subpixel R, subpixel G, and subpixel B are arranged laterally, and the horizontally oriented subpixel IR and the vertically oriented subpixel PS are arranged laterally below the subpixels R, G, and B. In FIG. 36E and FIG. 36F, the area of the subpixel IR is the largest, and the area of the subpixel PS is substantially the same as that of the subpixel and the like.

Note that the layout of the subpixels is not limited to the structures in FIG. 36A to FIG. 36F.

The subpixel R includes a light-emitting device that emits red light. The subpixel G includes a light-emitting device that emits green light. The subpixel B includes a light-emitting device that emits blue light. The subpixel IR includes a light-emitting device that emits infrared light. The subpixel PS includes a light-receiving device. The wavelength of light sensed by the subpixel PS is not particularly limited; however, the light-receiving device included in the subpixel PS preferably has sensitivity to light emitted by the light-emitting device included in the subpixel R, the subpixel G, the subpixel B, or the subpixel IR. For example, the light-receiving device preferably senses one or more of light in blue, violet, bluish violet, green, yellowish green, yellow, orange, red, and infrared wavelength ranges, for example.

The light-receiving area of the subpixel PS is smaller than the light-emitting areas of the other subpixels. A smaller light-receiving area leads to a narrower image-capturing range, inhibits a blur in a captured image, and improves the definition. Thus, by using the subpixel PS, high-resolution or high-definition image capturing is possible. For example, image capturing for personal authentication with the use of a fingerprint, a palm print, the iris, the shape of a blood vessel (including the shape of a vein and the shape of an artery), a face, or the like is possible by using the subpixel PS.

Moreover, the subpixel PS can be used in a touch sensor (also referred to as a direct touch sensor), a near touch sensor (also referred to as a hover sensor, a hover touch sensor, a contactless sensor, or a touchless sensor), or the like. For example, the subpixel PS preferably senses infrared light. Thus, touch sensing is possible even in a dark place.

Here, the touch sensor or the near touch sensor can sense an approach or contact of an object (e.g., a finger, a hand, or a pen). The touch sensor can sense the object when the display apparatus and the object come in direct contact with each other. Furthermore, the near touch sensor can sense the object even when the object is not in contact with the display apparatus. For example, the display apparatus is preferably capable of sensing an object positioned in the range of 0.1 mm to 300 mm inclusive, further preferably 3 mm to 50 mm inclusive from the display apparatus. This structure enables the display apparatus to be operated without direct contact of an object; in other words, the display apparatus can be operated in a contactless (touchless) manner. With the above-described structure, the display apparatus can be operated with a reduced risk of making the display apparatus dirty or damaging the display apparatus or without the object directly touching a dirt (e.g., dust, or a virus) attached to the display apparatus.

For high-resolution image capturing, the subpixel PS is preferably provided in every pixel included in the display apparatus. Meanwhile, in the case where the subpixel PS is used in a touch sensor, a near touch sensor, or the like, high accuracy is not required as compared to the case of capturing an image of a fingerprint or the like; accordingly, the subpixel PS may be provided in some pixels in the display apparatus. When the number of subpixels PS included in the display apparatus is smaller than the number of subpixels R or the like, higher sensing speed can be achieved.

The display apparatus may have a function of changing the refresh rate. For example, the refresh rate is adjusted (in the range from 0.01 Hz to 240 Hz, for example) in accordance with contents displayed on the display apparatus, whereby power consumption can be reduced.

Moreover, driving with a lowered refresh rate that enables the power consumption of the display apparatus may be referred to as idling stop (IDS) driving.

In addition, the drive frequency of a touch sensor or a near touch sensor may be changed depending on the above refresh rate. In the case where the refresh rate of the display apparatus is 120 Hz, for example, the drive frequency of a touch sensor or a near touch sensor can be higher than 120 Hz (typically 240 Hz). With this structure, low power consumption can be achieved and the response speed of the touch sensor or the near touch sensor can be increased.

Figure 36G:
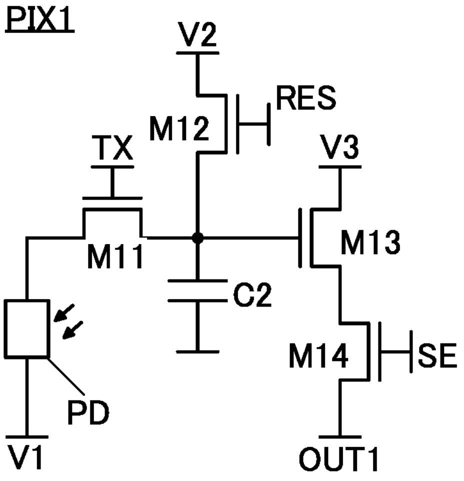
FIG. 36G and FIG. 36H are diagrams illustrating examples of circuits of a pixel.
Figure 36H:
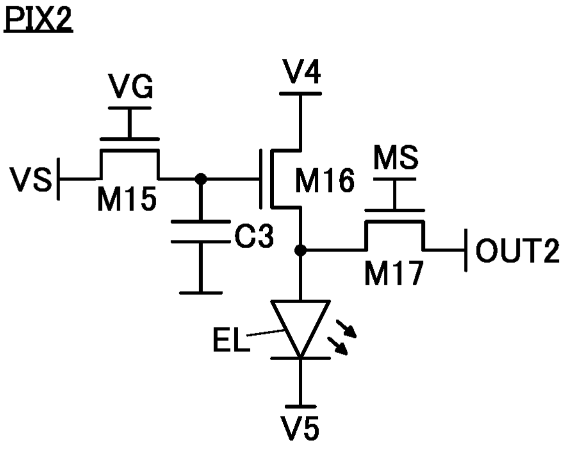

FIG. 36G illustrates an example of the pixel circuit of the subpixel including a light-receiving device. FIG. 36H illustrates an example of the pixel circuit of the subpixel including a light-emitting device.

A pixel circuit PIX1 illustrated in FIG. 36G includes a light-receiving device PD, a transistor M11, a transistor M12, a transistor M13, a transistor M14, and a capacitor C2. Here, a photodiode is used as an example of the light-receiving device PD.

An anode of the light-receiving device PD is electrically connected to a wiring V1, and a cathode of the light-receiving device PD is electrically connected to one of a source and a drain of the transistor M11. Alternatively, the cathode of the light-receiving device PD may be electrically connected to the wiring V1 and the anode of the light-receiving device PD may be electrically connected to one of the source and the drain of the transistor M11.

A gate of the transistor M11 is electrically connected to a wiring TX, and the other of the source and the drain of the transistor M11 is electrically connected to one electrode of the capacitor C2, one of a source and a drain of the transistor M12, and a gate of the transistor M13. A gate of the transistor M12 is electrically connected to a wiring RES, and the other of the source and the drain of the transistor M12 is electrically connected to a wiring V2. One of a source and a drain of the transistor M13 is electrically connected to a wiring V3, and the other of the source and the drain of the transistor M13 is electrically connected to one of a source and a drain of the transistor M14. A gate of the transistor M14 is electrically connected to a wiring SE, and the other of the source and the drain of the transistor M14 is electrically connected to a wiring OUT1.

A constant potential is supplied to each of the wiring V1, the wiring V2, and the wiring V3. When the anode of the light-receiving device PD is electrically connected to the wiring V1, in the case where the light-receiving device PD is driven with a reverse bias, the wiring V2 is supplied with a potential higher than the potential of the wiring V1. When the cathode of the light-receiving device PD is electrically connected to the wiring V1, in the case where the light-receiving device PD is driven with a reverse bias, the wiring V1 is supplied with a potential higher than the potential of the wiring V2.

The transistor M12 is controlled by a signal supplied to the wiring RES and has a function of resetting the potential of a node connected to the gate of the transistor M13 to a potential supplied to the wiring V2. The transistor M11 is controlled by a signal supplied to the wiring TX and has a function of controlling the timing at which the potential of the node changes, in accordance with a current flowing through the light-receiving device PD. The transistor M13 functions as an amplifier transistor for performing output corresponding to the potential of the node. The transistor M14 is controlled by a signal supplied to the wiring SE and functions as a selection transistor for making an external circuit connected to the wiring OUT1 read the output corresponding to the potential of the node.

A pixel circuit PIX2 illustrated in FIG. 36H includes a light-emitting device EL, a transistor M15, a transistor M16, a transistor M17, and a capacitor C3. Here, a light-emitting diode is used as an example of the light-emitting device EL. In particular, an organic EL element is preferably used as the light-emitting device EL.

A gate of the transistor M15 is electrically connected to a wiring VG, one of a source and a drain of the transistor M15 is electrically connected to a wiring VS, and the other of the source and the drain of the transistor M15 is electrically connected to one electrode of the capacitor C3 and a gate of the transistor M16. One of a source and a drain of the transistor M16 is electrically connected to a wiring V4, and the other of the source and the drain of the transistor M16 is electrically connected to an anode of the light-emitting device EL and one of a source and a drain of the transistor M17. A gate of the transistor M17 is electrically connected to a wiring MS, and the other of the source and the drain of the transistor M17 is electrically connected to a wiring OUT2. A cathode of the light-emitting device EL is electrically connected to a wiring V5.

A constant potential is supplied to each of the wiring V4 and the wiring V5. The anode side of the light-emitting device EL can be set to a high potential, and the cathode side thereof can be set to a lower potential than the anode side. The transistor M15 is controlled by a signal supplied to the wiring VG and functions as a selection transistor for controlling a selection state of the pixel circuit PIX2. The transistor M16 functions as a driving transistor that controls a current flowing through the light-emitting device EL in accordance with a potential supplied to the gate of the transistor M16. When the transistor M15 is in a conduction state, a potential supplied to the wiring VS is supplied to the gate of the transistor M16, and the luminance of the light-emitting device EL can be controlled in accordance with the potential. The transistor M17 is controlled by a signal supplied to the wiring MS and has a function of outputting a potential between the transistor M16 and the light-emitting device EL to the outside through the wiring OUT2.

Here, transistors in which a metal oxide (an oxide semiconductor) is used in a semiconductor layer where a channel is formed are preferably used as the transistor M11, the transistor M12, the transistor M13, and the transistor M14 included in the pixel circuit PIX1 and the transistor M15, the transistor M16, and the transistor M17 included in the pixel circuit PIX2.

A transistor using a metal oxide having a wider band gap and a lower carrier density than silicon achieves an extremely low off-state current. Therefore, owing to the low off-state current, charge accumulated in a capacitor that is connected in series to the transistor can be retained for a longtime. Hence, it is particularly preferable to use transistors including an oxide semiconductor as the transistor M11, the transistor M12, and the transistor M15 each of which is connected in series with the capacitor C2 or the capacitor C3. When the other transistors also include an oxide semiconductor, the manufacturing cost can be reduced.

Alternatively, transistors using silicon as a semiconductor in which a channel is formed can be used as the transistor M11 to the transistor M17. It is particularly preferable to use silicon with high crystallinity, such as single crystal silicon or polycrystalline silicon, because high field-effect mobility can be achieved and higher-speed operation can be performed.

Alternatively, a transistor using an oxide semiconductor may be used as one or more of the transistor M11 to the transistor M17, and transistors using silicon may be used as the other transistors.

Although n-channel transistors are illustrated in FIG. 36G and FIG. 36H, p-channel transistors can alternatively be used.

The transistors included in the pixel circuit PIX1 and the transistors included in the pixel circuit PIX2 are preferably formed side by side over the same substrate. It is particularly preferable that the transistors included in the pixel circuit PIX1 and the transistors included in the pixel circuit PIX2 be periodically arranged in one region.

One or more layers including one or both of the transistor and the capacitor are preferably provided at a position overlapping with the light-receiving device PD or the light-emitting device EL. Thus, the effective area occupied by each pixel circuit can be reduced, and a high-resolution light-receiving portion or display portion can be achieved.

The structures, configurations, methods, and the like described in this embodiment can be used in combination as appropriate with the structures, configurations, methods, and the like described in the other embodiments.

Embodiment 8

In this embodiment, a structure of a touch panel that can be used in the display apparatus of one embodiment of the present invention will be described with reference to FIG. 37.

Figure 37:
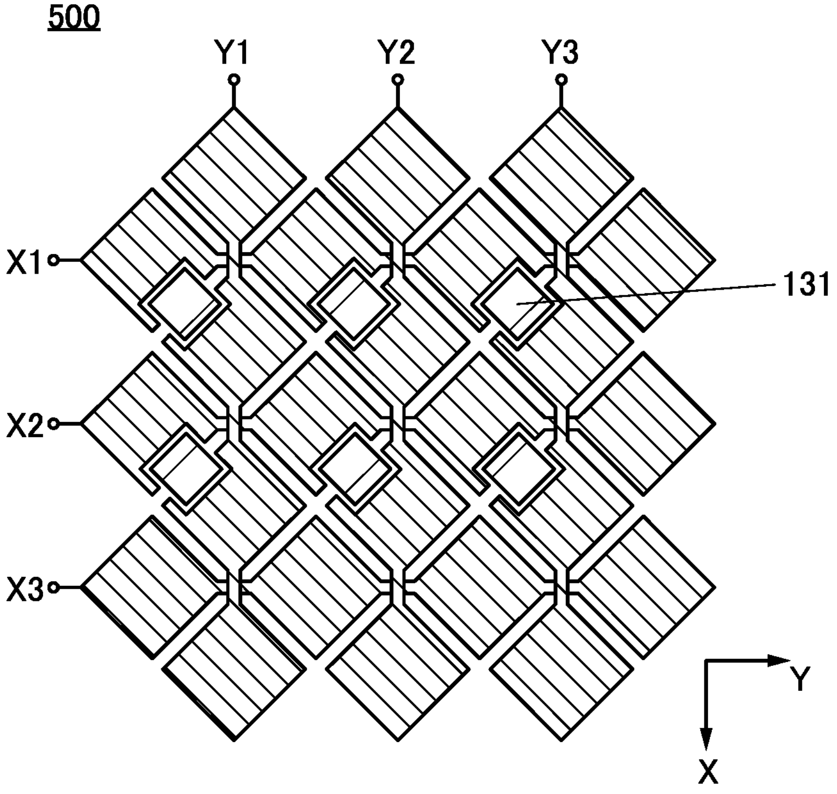

FIG. 37 is a top view of a touch panel 500. Note that FIG. 37 illustrates main components for simplicity. Conductive layers are illustrated as electrodes with a hatching pattern in FIG. 37; however, the conductive layers each have an opening in a region overlapping with a pixel, in a similar manner to FIG. 7A. Thus, the conductive layers illustrated in FIG. 37 have a light-transmitting property.

The touch panel 500 includes conductive layers X1 to X3 functioning as electrodes provided in the X-direction and conductive layers Y1 to Y3 functioning as electrodes provided in the Y-direction, for example, in addition to the conductive layer 131 functioning as the antenna 130 described in Embodiment 1.

The conductive layers X1 to X3 and the conductive layers Y1 to Y3 are arranged so as to fill gaps between 131 functioning as the antennas 130 that are provided at regular intervals. With this structure, the area of a region where the conductive layer is not provided can be reduced, which enables unevenness in transmittance to be reduced and the substrate 120 side to have the touch sensor function. The frequency of a signal used in the touch sensor is different from the frequency of a signal used in wireless communication; thus, the signals can be distinguished from each other.

As illustrated in FIG. 37, a plurality of conductive layers functioning as antennas can be placed between the conductive layers X1 to X3 and the conductive layers Y1 to Y3 functioning as the electrodes of the touch panel; thus, antennas with different shapes or different sizes can be provided. This enables radio signals with different frequencies to be transmitted or received. In addition, since a plurality of antennas with the same shape and the same size can be placed, beamforming technology with the antennas placed in an array can be used. Since the beamforming technology enables antenna directionality, the beamforming technology can compensate for radio wave propagation loss caused when communication frequency increases.

Although FIG. 37 illustrates the structure in which the conductive layers 131 in a square shape are arranged in a regular pattern, one embodiment of the present invention is not limited thereto. The shape of the conductive layers 131 may be a circle, a triangle, a pentagon, a hexagon, an octagon, or the like, for example.

The conductive layers X1 to X3 and the conductive layers Y1 to Y3 functioning as electrodes of the touch panel function as electrodes of a capacitive touch sensor, for example. Examples of the capacitive touch sensor include a surface capacitive touch sensor and a projected capacitive touch sensor. Examples of the projected capacitive touch sensor include a self-capacitive touch sensor and a mutual-capacitive touch sensor, which differ mainly in the driving method. The use of a mutual-capacitive touch sensor is preferable because multiple points can be sensed simultaneously.

In the case of a projected self-capacitive touch sensor, a pulse voltage is applied to each of the conductive layers X1 to X3 and the conductive layers Y1 to Y3 so that they are scanned, and the value of a current flowing in themselves is detected. The amount of current is changed when an object to be detected approaches, and therefore, positional information of the object to be detected can be obtained by detecting the difference between the values. In the case of a projected mutual-capacitive touch sensor, a pulse voltage is applied to the conductive layers X1 to X3 or the conductive layers Y1 to Y3 so that either one of the conductive layers X1 to X3 or the conductive layers Y1 or Y3 are scanned, and a current flowing in the other is detected to obtain positional information of the object to be detected.

Note that in a portion where the conductive layers X1 to X3 and the conductive layers Y1 to Y3 intersect with each other, a connection is preferably made through a conductive layer provided in another layer. The area of the portion where the conductive layers X1 to X3 and the conductive layers Y1 to Y3 intersect with each other is preferably as small as possible.

In the case of a projected self-capacitive touch sensor, a pulse voltage is applied to each of the conductive layers X1 to X3 and the conductive layers Y1 to Y3 so that they are scanned, and the value of a current flowing in themselves is detected. The amount of current is changed when an object to be detected approaches, and therefore, positional information of the object to be detected can be obtained by detecting the difference between the values. In the case of a projected mutual-capacitive touch sensor, a pulse voltage is applied to the conductive layers X1 to X3 or the conductive layers Y1 to Y3 so that either one of the conductive layers X1 to X3 or the conductive layers Y1 or Y3 are scanned, and a current flowing in the other is detected to enable positional information of the object to be detected to be obtained.

The structures, configurations, methods, and the like described in this embodiment can be used in combination as appropriate with the structures, configurations, methods, and the like described in the other embodiments.

Embodiment 9

In this embodiment, examples of an electronic device including the above display apparatus will be described with reference to FIG. 38A to FIG. 38F.

Examples of electronic devices including the display apparatus of one embodiment of the present invention include display apparatuses of televisions, monitors, and the like; lighting devices; desktop or laptop personal computers; word processors; image reproduction devices that reproduce still images and moving images stored in recording media such as DVD (Digital Versatile Disc); portable CD players; radios; tape recorders; headphone stereos; stereos; table clocks; wall clocks; cordless phone handsets; transceivers; mobile phones; car phones; portable game machines; tablet terminals; large-sized game machines such as pachinko machines; calculators; portable information terminals; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as chain saws; smoke detectors; and medical equipment such as dialyzers. Other examples include industrial equipment such as guide lights, traffic lights, conveyor belts, elevators, escalators, industrial robots, power storage systems, and power storage devices for leveling the amount of power supply and smart grid.

In addition, moving objects and the like driven by electric motors using electric power from the power storage devices are also included in the category of electronic devices. Examples of the moving objects include electric vehicles (EVs), hybrid electric vehicles (HVs) that include both an internal-combustion engine and a motor, plug-in hybrid electric vehicles (PHVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The display apparatus of one embodiment of the present invention can be used for display portions and communication devices in any of the electronic devices.

The electronic devices may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), for example.

The electronic device can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

FIG. 38A to FIG. 38F illustrate examples of electronic devices.

Figure 38A:
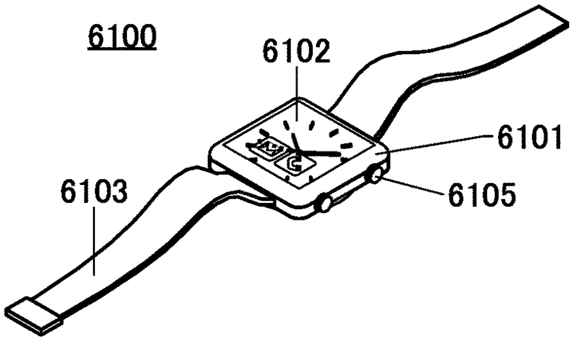
FIG. 38A to FIG. 38F are diagrams illustrating structure examples of electronic devices.

FIG. 38A illustrates an example of a watch-type portable information terminal. A portable information terminal 6100 includes a housing 6101, a display portion 6102, a band 6103, operation buttons 6105, and the like. The use of the display apparatus of one embodiment of the present invention in the display portion 6102 enables downsizing of the portable information terminal 6100.

Figure 38B:
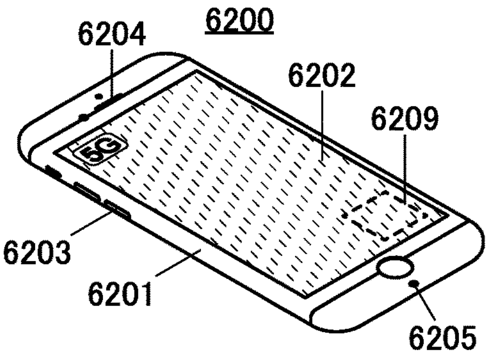

FIG. 38B illustrates an example of a portable telephone. A portable information terminal 6200 includes a display portion 6202 incorporated in a housing 6201, operation buttons 6203, a speaker 6204, a microphone 6205, and the like.

The portable information terminal 6200 further includes a fingerprint sensor 6209 in a region overlapping with the display portion 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The use of the display apparatus of one embodiment of the present invention in the display portion 6202 enables downsizing of the portable information terminal 6200.

Figure 38C:
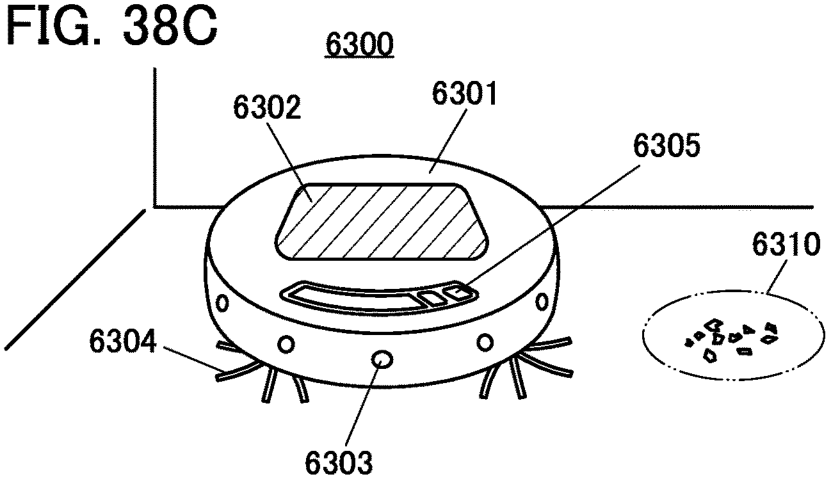

FIG. 38C illustrates an example of a cleaning robot. A cleaning robot 6300 includes a display portion 6302 placed on a top surface of a housing 6301, a plurality of cameras 6303 placed on a side surface of the housing 6301, a brush 6304, operation buttons 6305, a variety of sensors, and the like. Although not illustrated, the cleaning robot 6300 is provided with a tire, an inlet, and the like. The cleaning robot 6300 is self-propelled, detects dust 6310, and sucks up the dust through the inlet provided on a bottom surface.

For example, the cleaning robot 6300 can determine whether there is an obstacle such as a wall, furniture, or a step by analyzing images taken by the cameras 6303. In the case where the cleaning robot 6300 detects an object, e.g., wiring, that is likely to be caught in the brush 6304 by image analysis, the rotation of the brush 6304 can be stopped. The use of the display apparatus of one embodiment of the present invention in the display portion 6302 enables downsizing of the cleaning robot 6300.

Figure 38D:
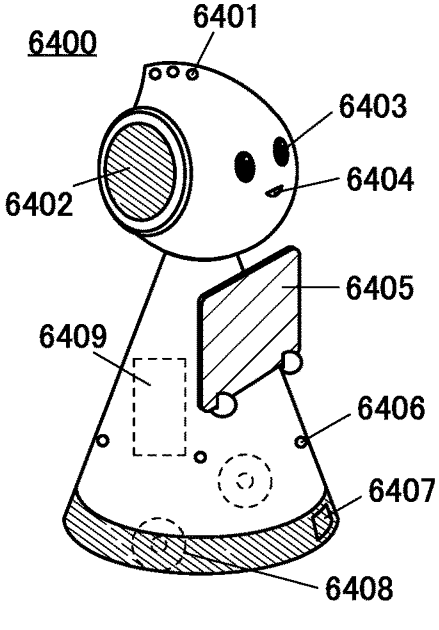

FIG. 38D illustrates an example of a robot. A robot 6400 illustrated in FIG. 38D includes an arithmetic device 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of a user, an environmental sound, and the like. The speaker 6404 has a function of outputting sound. The robot 6400 can communicate with a user using the microphone 6402 and the speaker 6404.

The display portion 6405 has a function of displaying various kinds of information. The robot 6400 can display information desired by a user on the display portion 6405. The display portion 6405 may be provided with a touch panel. Moreover, the display portion 6405 may be a detachable information terminal, in which case charging and data communication can be performed when the display portion 6405 is set at the home position of the robot 6400.

The display portion 6405 includes an illuminance sensor, a camera, an operation button, or the like, and the display portion 6405 can be operated by a touch with a stylus pen or the like. The functions of the display portion 6405 include a voice call, a video call, e-mailing, an appointment organizer, Internet communication, music reproduction, and the like.

The upper camera 6403 and the lower camera 6406 have a function of capturing an image of the surroundings of the robot 6400. The obstacle sensor 6407 can detect an obstacle in the direction where the robot 6400 advances with the moving mechanism 6408. The robot 6400 can move safely by recognizing the surroundings with the upper camera 6403, the lower camera 6406, and the obstacle sensor 6407.

The light-emitting device of one embodiment of the present invention can be used for the display portion 6405.

The use of the display apparatus of one embodiment of the present invention in the display portion 6405 enables downsizing of the robot 6400.

Figure 38E:
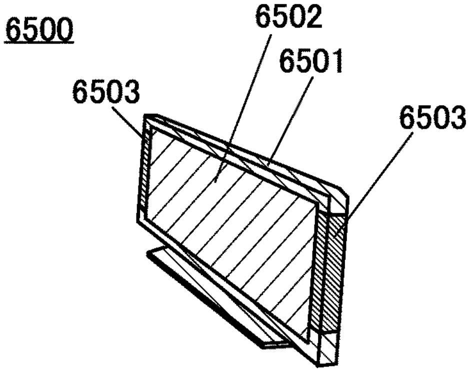

FIG. 38E illustrates an example of a television receiver. A television receiver 6500 illustrated in FIG. 38E includes a housing 6501, a display portion 6502, a speaker 6503, and the like.

The use of the display apparatus of one embodiment of the present invention in the display portion 6502 enables downsizing of the television receiver 6500.

Figure 38F:
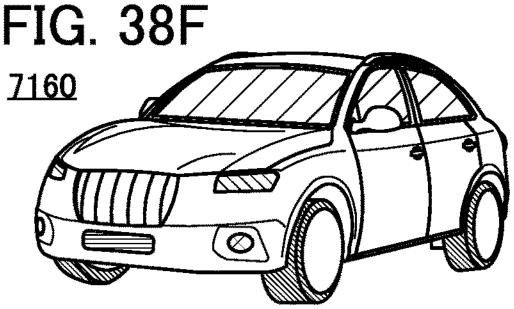

FIG. 38F illustrates an example of an automobile. An automobile 7160 includes an engine, tires, a brake, a steering gear, a camera, and the like. The automobile 7160 further includes the display apparatus of one embodiment of the present invention inside. The use of the display apparatus of one embodiment of the present invention in the automobile 7160 enables the automobile 7160 to function as an IoT device and downsizing of the display apparatus.

Figure 39A:
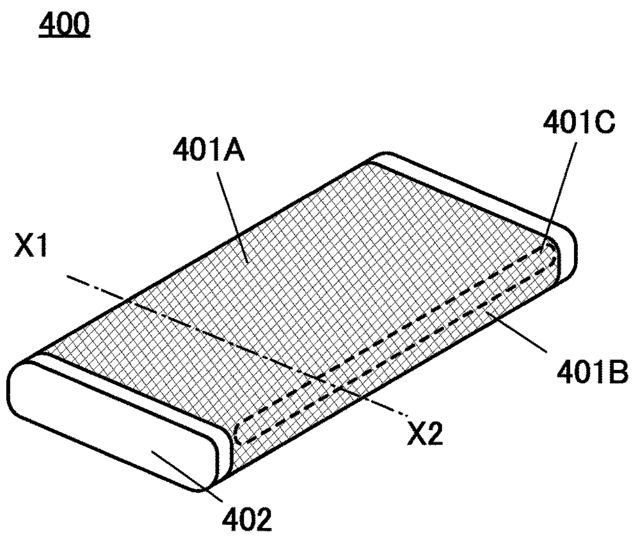
FIG. 39A to FIG. 39C are diagrams illustrating structure examples of electronic devices.

Next, an example of an electronic device provided with a foldable display apparatus will be described with reference to FIG. 39A and FIG. 39B. An electronic device 400 provided with the display apparatus of one embodiment of the present invention has the display apparatus including a region 401A, a region 401B, and a region 401C in a housing 402, as illustrated in FIG. 39A. Since the display apparatus is foldable, the region 401B and the region 401C in a folded shape can be stored in the housing 402; thus, the region 401B and the region 401C can be placed in bent portions.

Figure 39B:
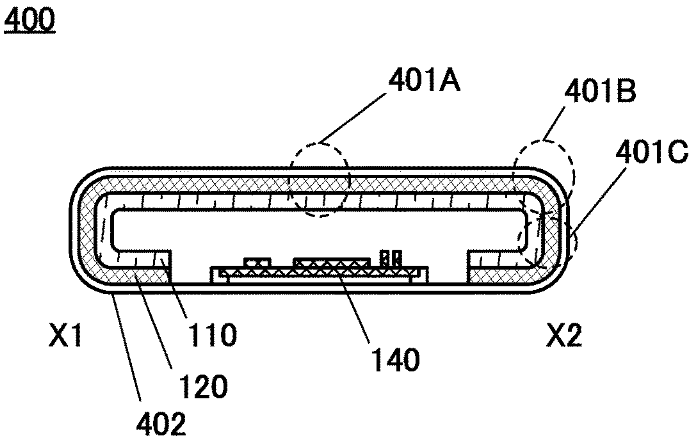

FIG. 39B is a cross-sectional view taken along X1-X2 of the electronic device 400 illustrated in FIG. 39A. As illustrated in FIG. 39B, in the electronic device 400, the display apparatus with the folded substrate 110 and substrate 120 is stored in the housing 402. A substrate 140 connected to the display apparatus is also provided in the housing 402. The housing 402 protects the display apparatus and the like from external stress.

The region 401A, the region 401B, and the region 401C that correspond to a display portion can be placed not only in flat portions but also in bent portions of the housing 402. As described above in Embodiment 1, the conductive layer functioning as an antenna can be placed in the display portion. Thus, a region where the conductive layer functioning as an antenna is placed can be increased.

Figure 39C:
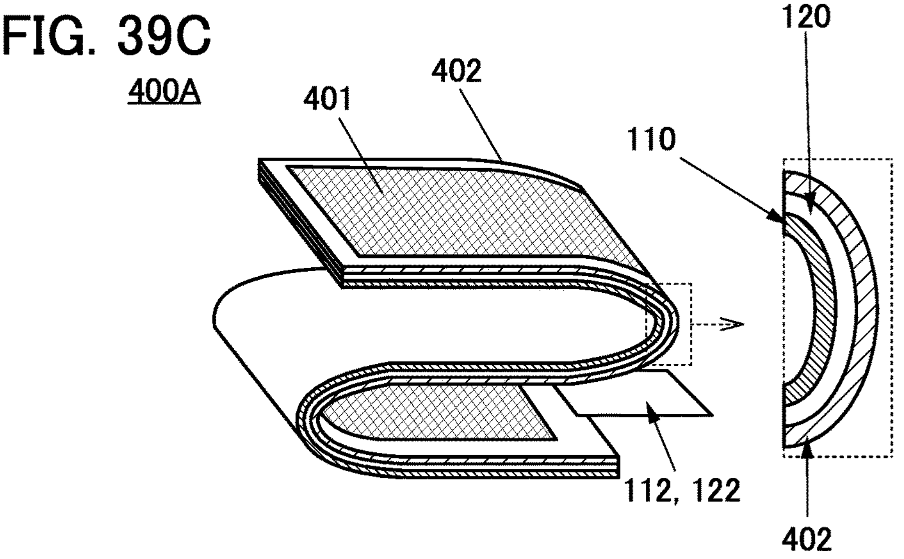

An example of an electronic device provided with a foldable display apparatus, which is different from that in FIG. 39A and FIG. 39B, will be described with reference to FIG. 39C. An electronic device 400A provided with the display apparatus of one embodiment of the present invention includes a display apparatus 401 stored in the foldable housing 402, as illustrated in FIG. 39C. The housing 402 and the display apparatus 401 are both foldable display apparatuses, and thus a foldable electronic device can be provided.

As illustrated in FIG. 39C, the electronic device 400A includes the substrate 110 and the substrate 120 which are provided along the housing 402. The display apparatus 401 can be provided regardless of the shape of the electronic device 400A. Thus, a region where the conductive layer functioning as an antenna is placed can be increased. The structure of the electronic device in FIG. 39C makes it possible to obtain a structure that can be changed in shape.

Figure 40A:
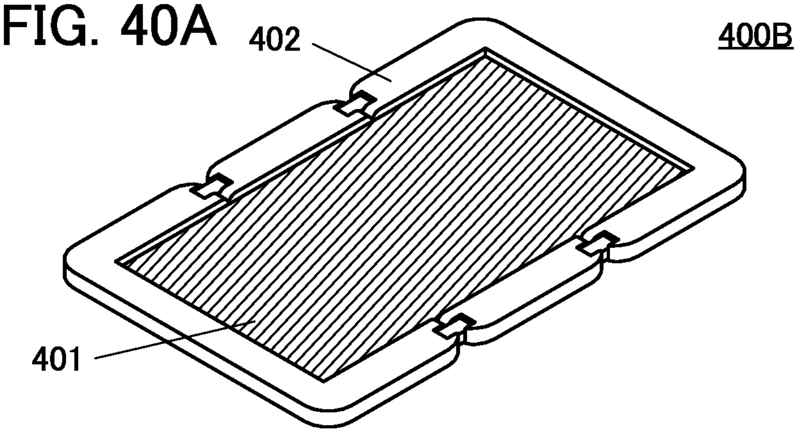
FIG. 40A to FIG. 40C are diagrams illustrating a structure example of an electronic device.
Figure 40B:
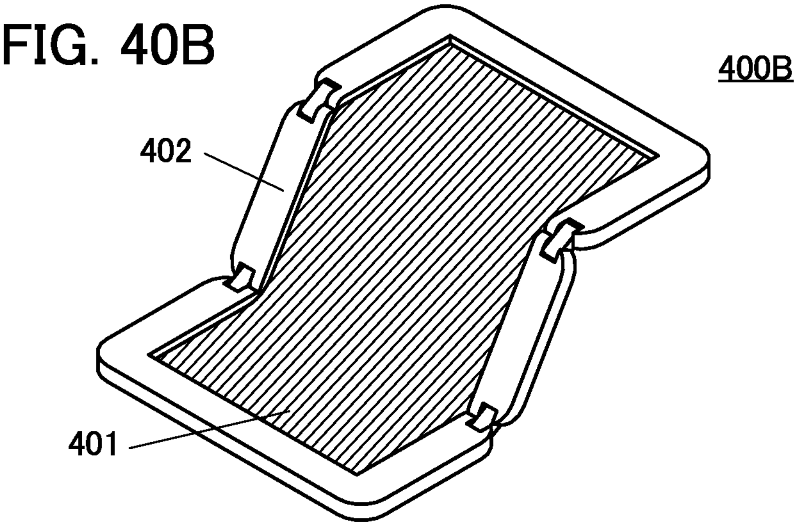
Figure 40C:
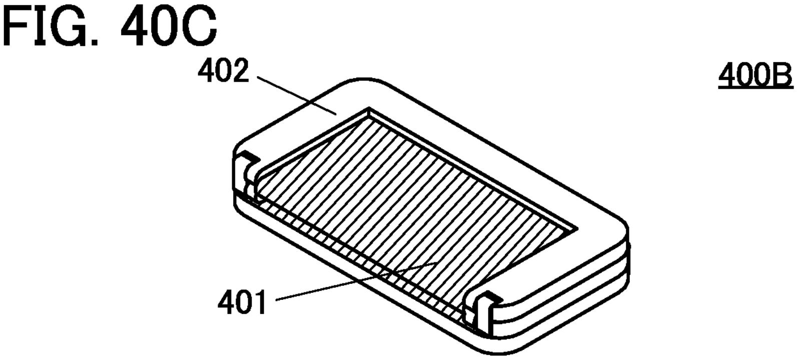

FIG. 40A to FIG. 40C illustrate electronic devices that are different from those in FIG. 39A to FIG. 39C. An electronic device 400B illustrated in FIG. 40A to FIG. 40C shows a structure where a housing and a display apparatus are changed in shape.

The electronic device 400B illustrated in FIG. 40A can be changed in shape, through the shape in FIG. 40B, to the shape illustrated in FIG. 40C, whereby the area of the display portion of the display apparatus can be increased or decreased. Thus, the number of conductive layers functioning as antennas to be arranged in lines over a substrate of the display apparatus can be adjusted. For example, the receiving sensitivity can be improved when the electronic device is in a tablet-shape, as compared to the folded state. Thus, an electronic device that is variable in receiving sensitivity depending on the shape change can be obtained.

Figure 41A:
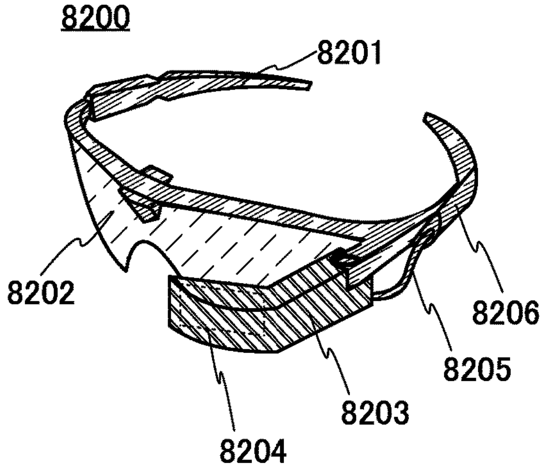
FIG. 41A to FIG. 41E are diagrams illustrating structure examples of electronic devices.

FIG. 41A is an external view of a head-mounted display 8200.

The head-mounted display 8200 includes a wearing portion 8201, a lens 8202, a main body 8203, a display portion 8204, a cable 8205, and the like. A battery 8206 is incorporated in the wearing portion 8201.

The cable 8205 supplies electric power from the battery 8206 to the main body 8203. The main body 8203 includes a wireless receiver or the like to receive video data and display it on the display portion 8204. The main body 8203 includes a camera, and data on the movement of eyeballs or eyelids of the user can be used as an input means.

The wearing portion 8201 may be provided with a plurality of electrodes capable of detecting current flowing in response to the movement of the user's eyeball in a position in contact with the user to have a function of recognizing the user's sight line. Furthermore, the wearing portion 8201 may have a function of monitoring the user's pulse with use of current flowing through the electrodes. The wearing portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, and the like.

The display apparatus of one embodiment of the present invention can be used in the display portion 8204.

Figure 41B:
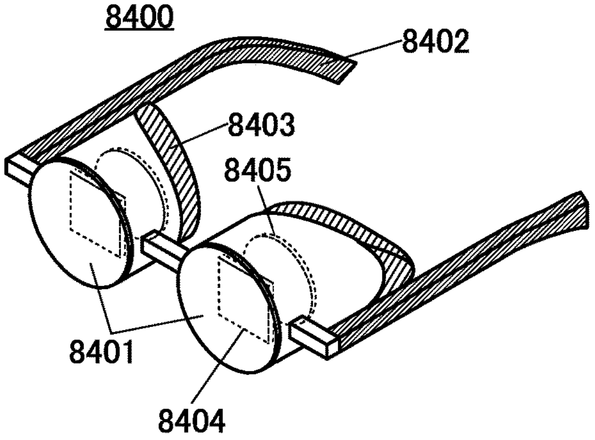

FIG. 41B is an external view of a goggle-type head-mounted display 8400. The head-mounted display 8400 includes a pair of housings 8401, a wearing portion 8402, and a cushion 8403. A display portion 8404 and a lens 8405 are provided in each of the pair of housings 8401. The pair of display portions 8404 may display different images, whereby three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The wearing portion 8402 preferably has plasticity and elasticity so as to be adjusted to fit the size of the user's face and not to slide down. In addition, part of the wearing portion 8402 preferably has a vibration mechanism functioning as a bone conduction earphone. Thus, without additionally requiring an audio device such as earphones or a speaker, the user can enjoy video and sound only by wearing. Note that the housing 8401 may have a function of outputting sound data by wireless communication.

The wearing portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered by cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the wearing portion 8402, is preferably detachable because cleaning or replacement can be easily performed.

Figure 41C:
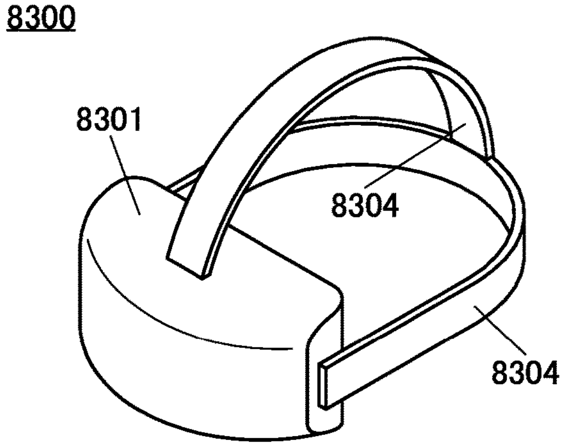
Figure 41D:
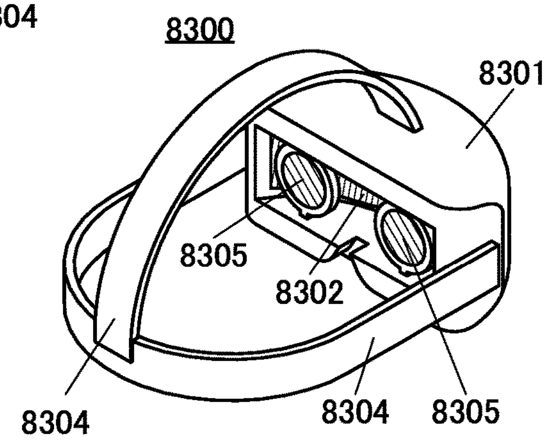
Figure 41E:
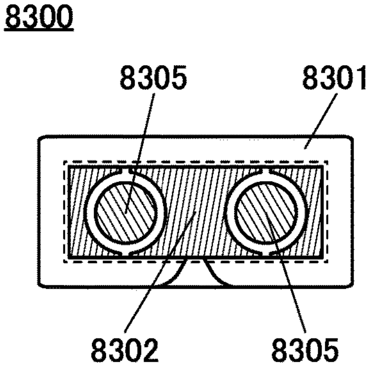

FIG. 41C to FIG. 41E are diagrams illustrating the appearance of a head-mounted display 8300. The head-mounted display 8300 includes a housing 8301, a display portion 8302, a band-like fixing member 8304, and a pair of lenses 8305.

A user can perceive display on the display portion 8302 through the lenses 8305. Note that the display portion 8302 is preferably curved and placed because the user can feel a high realistic sensation. Another image displayed in another region of the display portion 8302 is viewed through the lenses 8305, so that three-dimensional display using parallax or the like can be performed. Note that the structure is not limited to the structure in which one display portion 8302 is provided; two display portions 8302 may be provided and one display portion may be provided per eye of the user.

The display apparatus of one embodiment of the present invention can be used for the display portion 8302. The display apparatus of one embodiment of the present invention can achieve extremely high resolution. For example, a pixel is not easily perceived by the user even when the user perceives display that is magnified by the use of the lenses 8305 as illustrated in FIG. 41E. In other words, a video with a strong sense of reality can be seen by the user with use of the display portion 8302.

The structures, configurations, methods, and the like described in this embodiment can be used in combination as appropriate with the structures, configurations, methods, and the like described in the other embodiments.

REFERENCE NUMERALS

C2: capacitor, C3: capacitor, M11: transistor, M12: transistor, M13: transistor, M14: transistor, M15: transistor, M16: transistor, M17: transistor, OUT1: wiring, OUT2: wiring, PIX1: pixel circuit, PIX2: pixel circuit, V1: wiring, V2: wiring, V3: wiring, V4: wiring, V5: wiring, 10: electronic device, 11: application processor, 12: baseband processor, 14: memory, 15: battery, 16: power management IC, 17: display portion, 18: camera portion, 19: operation input portion, 20: audio IC, 21: microphone, 22: speaker, 33: subpixel, 33B: subpixel, 33G: subpixel, 33R: subpixel, 33Y: subpixel, 36: interface portion, 40: oscillation circuit, 50: housing, 60: substrate, 70: layer, 90B: light-emitting device, 90G: light-emitting device, 90R: light-emitting device, 90S: light-receiving device, 100: display apparatus, 101: display apparatus, 102: display apparatus, 103: display apparatus, 105: display apparatus, 110: substrate, 110*f*: substrate, 111: display portion, 112: FPC, 113*a*: IC, 113*b*: IC, 114*a*: wiring, 114*b*: wiring, 115: circuit, 116: pixel, 117: transistor, 118: display element, 119: insulating layer, 120: substrate, 120*f*: substrate, 122: FPC, 130: antenna, 130_N: antenna, 130_1: antenna, 131: conductive layer, 131A: conductive layer, 131D: conductive layer, 131P: conductive layer, 131Q: conductive layer, 131R: conductive layer, 131S: conductive layer, 132: conductive layer, 133: opening, 133A: opening, 133B: opening, 133C: opening, 134: portion, 135: protrusion portion, 139: electrode, 140: substrate, 141: integrated circuit, 151: layer, 155: layer, 161: curved portion, 162: curved portion, 165: region, 166: region, 167: region, 170: keyboard, 200: display panel, 200A: display panel, 200B: display panel, 201: substrate, 202: substrate, 203: functional layer, 210: fingerprint sensor, 211: light-emitting device, 211B: light-emitting device, 211G: light-emitting device, 211IR: light-emitting device, 211R: light-emitting device, 211W: light-emitting device, 211X: light-emitting device, 212: light-receiving device, 213R: light-receiving and light-emitting device, 220: finger, 221: contact portion, 222: fingerprint, 223: image-capturing range, 225: stylus, 226: path, 231: low noise amplifier, 232: mixer, 233: low-pass filter, 234: variable gain amplifier, 235: analog-digital converter circuit, 236: interface portion, 240: oscillation circuit, 241: digital-analog converter circuit, 242: variable gain amplifier, 243: low-pass filter, 244: mixer, 245: power amplifier, 252: transistor, 254: connection portion, 258: transistor, 259: transistor, 260: transistor, 261: insulating layer, 262: insulating layer, 264: insulating layer, 265: insulating layer, 268: insulating layer, 271: conductive layer, 272*a*: conductive layer, 272*b*: conductive layer, 273: conductive layer, 275: insulating layer, 278: connection portion, 281: semiconductor layer, 281*i*: channel formation region, 281*n*: low-resistance region, 292: connection layer, 295: circuit, 296: Si transistor, 297: Si transistor, 301: insulating layer, 311: pixel electrode, 311C: connection electrode, 311G: pixel electrode, 311R: pixel electrode, 312B: organic layer, 312G: organic layer, 312R: organic layer, 313: common electrode, 314: organic layer, 315: organic layer, 321: protective layer, 322: planarization film, 325: insulating layer, 326: resin layer, 330: connection portion, 400: electronic device, 400A: electronic device, 400B: electronic device, 401: display apparatus, 401A: region, 401B: region, 401C: region, 402: housing, 411*a*: conductive layer, 411*b*: conductive layer, 411*c*: conductive layer, 412G: EL layer, 412S: photoelectric conversion layer, 413: common electrode, 414: organic layer, 416: protective layer, 417: light-blocking layer, 418: color filter, 421: insulating layer, 422: resin layer, 430*b*: light-emitting device, 430*c*: light-emitting device, 440: light-receiving device, 442: adhesive layer, 465: wiring, 466: conductive layer, 500: touch panel, 600: display apparatus, 601: display apparatus, 711: light-emitting layer, 712: light-emitting layer, 713: light-emitting layer, 720: layer, 720-1: layer, 720-2: layer, 730: layer, 730-1: layer, 730-2: layer, 750B: light-emitting device, 750G: light-emitting device, 750R: light-emitting device, 751: layer, 752: layer, 753B: light-emitting layer, 753G: light-emitting layer, 753R: light-emitting layer, 754: layer, 755: layer, 760: light-receiving device, 761: layer, 762: layer, 763: layer, 790: EL layer, 790*a*: EL layer, 790*b*: EL layer, 791: lower electrode, 791B: pixel electrode, 791G: pixel electrode, 791PD: pixel electrode, 791R: pixel electrode, 792: upper electrode, 795: coloring layer, 6100: portable information terminal, 6101: housing, 6102: display portion, 6103: band, 6105: operation button, 6200: portable information terminal, 6201: housing, 6202:

display portion, 6203: operation button, 6204: speaker, 6205: microphone, 6209: fingerprint sensor, 6300: cleaning robot, 6301: housing, 6302: display portion, 6303: camera, 6304: brush, 6305: operation button, 6310: dust, 6400: robot, 6401: illuminance sensor, 6402: microphone, 6403: upper camera, 6404: speaker, 6405: display portion, 6406: lower camera, 6407: obstacle sensor, 6408: moving mechanism, 6409: arithmetic device, 6500: television receiver, 6501: housing, 6502: display portion, 6503: speaker, 7160: automobile, 8200: head-mounted display, 8201: wearing portion, 8202: lens, 8203: main body, 8204: display portion, 8205: cable, 8206: battery, 8300: head-mounted display, 8301: housing, 8302: display portion, 8304: fixing member, 8305: lens, 8400: head-mounted display, 8401: housing, 8402: wearing portion, 8403: cushion, 8404: display portion, 8405: lens

The invention claimed is:

1. A display apparatus comprising:

a first substrate and a second substrate;

a first conductive layer and a plurality of second conductive layers between the first substrate and the second substrate; and a display element, the display element being placed over the first substrate and below the first conductive layer and the plurality of second conductive layers, wherein the first conductive layer and the plurality of second conductive layers each comprise a plurality of openings, wherein a surface of at least one of the plurality of second conductive layers is level with a surface of the first conductive layer, wherein surfaces of the other of the plurality of second conductive layers are on different levels, wherein the display element comprises a region overlapping with one of the plurality of openings in one of the first conductive layer and the second conductive layers, wherein the first conductive layer is configured to work as an antenna, and wherein the plurality of second conductive layers are configured to work as an electrode of a touch sensor.

2. The display apparatus according to claim 1, wherein the first conductive layer does not overlap with any of the plurality of second conductive layers.

3. The display apparatus according to claim 1, wherein the first conductive layer comprises a region overlapping with any of the plurality of second conductive layers.

4. The display apparatus according to claim 1, wherein the first conductive layer and the plurality of second conductive layers each comprise a metal selected from silver, copper, or aluminum.

5. A display apparatus comprising:

a first substrate and a second substrate;

a first conductive layer and a second conductive layer between the first substrate and the second substrate; and a display element, the display element being placed between the first substrate and both the first conductive layer and the second conductive layer, wherein the first conductive layer and the second conductive layer each comprise a plurality of openings, wherein a surface of the first conductive layer and a surface of the second conductive layer are level with each other, wherein the display element comprises a region overlapping with one of the plurality of openings in one of the first conductive layer and the second conductive layer, wherein the first conductive layer is configured to work as an antenna, and wherein the second conductive layer is configured to work as an electrode of a touch sensor.

6. The display apparatus according to claim 5, wherein the first conductive layer and the second conductive layer each comprise a metal selected from silver, copper, or aluminum.

7. The display apparatus according to claim 5, wherein the display element is an organic EL element.

8. The display apparatus according to claim 5, wherein each of the first substrate, the second substrate, the first conductive layer, and the display element comprises a curved portion, wherein the curved portions of the first substrate, the second substrate, the first conductive layer, and the display element overlap with each other.

9. The display apparatus according to claim 8, wherein the curved portions of the first substrate, the second substrate, the first conductive layer, and the display element are concave curved portions.

10. The display apparatus according to claim 8, wherein the curved portions of the first substrate, the second substrate, the first conductive layer, and the display element are convex curved portions.

* * * * *